(12) United States Patent
Haensch et al.

(10) Patent No.: US 8,247,895 B2
(45) Date of Patent: Aug. 21, 2012

(54) 4D DEVICE PROCESS AND STRUCTURE

(75) Inventors: Wilfried Haensch, Armonk, NY (US);
Roy R. Yu, Armonk, NY (US)

(73) Assignee: International Business Machines Corporation, Armonk, NY (US)

( * ) Notice: Subject to any disclaimer, the term of this patent is extended or adjusted under 35 U.S.C. 154(b) by 197 days.

(21) Appl. No.: 12/684,779

(22) Filed: Jan. 8, 2010

(65) Prior Publication Data
US 2011/0170266 A1    Jul. 14, 2011

(51) Int. Cl.
*H01L 21/78* (2006.01)
*H01L 23/34* (2006.01)
*H05K 1/14* (2006.01)

(52) U.S. Cl. ......... 257/686; 257/774; 257/67; 257/733; 257/685; 257/698; 257/E25.006; 257/E25.027; 257/E23.085; 257/E23.086; 257/E21.614; 257/E23.179; 257/E21.599; 438/109

(58) Field of Classification Search .......... 257/774, 257/E21.599, E21.23, E21.521, E25.006, 257/E25.013, E25.027, E23.085, E23.086, 257/E21.614, 67, 686, 733, E23.179, 685, 257/698; 361/722, 784; 438/107, 692, 15, 438/113, 109; 156/182
See application file for complete search history.

(56) References Cited

U.S. PATENT DOCUMENTS

| | | | |
|---|---|---|---|
| 5,347,428 A | 9/1994 | Carson | |
| 5,432,729 A * | 7/1995 | Carson et al. | 365/63 |
| 5,502,667 A | 3/1996 | Bertin | |
| 5,561,622 A | 10/1996 | Bertin | |
| 5,702,984 A | 12/1997 | Bertin | |
| 5,804,004 A | 9/1998 | Tuckerman | |
| 6,090,633 A | 7/2000 | Yu | |
| 6,261,452 B1 | 7/2001 | Mayer | |
| 6,329,609 B1 | 12/2001 | Kaja | |
| 6,355,501 B1 | 3/2002 | Fung | |
| 6,388,317 B1 | 5/2002 | Reese | |
| 6,444,560 B1 | 9/2002 | Pogge | |

(Continued)

OTHER PUBLICATIONS

Kogge, Peter et, al. *Air Force Research Laboratory, IPTO*; "ExaScale Computing Study . . . ;" pp. 1, 159, 161 (Sep. 28, 2008).

(Continued)

*Primary Examiner* — Tom Thomas
*Assistant Examiner* — Benjamin Tzu-Hung Liu
(74) *Attorney, Agent, or Firm* — Robert J. Eichelburg; The Law Offices of Robert J. Eichelburg

(57) ABSTRACT

A 4D device comprises a 2D multi-core logic and a 3D memory stack connected through the memory stack sidewall using a fine pitch T&J connection. The 3D memory in the stack is thinned from the original wafer thickness to no remaining Si. A tounge and groove device at the memory wafer top and bottom surfaces allows an accurate stack alignment. The memory stack also has micro-channels on the backside to allow fluid cooling. The memory stack is further diced at the fixed clock-cycle distance and is flipped on its side and re-assembled on to a template into a pseudo-wafer format. The top side wall of the assembly is polished and built with BEOL to fan-out and use the T&J fine pitch connection to join to the 2D logic wafer. The other side of the memory stack is polished, fanned-out, and bumped with C4 solder. The invention also comprises a process for manufacturing the device. In another aspect, the invention comprises a 4D process and device for over 50× greater than 2D memory density per die and an ultra high density memory.

32 Claims, 54 Drawing Sheets

U.S. PATENT DOCUMENTS

| | | |
|---|---|---|
| 6,473,308 B2 | 10/2002 | Forthun |
| 6,599,778 B2 | 7/2003 | Pogge |
| 6,600,224 B1 | 7/2003 | Farquhar |
| 6,640,021 B2 | 10/2003 | Pogge |
| 6,678,949 B2 | 1/2004 | Prasad |
| 6,717,061 B2 | 4/2004 | Yamaguchi |
| 6,737,297 B2 | 5/2004 | Pogge |
| 6,821,826 B1 | 11/2004 | Chan |
| 6,835,589 B2 | 12/2004 | Pogge |
| 6,856,025 B2 | 2/2005 | Pogge |
| 6,864,165 B1 | 3/2005 | Pogge |
| 6,907,792 B2 | 6/2005 | Ohnishi |
| 6,908,792 B2 | 6/2005 | Bruce |
| 7,005,730 B2 | 2/2006 | Verma |
| 7,049,697 B2 | 5/2006 | Pogge |
| 7,056,813 B2 | 6/2006 | Morrow |
| 7,071,031 B2 | 7/2006 | Pogge |
| 7,071,546 B2 | 7/2006 | Fey |
| 7,132,754 B1 | 11/2006 | Schmidt |
| 7,151,009 B2 | 12/2006 | Kim |
| 7,170,164 B2 | 1/2007 | Chen |
| 7,193,304 B2 | 3/2007 | Kuo |
| 7,230,334 B2 | 6/2007 | Andry |
| 7,307,003 B2 | 12/2007 | Reif |
| 7,312,487 B2 | 12/2007 | Alam |
| 7,355,277 B2 | 4/2008 | Myers |
| 7,638,882 B2 * | 12/2009 | Sankman ............... 257/778 |
| 7,768,122 B2 * | 8/2010 | Oda ...................... 257/710 |
| 2002/0037631 A1 * | 3/2002 | Mimata .................. 438/460 |

OTHER PUBLICATIONS

Co-Pending U.S. Appl. No. 12/698,529, filed Feb. 2, 2010; Specification and Drawings.

* cited by examiner

Fig. 1

4D Process and structure
for over 50x (than 2D) per die
Ultra high density memory
in close proximity of a multi-core logic
chip Wraps: 7132754, 6908792, 6473308

Fig. 2

Edge: 5702984, 54432729, 5561622, 5502667, 5347428, 6717061, 7193304

Thru-Si-vias: 7151009, 7071546, 7005730, 6355501, 5804004, 7312487, 7307003, 7056813

Preliminary Search results

Wraps: US7132754, 6908792, 6473308

7132754

Preliminary Search results

Thru-Si: 7193304, 7151009, 7071546, 7005730, 6355501, 5804004
7312487, 7307003, 7056813, 6355501    7312487

Bond all the wafers in one step
Ceramic adhesive possible

No thru-Si-via
No vias thru bonding interface
Cure at 200C
Operating up to 2000C-3000C
High thermal conduction (30-50 J/C)

2.2 mm = 1 clock cycle 5 mm = 2 clock cycle, 10 mm = 4 clock cycle 136
2.2 mm
138
140

Dice the wafer stacks in 2.2 mm (1 clock cycle) strips

Wider if more clock cycles are used

Fig. 21   4D chips with cooling channels + alignment

Transfer Join (TJ) Hybrid Connection

4D chips with cooling/handling adaptor

Fig. 29 Wafer-to-4D and chip-to-4D TJ tier-3 bond

Fig. 30 Surface line power supply and wiring density

1) Signal $R = \rho \times L / S = 2\ \Omega$
   ($W = 5\ \mu m,\ H = 5\ \mu m,\ L = 2.2\ mm$)

2) Power $R = \rho \times L / S < 0.001\ \Omega$
   ($W = 10\ mm,\ H = 5\ \mu m,\ L = 2.2\ mm$)

3) Wiring density:
   1000 / layer
   2000 / plane pair

4D DEVICE PROCESS AND STRUCTURE

FIELD OF THE INVENTION

This invention relates to microelectronics comprising, inter alia, electronic device integration devices and processes in 3D system integration, and a 4D higher level system integration than the 3D integration. In one aspect, the invention comprises a 4D process and device for 50 stacks (50×) per die and an ultra high density memory.

BACKGROUND OF THE INVENTION AND RELATED ART 3D integration (3DI) comprises a device system integration method that brings heterogeneous devices together in close proximity so that they function as a homogeneous device. 3DI is different than traditional 2D planar back-end-of-line (BEOL) integration in that 3DI adds an additional dimension, (Z) integration, which not only allows more devices from different sources and types to be integrated into the system in close proximilty, but also enables them to function as a unit.

This integration allows more device content (more memories) and faster access times (shorter distances) than simple scaling can achieve in the traditional 2D planar device. To increase device system speed the clock-cycle distance is a critical domain for functionality, requiring it to be within the system. A clock-cycle distance comprises the distance that the signal can cover within one device clock-cycle. For today's devices running at over several GHz speed this distance is reduced to only several millimeters.

In a 2D configuration more and more device contents have to be placed outside this area and more clock-cycles are needed to access them, and as a result, increases access time (or slowers speed). Multi-core is one of the ways to keep the logic and memory within a short distance locally to each core while using paralleism to enable the continued scaling. 3D architecture can further enhance the memory density to each core with a shorter connection distance between the core and memory by introducing additional contents from the $3^{rd}$ dimension (Z-stack), which therefore increases the device functionality while maintaining the components within the critical clock-cycle zone. In addition to more contents within the clock-cycle zone, 3DI also allows additional components (such as SiGe, a III-V device, opto-electronics, MEMS), to be integrated as part of the device systems in the device level. A III-V device comprises a device based on at least one element selected from Group IIIB of the Periodic Table of Elements and at least one element selected from Group VB of the Periodic Table of Elements, where the Periodic Table comprises the IUPAC form. An example of these materials comprises GaAs. Ga is in column IIIB and As in column VB of the Periodic Table. III-V devices normally run faster (higher mobility) than Si or Ge devices. Both Si and Ge are in column IVB of the Periodic Table and have less stress in the bond.

Of the process format, 3DI can be further separated into chip level and wafer-level integration. The chip-level 3DI mainly focus on lower density I/O (input/output) (dozens to hundreds of I/Os) and slower system where high contents and lower power within a given footprint comprises the key consideration for the consumer markets. The wafer-level 3DI focus more on high performance systems where I/O density is in the thousands, operates at high speeds (>GHz), and the system clock-distance becomes a key requirement. In this high performance area through-Si connection becomes a dominant factor to reduce distance between the devices.

Of the integration scheme, 3DI can further separate into chip stacking and through-Si connection. For most chip-level 3DI the Z-connection is through device edge leads. The edge leads are then connected to a logic wafer with wire bonds. Due to such connection scheme, a chip-level connection can give more content at a slower speed. Aso, it is difficult to supply power to the stacked system stack.

3Di through-Si connection allows the integration at wafer level and offers a higher I/O density and a close Z-connection. Through-Si can also be further separated into via-first and via last approaches. Via-first normally allows a higher wiring contents since the I/Os do not go through the top device directly and gives more area for wiring. The level-level z-connections are typically done in metal compression bond (Such as Cu—Cu, no solder, no adhesive), micro-C4 (solder, no adhesive), or transfer joining ("T&J," or "TJ" metal compression and adhesive composite, hybrid bonding known in the art). Via-first connections typically have a higher wiring density (BEOL interconnection) and an I/O density of about 5 to about 10 mu pitch mu.

U.S. Pat. No. 6,355,501 illustrates a via-first configuration on element 100, where the level-level connection is through imbeded vias. (Since via-first does not impact the wiring levels for the top wafer, the wiring density is normally higher for the via-first approach). The interface contact is through mechanical means so the interface via density is typically about 5 to about 10 um (micron) at the best. U.S. Pat. No. 7,312,487 illustrates the via-last option, element 172, where the wafers are stacked first and then vias are formed through the entire top wafer. Since the vias are lithographically defined, this via-last has a higher density of via counts, at about 1 um. Since the Through-Si vias in the top wafer take up wiring channels, the wiring density is reduced for via-last.

Since the through-Si vias in the top wafer take up wiring channels, the wiring density is reduced for via-last, about 10 um pitch. For 3DI with via-last approach, the wiring density typically is reduced due to the use of the wiring channels by the through-Si vias through the entire device stack (via-first allows z-wiring and reduces the loss of channels). Since the through-Si vias can be defined lithographically, via-last normally have a higher via-density (under about 1 um pitch) than via-first approach (about 5 to about 10 um pitch).

In all 3DI integration schemes mentioned above, the cooling of the system is typically a difficult issue to resolve. The tighter stacks of devices generate more heat density but with reduced heat dissipation. Some work in micro-channels cooling for 3DI only limits the cooling through surface layer and is difficult to achieve an effective cooling with more stacks involved in the 3D systems.

One particular issue associated with 3DI through-Si connections comprises the ESD (electro-static discharge) protection load. In any device production an EDS protection circuitry is designed and linked to a I/O net. This is to protect it from manufacturing process ESD. Since each wafer for 3DI needs their ESD the final 3DI circuits will have a total ESD as large as the sum of all the devices in the 3DI device. This can be a large load as the number of devices increase and requires a large driver to access the 3DI circuits which could significantly slow them down.

In 3DI by either chip stacking or through-Si connection, the heating density increases as the number of 3DI devices increase. This limits the number of 3DI devices as the heat dissipation become a road block for further 3D content increase.

U.S. Pat. Nos. 5,702,984; 5,432,729; 5,561,622; 5,502,667; 5,347,428; 6,717,061; and 7,193,304 illustrate edge connection details of some of the chip stacking methods. Note that all chip stacking methods have no cooling channels proposed and have signal and power accesses only through wire-bonding.

U.S. Pat. Nos. 7,132,754; 6,908,792; and 6,473,308 illustrate chip stacking by wrap-around with a signal bus. This type connection also had long I/O length. U.S. Pat. Nos. 7,193,304; 7,151,009; 7,071,546; 7,005,730; 6,355,501 (metal/oxide); U.S. Pat. No. 6,821,826 (oxide-oxide); U.S. Pat. Nos. 5,804,004; 7,312,487; 7,307,003; and; 7,056,813 illustrate common Through-Si via connections.

U.S. Pat. No. 6,355,501 illustrates a via-first configuration on element 100, where the level-level connection is through imbeded vias. Since via-last does not impact the wiring levels for the top wafer, the wiring density is normally higher for the via-first approach. The interface contact is through mechanical means so the interface via density is typically about 5 to about 10 um at the best. U.S. Pat. No. 7,312,487 illustrates the via-last option, element 172, where the wafers are stacked first and then vias are formed through the entire top wafer. Since the vias are lithographically defined, this via-last has a higher density of via counts, at about 1 um. Since the Through-Si vias in the top wafer take up wiring channels, the wiring density is reduced for via-last.

U.S. Pat. Nos. 7,355,277; 7,230,334; 7,170,164; and 6,388,317 illustrate micro-channels cooling.

U.S. Pat. Nos. 6,864,165; 6,856,025; 6,599,778; 7,071,031; 6,835,589; 6,640,021; 7,049,697; 6,737,297; 6,444,560; 6,329,609; 6,600,224; 6,090,633; 6,678,949; and 6,281,452 illustrate T&J 3DI polyimide stud via joining connections (lock and key) on chip devices.

The scientific literature also describe some of these devices and processes for making them, and include:

H. B. Pogge et al., Proc. AMC 2001, pp. 129-136;
M. Despont, et al; TRANSDUCERS, Solid-State Sensors, Actuators and Microsystems, 12th International Conference on, 2003, Volume 2, 8-12 Jun. 2003, pp. 1907-1910;
K. W. Guarini, et al; IEMD 2002 pp. 943-945.
R. Yu, Proc. VMIC 2007, p. 223, 2007.
P. Kogge et al., ExaScale Computing Study: Technology Challenges in Achieving Exascale Systems; Information Processing Techniques Office, Air Force Research Laboratory, Sep. 28, 2008; pp. 159, 161.

These prior art devices and methods of assembling and using them have proved successful, however, they also present several issues, such as for example in chip stacking, edge connection leads to signal delay, lower I/O density, difficulties in powering the system and difficulties in cooling the system in high power applications.

Similarly, the current through-Si 3D wafer stacking processes and resultant devices present issues, e.g., thin Si construction (20 um) requires stacking wafers one at a time to allow through-Si vias; it is difficult to make the via less than 5 um in size and 10 um in pitch in devices employing Cu; through-Si vias can be made from W but W has a higher resistivity than Cu; through-vias pass through the bonding interface making bonding defects difficult to control; wafer stacks are limited due to bonding thermal cycles; the process is complex and introduces via yield and wafer yield issues; manufacturing involves long process cycles; wafer level distortions are introduced; it is difficult to cool the system; and it is difficult to dissipate power.

SUMMARY OF THE INVENTION

Accordingly, the present invention provides devices, articles of manufacture and processes that address these needs to not only provide advantages over the related art, but also to substantially obviate one or more of the foregoing and other limitations and disadvantages of the related art such and comprises a new 4D system integration technique (4DI integration). Not only do the written description, claims, abstract of the disclosure, and the drawings that follow set forth various features, objectives, and advantages of the invention and how they may be realized and obtained, but these features, objectives, and advantages will also become apparent by practicing the invention.

To achieve these and other advantages, and in accordance with the purpose of the invention as embodied and broadly described herein, the invention comprises a new 4DI system that increases system density within the 1 clock-cycle up to about 100× more in memory density than the 2D system. In addition to memory density increase the 4DI also provides a micro-channel cooling capability for the system. The I/O density can support micro-C4 (about 50 um pitch) while the front-side-bus (FSB, logic to memory) can support about a 10 um pitch or less. In one aspect, the invention comprises a 4D process and device for 53 stacks (53×) per die and an ultra high density memory.

BRIEF DESCRIPTION OF THE DRAWINGS

The accompanying Figures, incorporated into this specification, together with the detailed description herein serve further to illustrate various embodiments and to explain various principles and advantages of the present invention. The drawings illustrate the device and process details and are not necessarily drawn to scale.

FIGS. 1-5 list various related art United States Patents and illustrate various related art devices.

Figure 3:
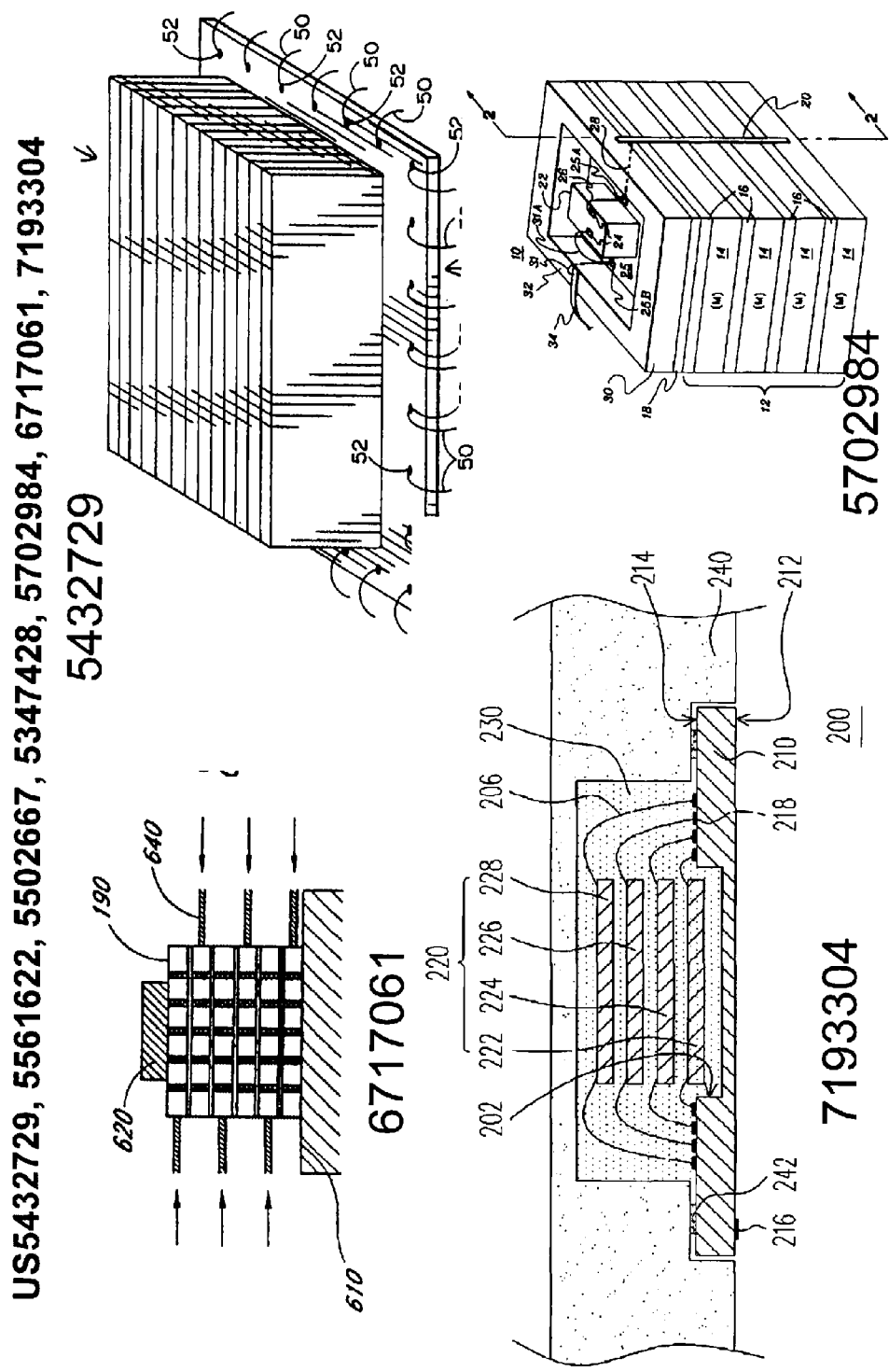
Figure 4:
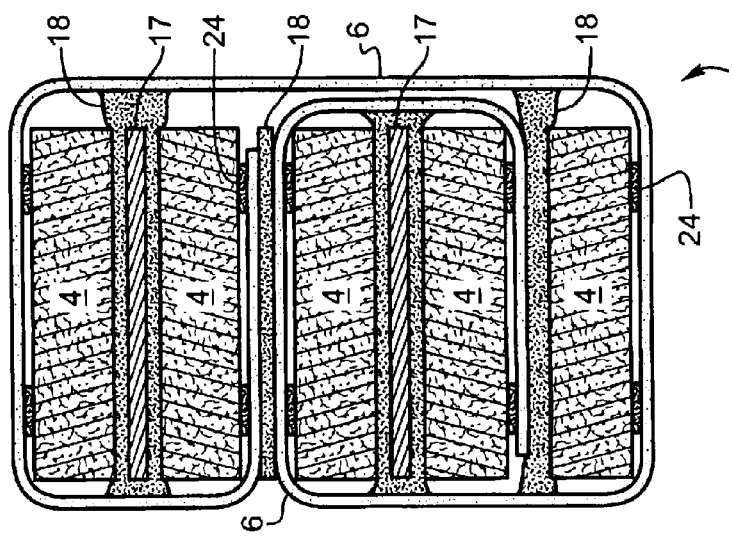
Figure 5:
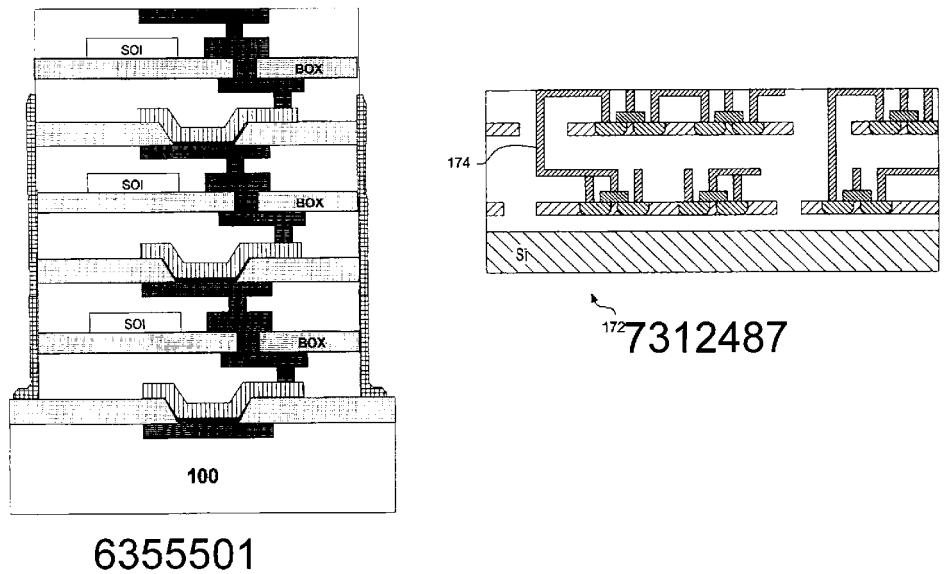
Figure 6:
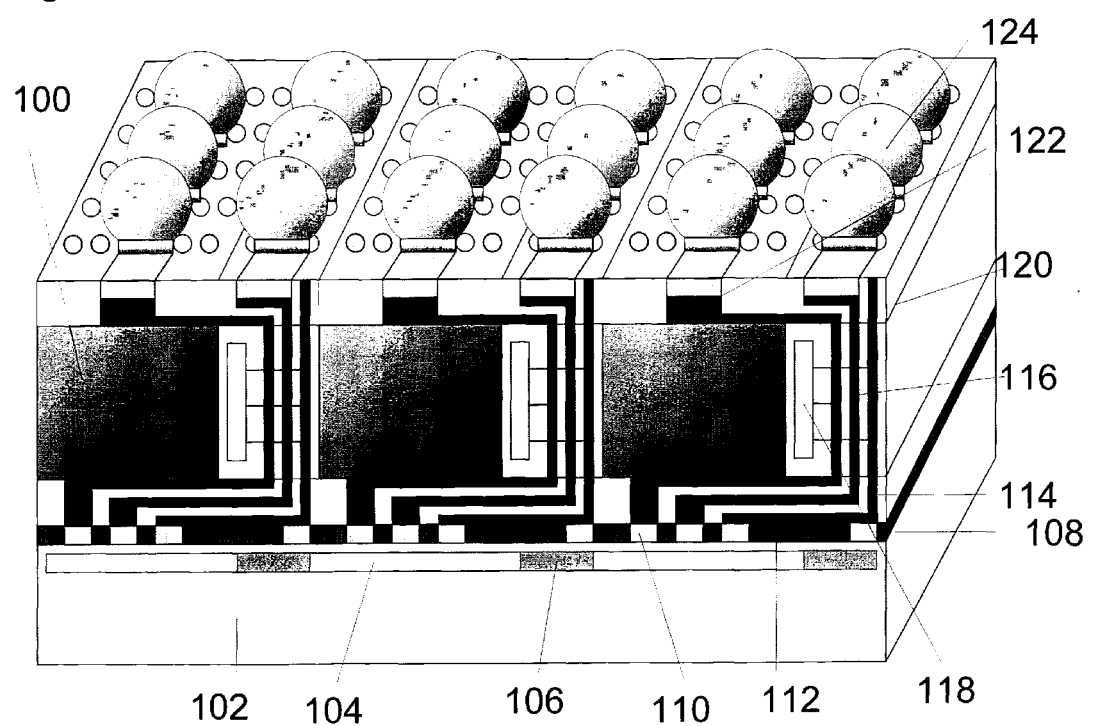
FIGS. 6, through 50 comprise perspective views of 4D devices obtained and devices in various stages of manufacture according to the process of this invention that embody the present inventions, and include the current 4D inventions after the 4D devices are assembled. Wafers drawn in FIGS. 6 and 7 are in wafer processing position with the logic wafer at the bottom and the C4 solder at top.
Figure 21:
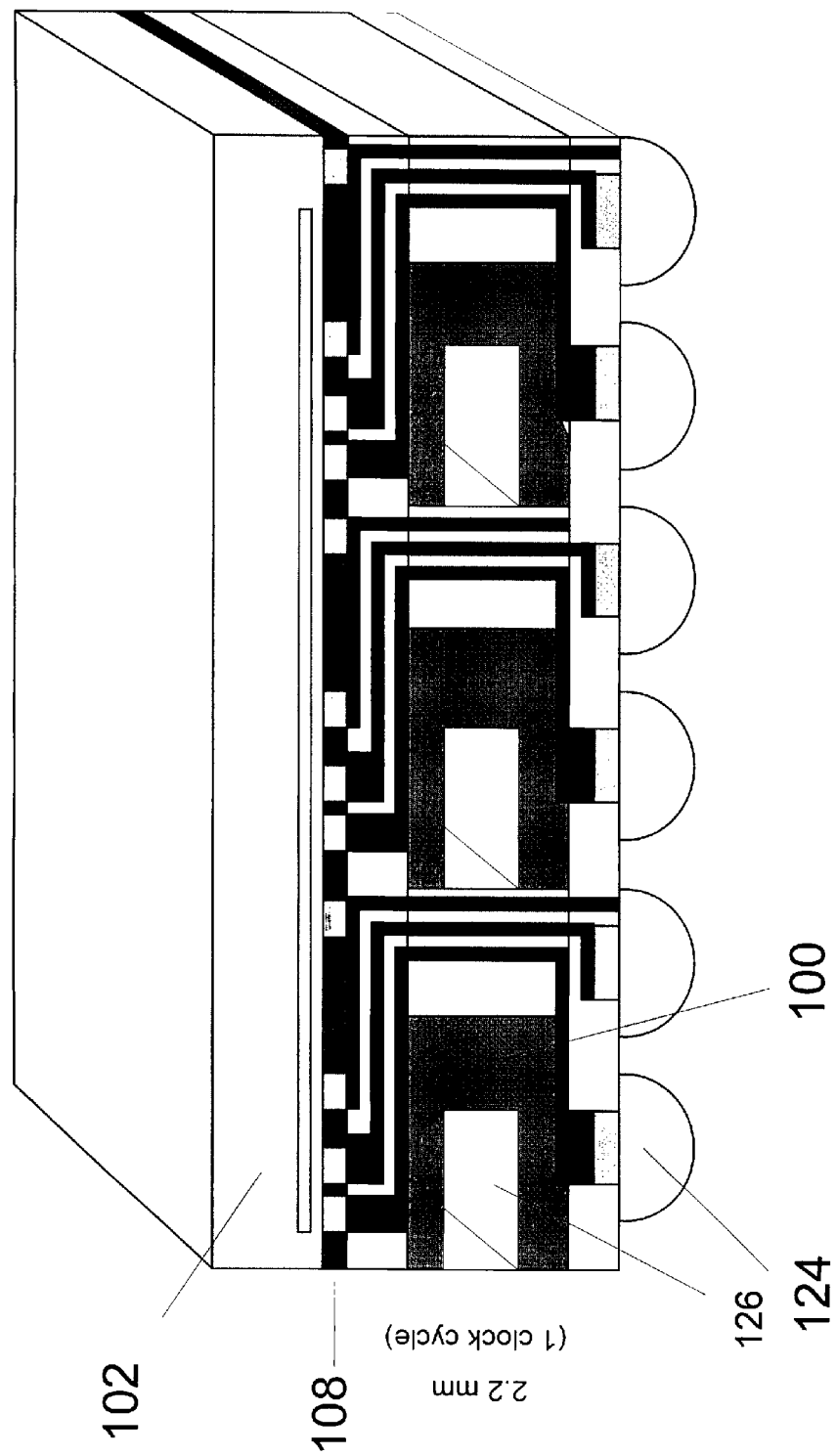
FIG. 21 is drawn in chip to carrier mounting position with the logic wafer on top (for cooling cap attach) and the C4 flip-chip bond to the chip carrier or to the motherboard. In the actual device the vertical memory chips can be thinned and each logic wafer can have access to about 10 to over 100 memory slices.

The device of FIG. 6 has no cooling channels whereas the device of FIG. 21 (and FIG. 7) has cooling channels built in. (Channels are not drawn to scale in FIGS. 6 and 21. Typically the channels are in the order of about 200 um square groovings at about 100- about 200 um spacing patterned in the back of each memory slice. With 2 mm memory chip height, there can be more than 5 channels per memory chip.)

The cooling channels can have a cross-section either square or tunnel shaped. Tunnel shaped cooling channels comprise cooling channels wherein the cross section of such channel comprises a circle, an elipse, or circle or elipse with one or more flattened sides. The cooling channel cross sections can also take on other configurations such as, rhombic, trapezoidal, or symmetrical or asymmetrical, triangular, pentagon, or hexagon configurations and the like wherein the cooling channels range in size from about 50 um to about 2 mm in length, width or both. A normal chip is 0.73 mm thick, so when a chip is patterned with channels on the back, the channels can not be more than 0.73 mm deep. But with the designated cooling device (FIG. 51) we can use thicker material up to about 2 mm, so the cooling channels 700 can be about 0.73 mm to about 2 mm in size. There is no need for more than about 2 mm (3 wafer thickness) as one can not gain any more cooling but will lose chip area). The designated cooling device can have a width of about 0.73 mm to about 2 mm wide. The designated cooling device can be made of Cu, Al, SiC, graphite, and art-known equivalents, materials with high thermal conduction, and is inserted between the 4D chips. The channels can be enclosed circles or squares. They can also be half enclosed square or half circle (tunnels) in shape. Length and width are roughly equal in these cases so the aforementioned dimensions apply to either. Normally we use depth, and length=depth is the usual design. They also can be stacked directly on top of each other or in a checkerboard staggered Pattern. The inside of the channels are coated with surface treatment material like Au for flow resistance reduction and wear resistance.

FIGS. 8 to 20, illustrate the steps employed in assembling the 4D devices of the invention and comprise perspective views of the elements used in this assembly process.

FIGS. 22-50 comprise perspective views of devices that embody the present invention.

Figure 22:
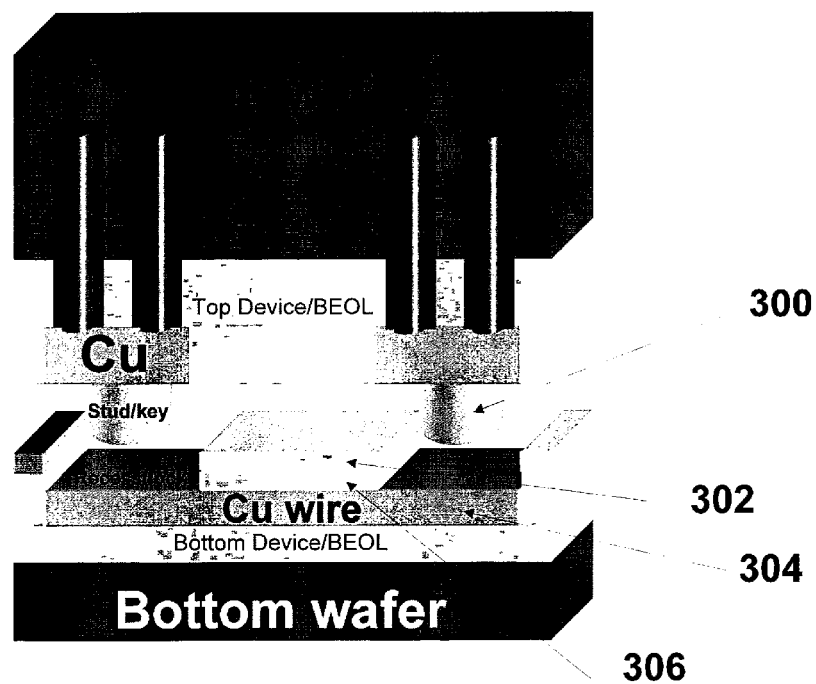

FIG. 22 comprises an illustration of a transfer joining connection device used for logic wafer and the 4D memory wafer.

Figure 23:
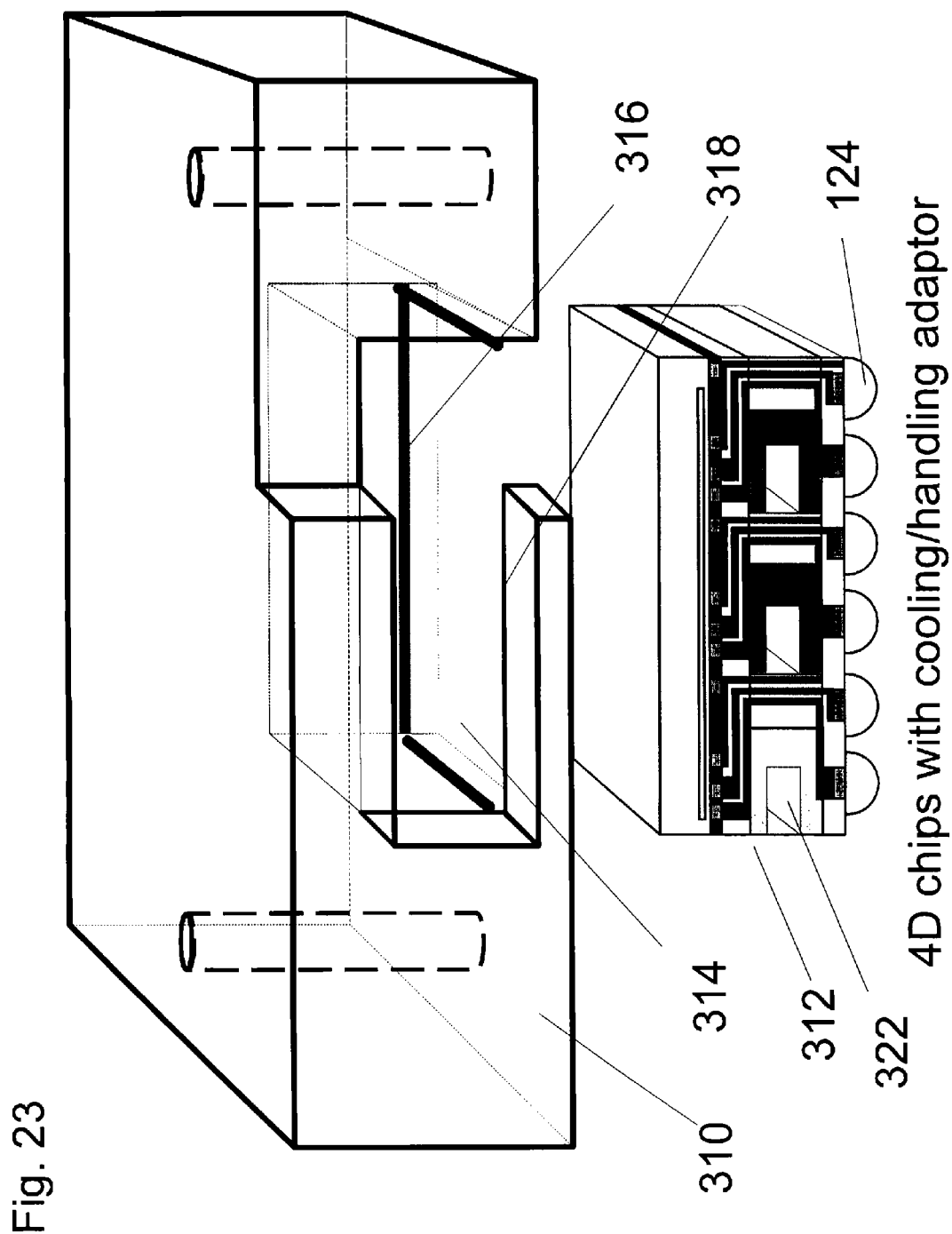

FIG. 23 comprises an illustration of a cut-away view of a thermal cooling hat for the 4D chip.

Figure 24:
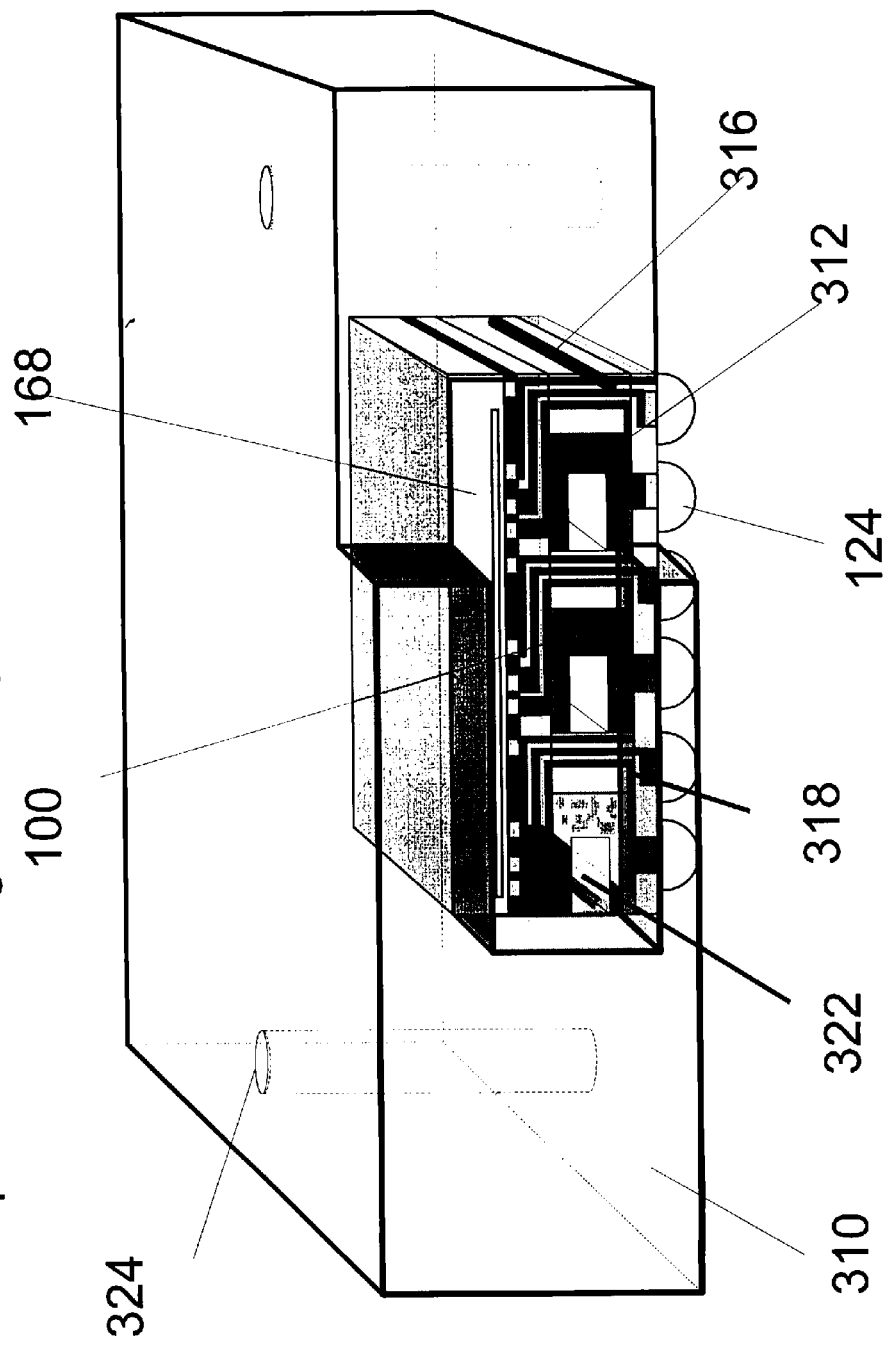

FIG. 24 comprises an illustration of a 4D chip after it is inserted into a cooling hat with a seal separating some cooling channels from a I/O solder.

Figure 25:
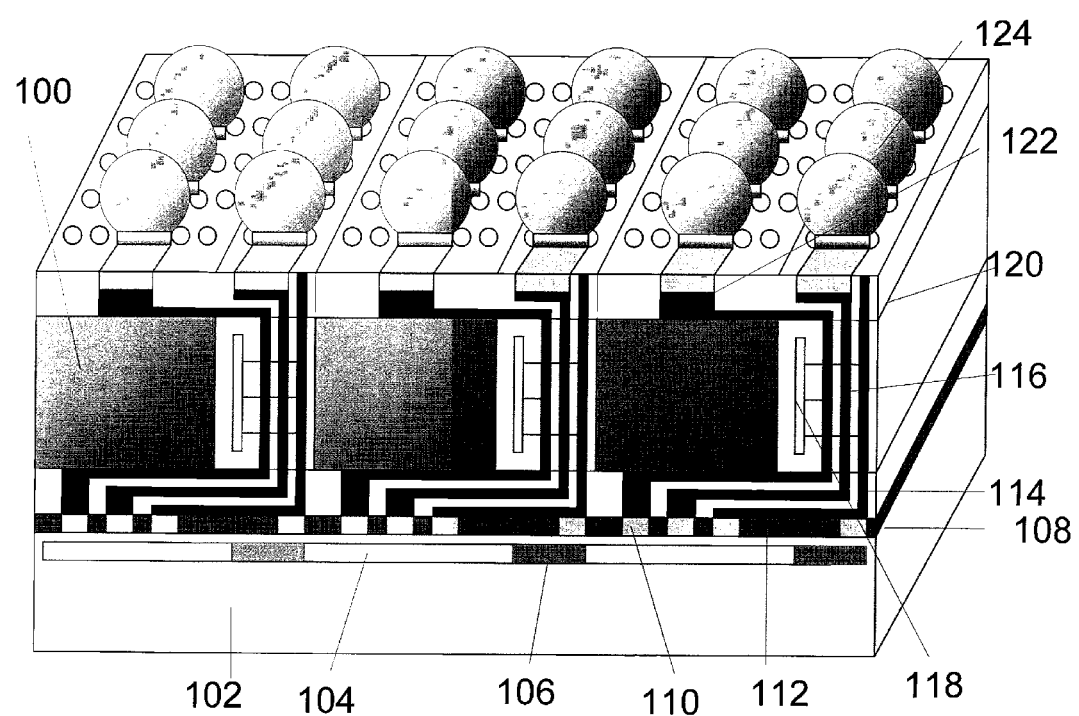
Figure 26:
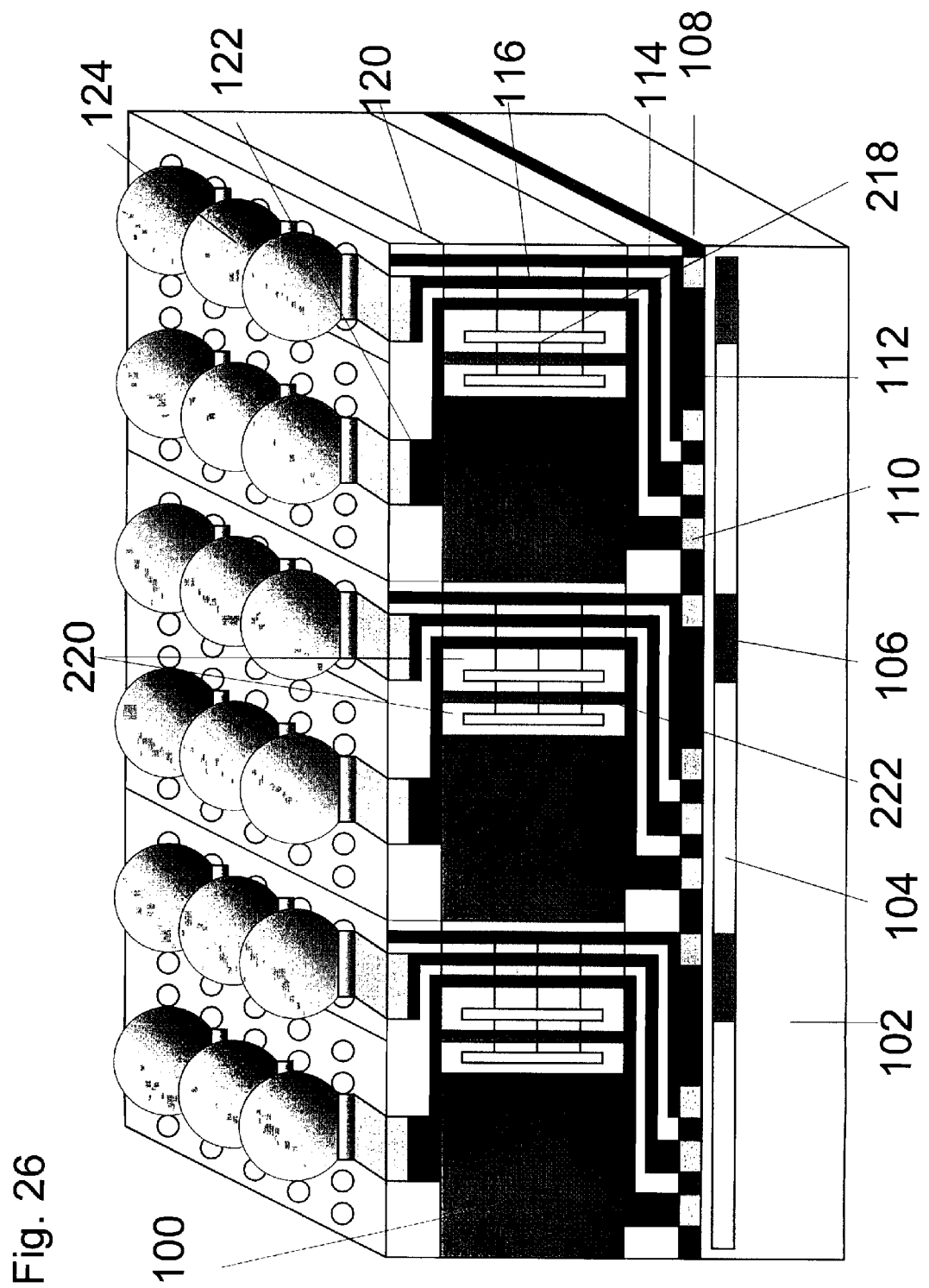
Figure 27:
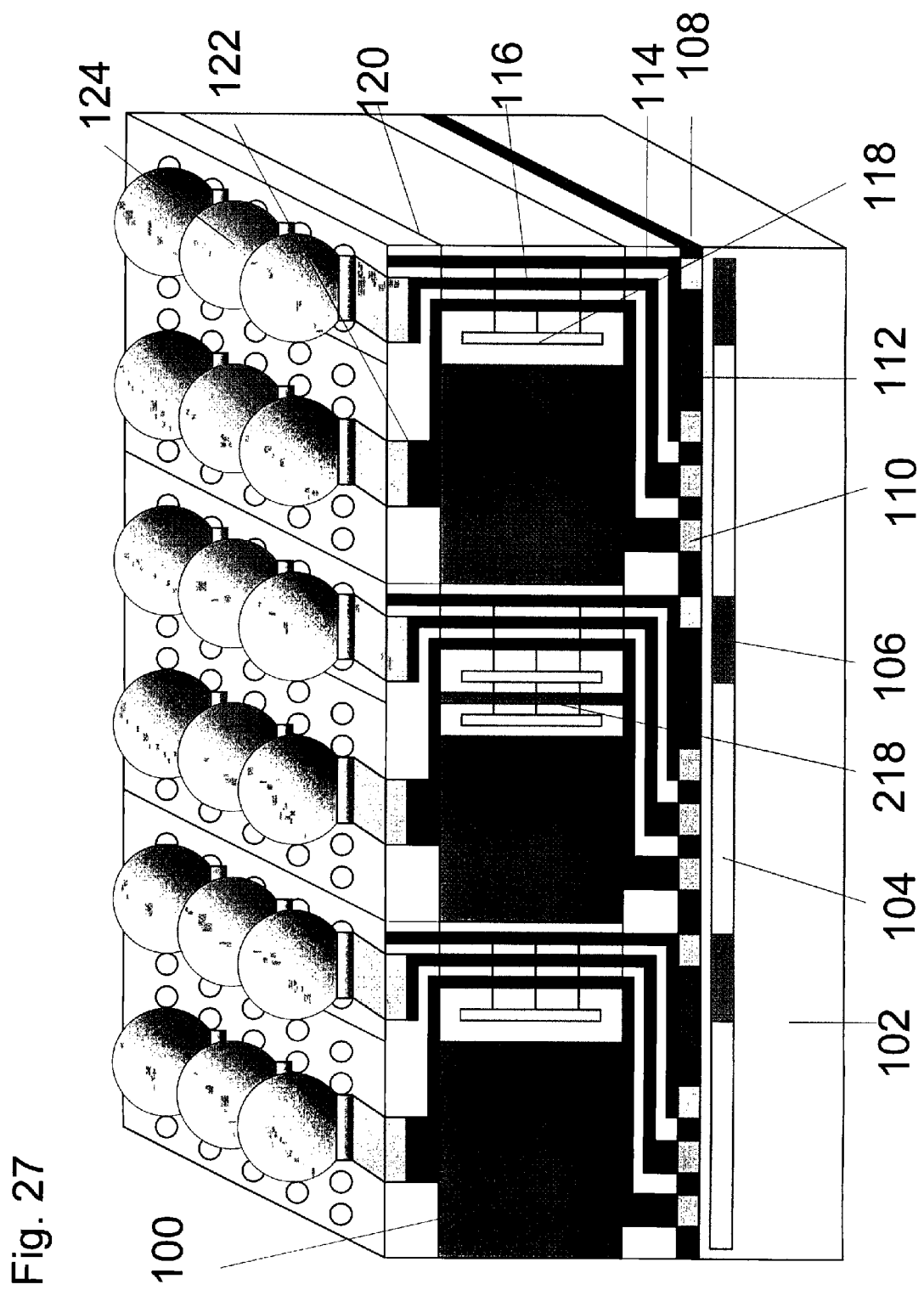

FIGS. 25-27 comprise illustrations of 4D stacking in various slice configurations.

Figure 28:
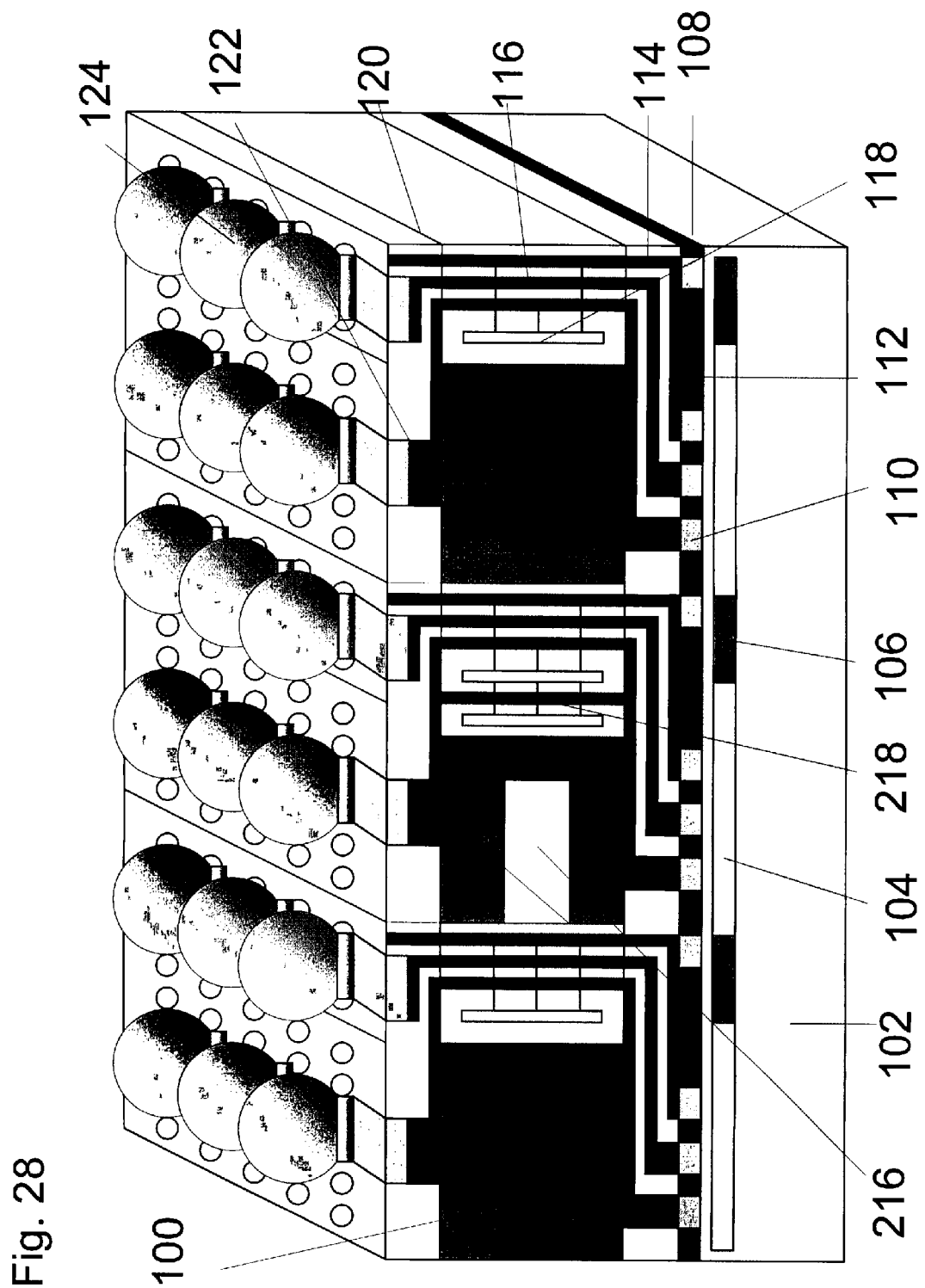

FIG. 28 comprises an illustration showing not all but only some selective slices with cooling channels in a 4D device.

Figure 29:
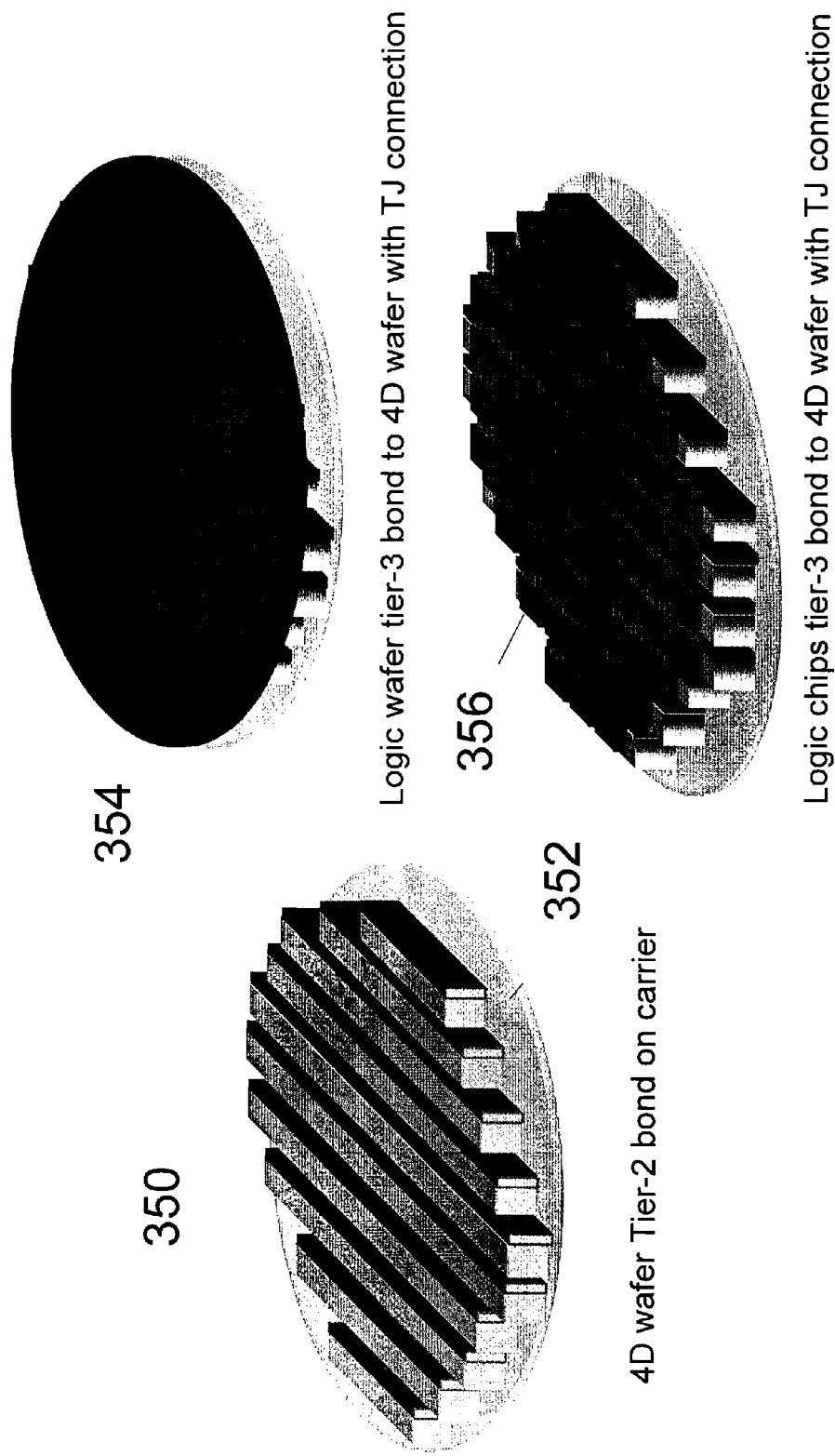

FIG. 29 comprises an illustration showing different ways to attach a logic wafer to 4D slices.

Figure 30:
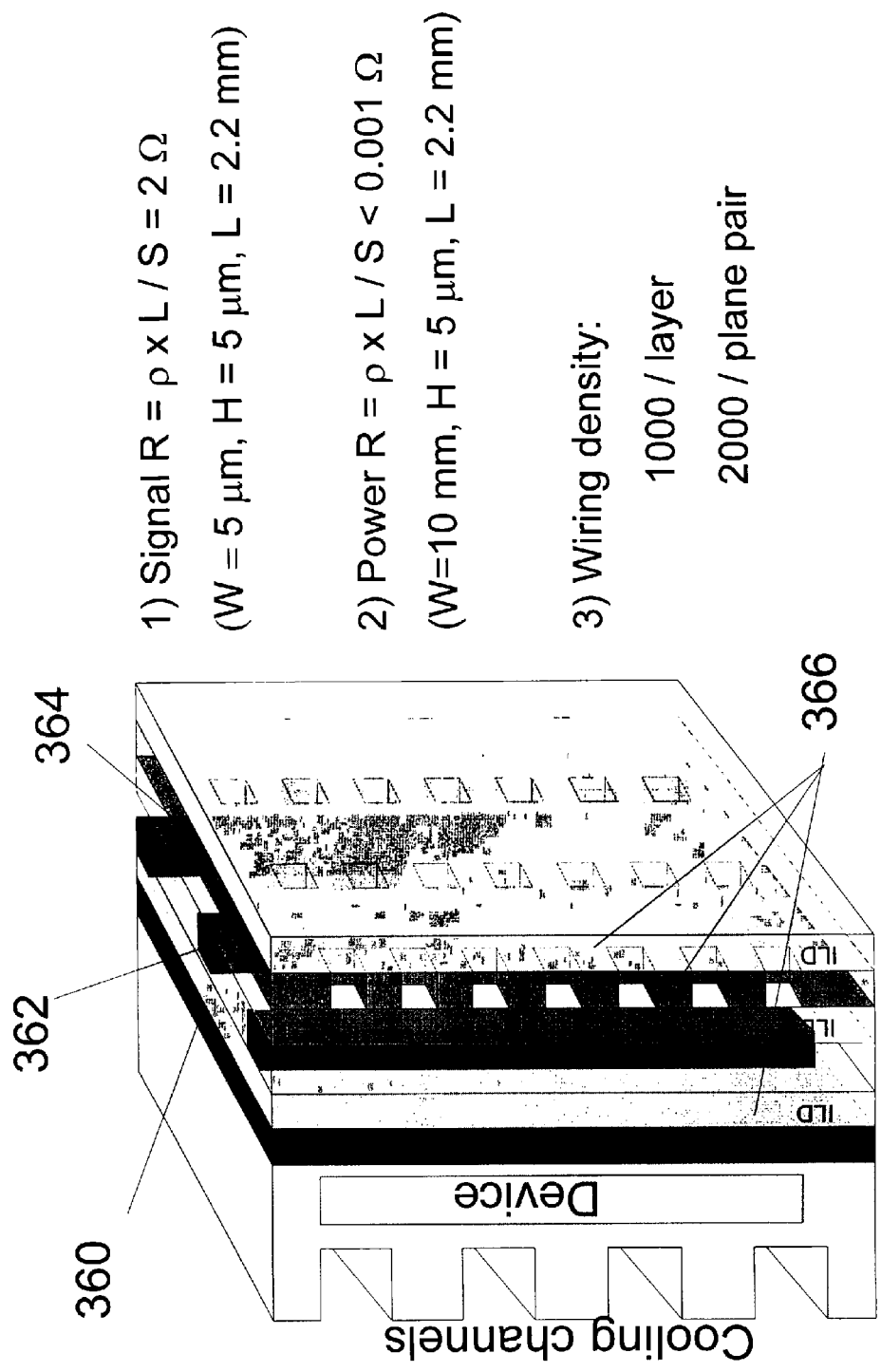
Figure 31:
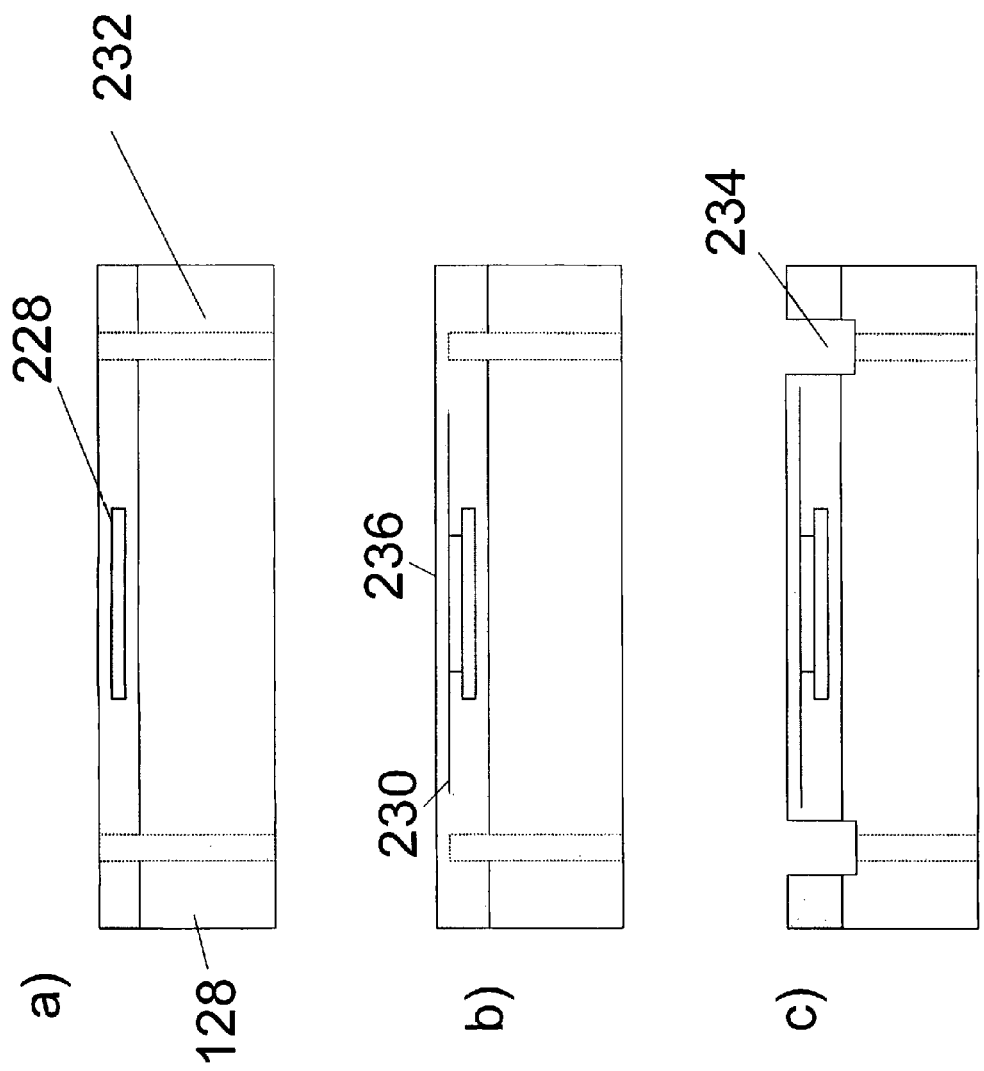

FIG. 30 comprises an illustration showing surface line power supply and wiring density of a device of the present invention, FIGS. 31-37 comprise illustrations showing devices made according to the method of the present invention and show progressive steps used in their assembly.

Figure 38:
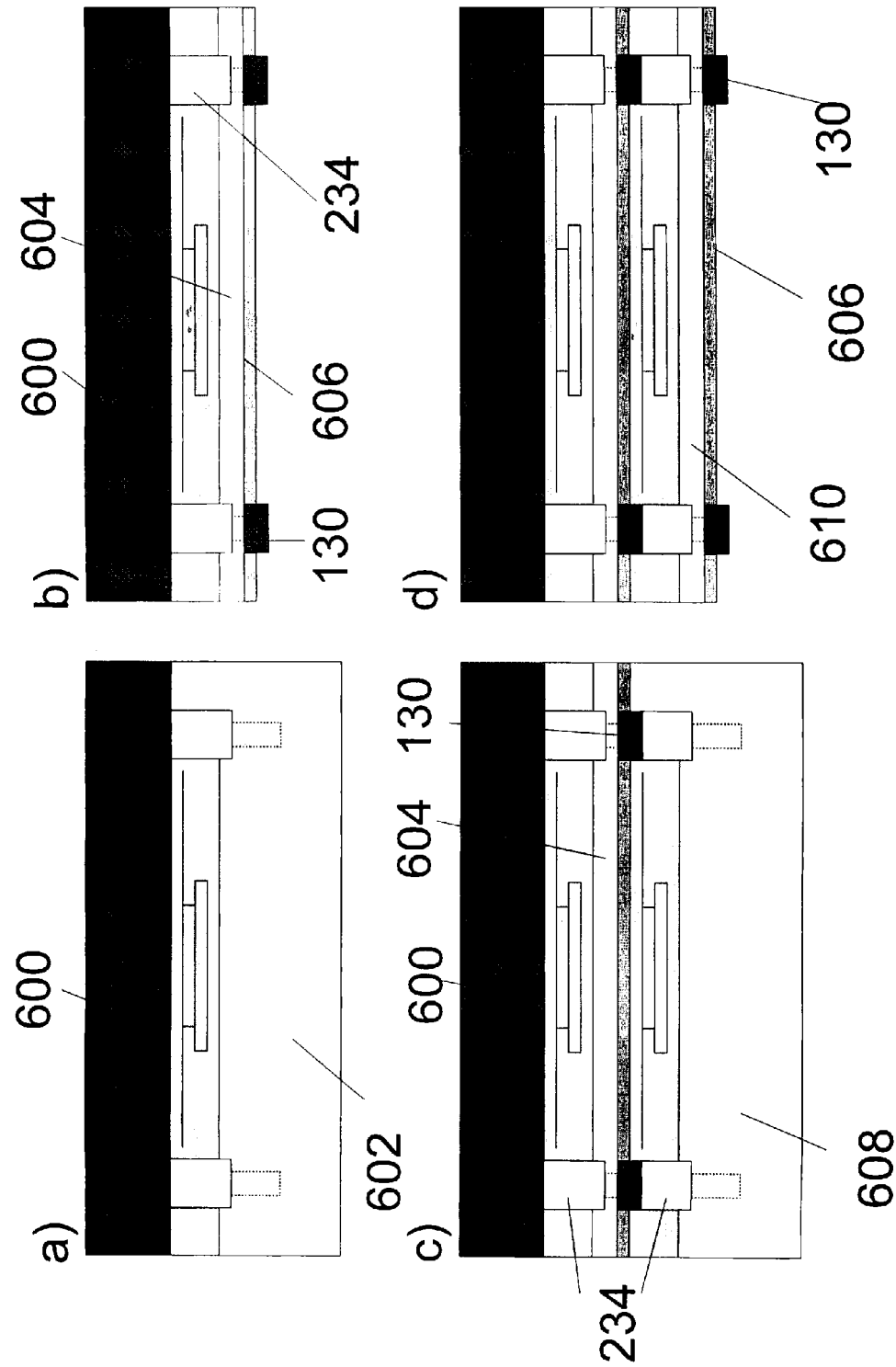
Figure 39:
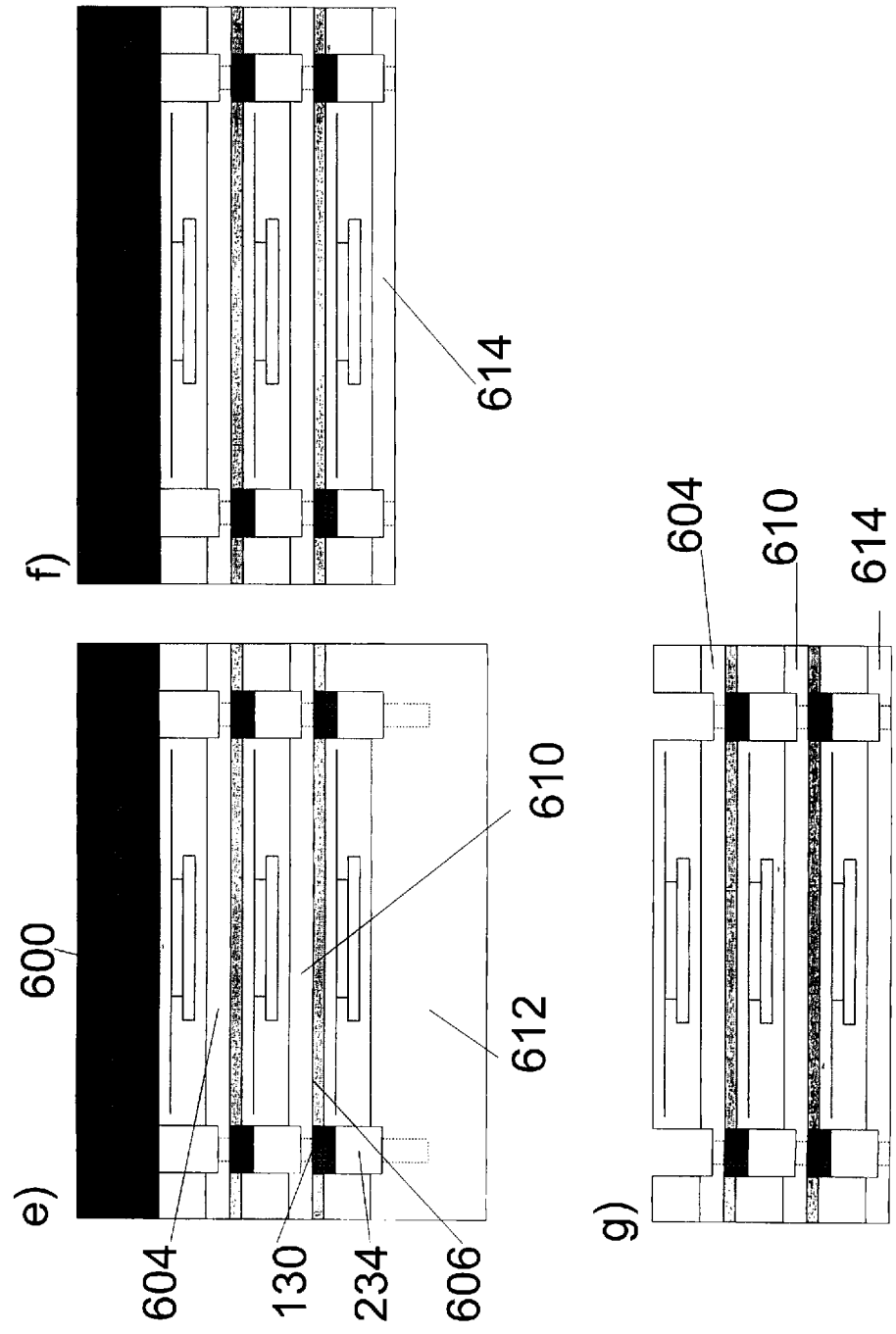
Figure 40:
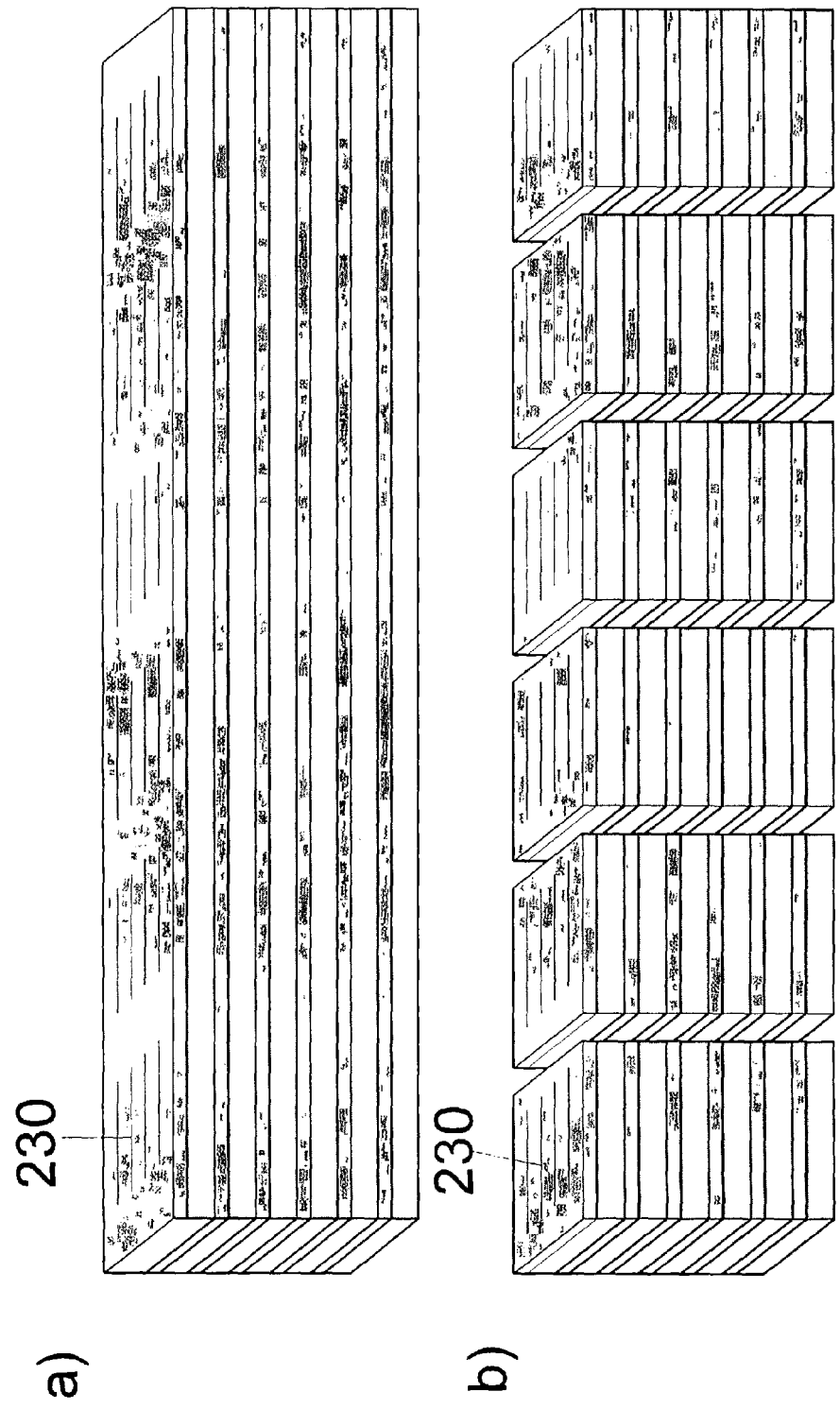
Figure 41:
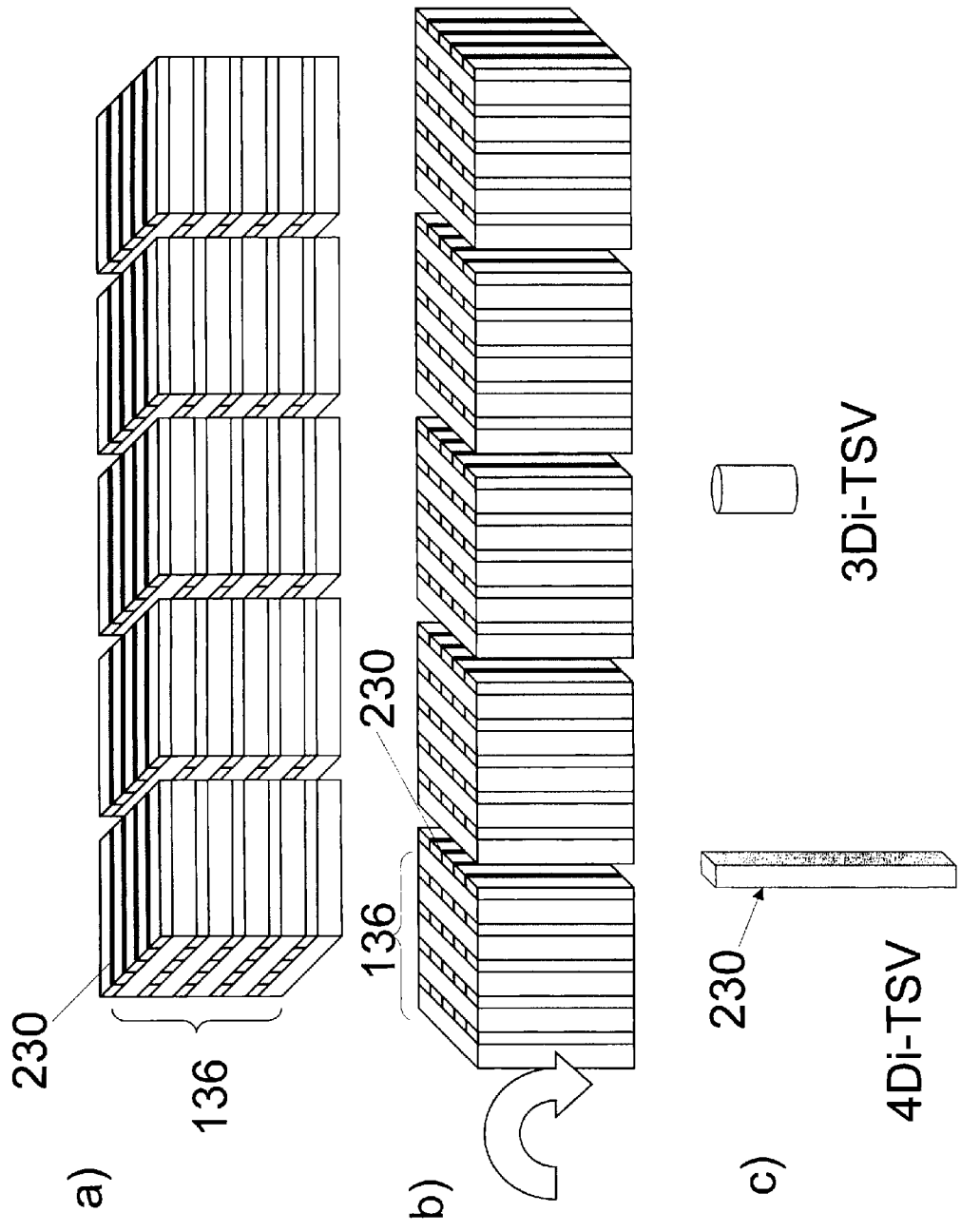

FIGS. 38-39 comprise illustrations showing devices made according to the method of the present invention and show progressive steps used in their assembly when the thickness is not self-supporting so that each subsequent memory wafer n will bond to a stack, the n wafer will be thinned, channel patterned, and adhesive coated, and then be ready to receive the n+1 wafer.

FIGS. 40-50 also comprise illustrations showing the aforesaid devices made according to the method of the present invention and show additional progressive steps used in their assembly.

Figure 51:
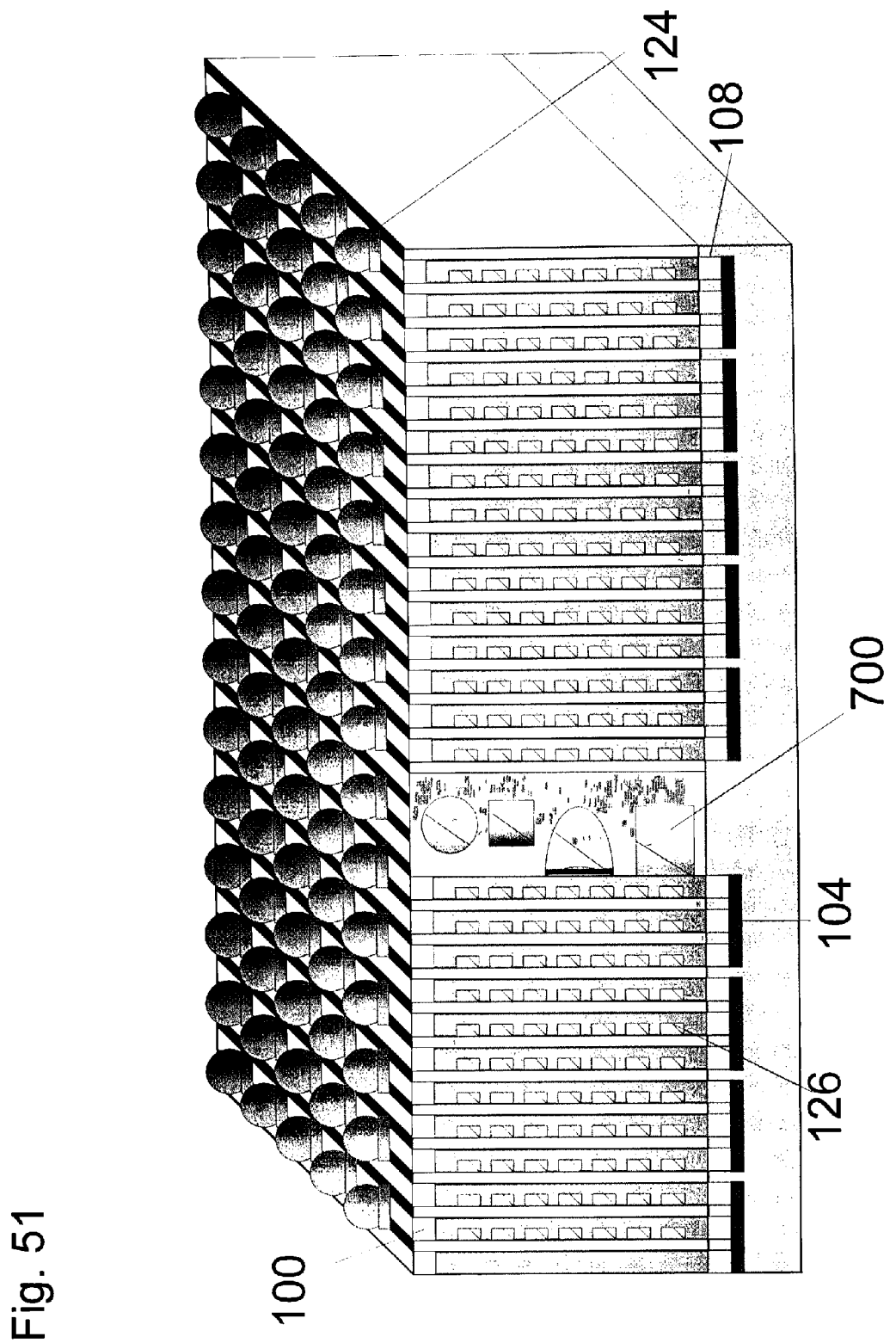

FIG. 51 comprises an illustration showing the device of the present invention with a unique cooling structure that allows assembly of cooling channels 700 that can be about 0.73 mm to about 2 mm in size.

Figure 52:
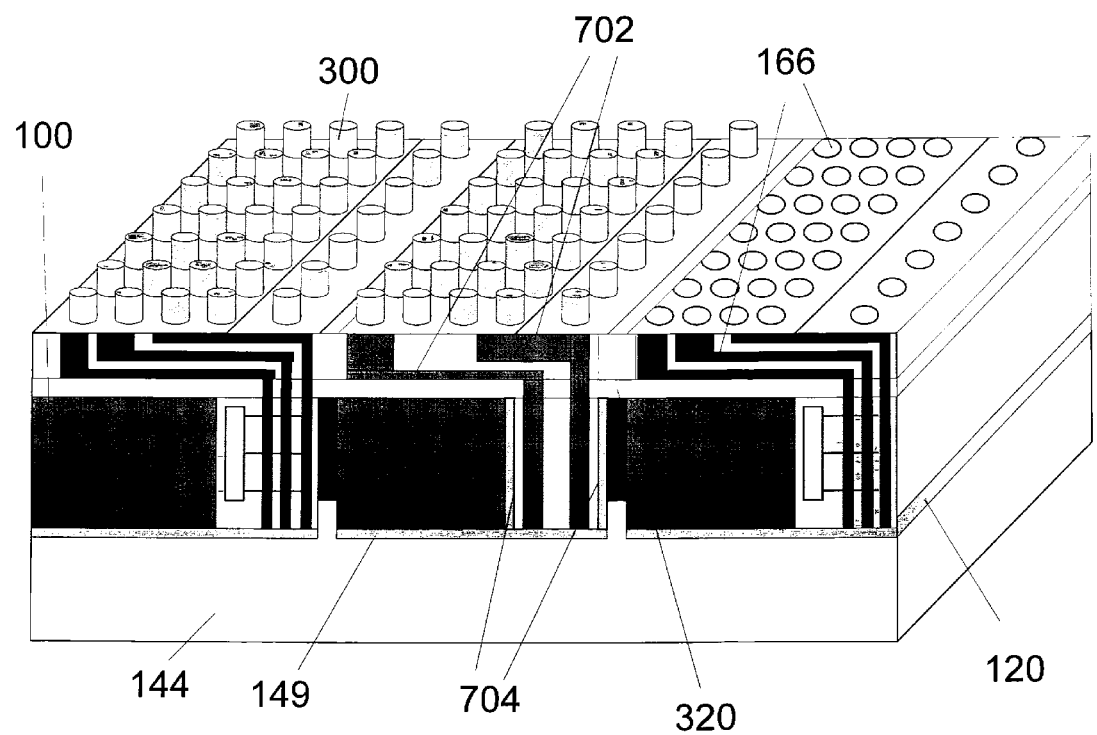

FIG. 52 comprises an illustration showing the device of the present invention with a designated power and ground (702) supplier to a logic chip where a power and ground pair can be made with BEOL on to the device optionally clad with Cu/kepton/Cu sheets.

Figure 53:
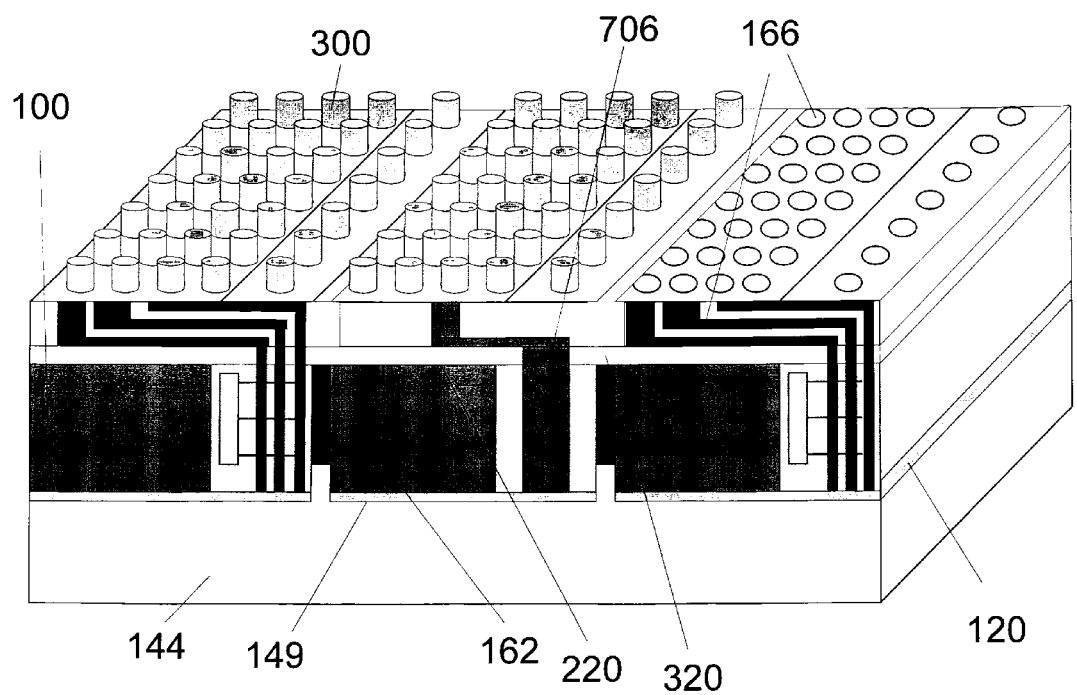

FIG. 53 comprises an illustration showing the device of the present invention with a designated 4D I/O device and I/O bus running between logic and system I/O, wherein the device can be either electrical for high speed chip-chip communication or optical for node-node data transfer.

Figure 54:
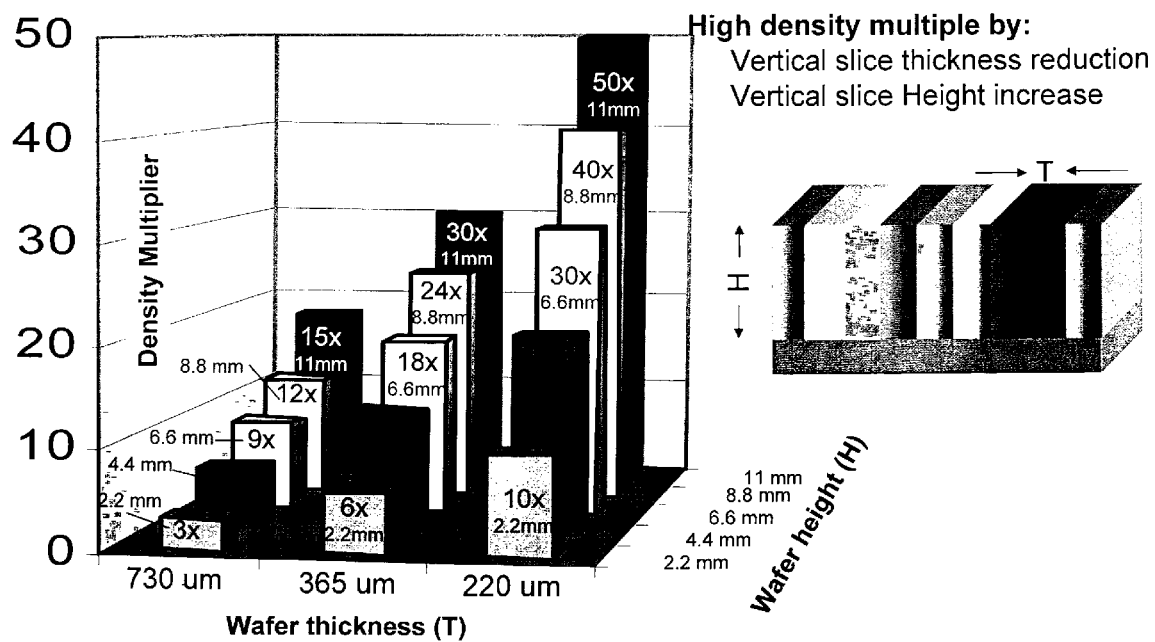

FIG. 54 comprises a three dimensional diagram illustrating various aspects of the invention by showing the stack density multiple (of 2D) as the function of 4D wafer thickness (T) and the height (H).

DETAILED DESCRIPTION

To achieve these and other advantages, and in accordance with the purpose of this invention as embodied and broadly described herein, the following detailed embodiments comprise disclosed examples that can be embodied in various forms.

The specific processes compounds, compositions, and structural details set out herein not only comprise a basis for the claims and a basis for teaching one skilled in the art to employ the present invention in any novel and useful way, but also provide a description of how to make and use this invention.

More specifically, the following written description, claims, and attached drawings set out the present invention which comprises a new 4DI system that increases system density within the 1 clock-cycle up to about 100× more in memory density than the 2D system, as well as a process for making the system. In addition to memory density increase the 4DI also provides a micro-channel cooling capability for the system. The I/O density can support micro-C4 (about 50 um pitch) while the front-side-bus (FSB, logic to memory) can support about a 10 um pitch or less. In the Figs. only one single core and three memories are stacked for clarity. In an actual system, there can be any number of cores and over about 100 stacked memories (limited by memory thickness and cooling channel size).

We define 2D as a normal wafer, 3D comprises 2D's stacked with through-device-vias ("TSV") connecting the layers. 4D comprises the present invention (vertical stacked slices through fine pitch TJ edge connections to a logic device). In 4D the vertical slices can be either 2D or 3D. The horizontal logic can also be either 2D or 3D. In one embodiment, blank conductor sheets such as a metal sheet about 1 um to about 20 um thick, e.g., Cu and the art-known equivalents thereof, are inserted between the vertical components to provide a power/ground connection to the top logic circuit. The metal sheets in this regard are placed using an adhesive to provide the appropriate connection to the device. FIG. 52 shows a designated power and ground (702) supplier to the logic chip. The power and ground pair (702) can be made with BEOL on to the chip. They can also be clad with Cu/kepton/Cu sheets (from Dupont) with adhesive (704) and are inserted between the 4D chips during lamination).

Thus, in one embodiment the vertically stacked component comprises 3D device slices with TSV within each of the 3D device slices and the 3D devices form 4D stacking without TSV between the 4D devices in a 3D-in-4D format. In this embodiment, the primary 3D comprises traditional 3Di with TSV, 3DI-TSV, whereas a secondary 3Di comprises vertically stacked devices using surface wiring with edge I/O fan-out. The secondary 3DI can comprise a stand-alone device such as memory stacks. The 4DI comprises secondary 3DI with T&J (or other fine pitch connection) connection to a horizontal logic. 3DI, 3D, and 3Di are all interchangeable terms as are 4DI, 4Di and 4D as used in the present specification.

In FIG. 6 the core chip (logic wafer) 102 is at the bottom of the drawing facing up in a conventional 2D format. The cores 104, comprise three cores shown in FIG. 6., but can be any number of cores per logic wafer FIG. These cores are wired to their control blocks 106 using the conventional 2D wiring. The position and wiring, however, can be different from what is shown, depending on the design. A layer of transfer and joining (T&J) fine pitch connection interface is formed on the top surface of the 2D logic wafer 108 and comprises a metal 110/adhesive 112 hybrid connection device, e.g., a Cu-adhesive hybrid for device connection and is known in the art. Other connection methods can be used as well, such as micro-C4 solder bumps, metal-metal compression bonding, to name a few. Above the cores are three vertical stacks of memory chips 100, three are shown, but can be any number of memory stacks per core based on the memory thickness and core size. The core-memory connection is through the control block 106, T&J connection layer 108, top-surface fan-outs 114, the memory surface lines 116 I/O bus, and finally to the memory device banks 118. The memory chips 100 are conventional 2D devices, except they are flipped on their sides in the Figs.

In the present invention, Top surface metal always refers to the surface connecting to the logic wafer with internal I/O. Bottom surface metal refers to the surface connecting to the external I/O, such as chip carrier or motherboard. The memory chip height (also their width in the Figs.) is about 2.2 mm (or within one clock-cycle) of the logic core. The memory chip height, or width, can be more than the 2.2 mm to increase the memory density. In that case the memory chips are separated in clock-cycle bands based on data priority in 2.2 mm increments. On the other side, the bottom side, or the bottom surface 120 of the memory chips the same fan-outs 122 from the other bus end allow connections to C4 (I/O) 124 of the external system I/O. The C4 side is the bottom side and the logic side is the top side in the final carrier attach configuration. The C4 connection is normally made with solder at a lower pitch (about 50 um to about 200 um).

Figure 7:
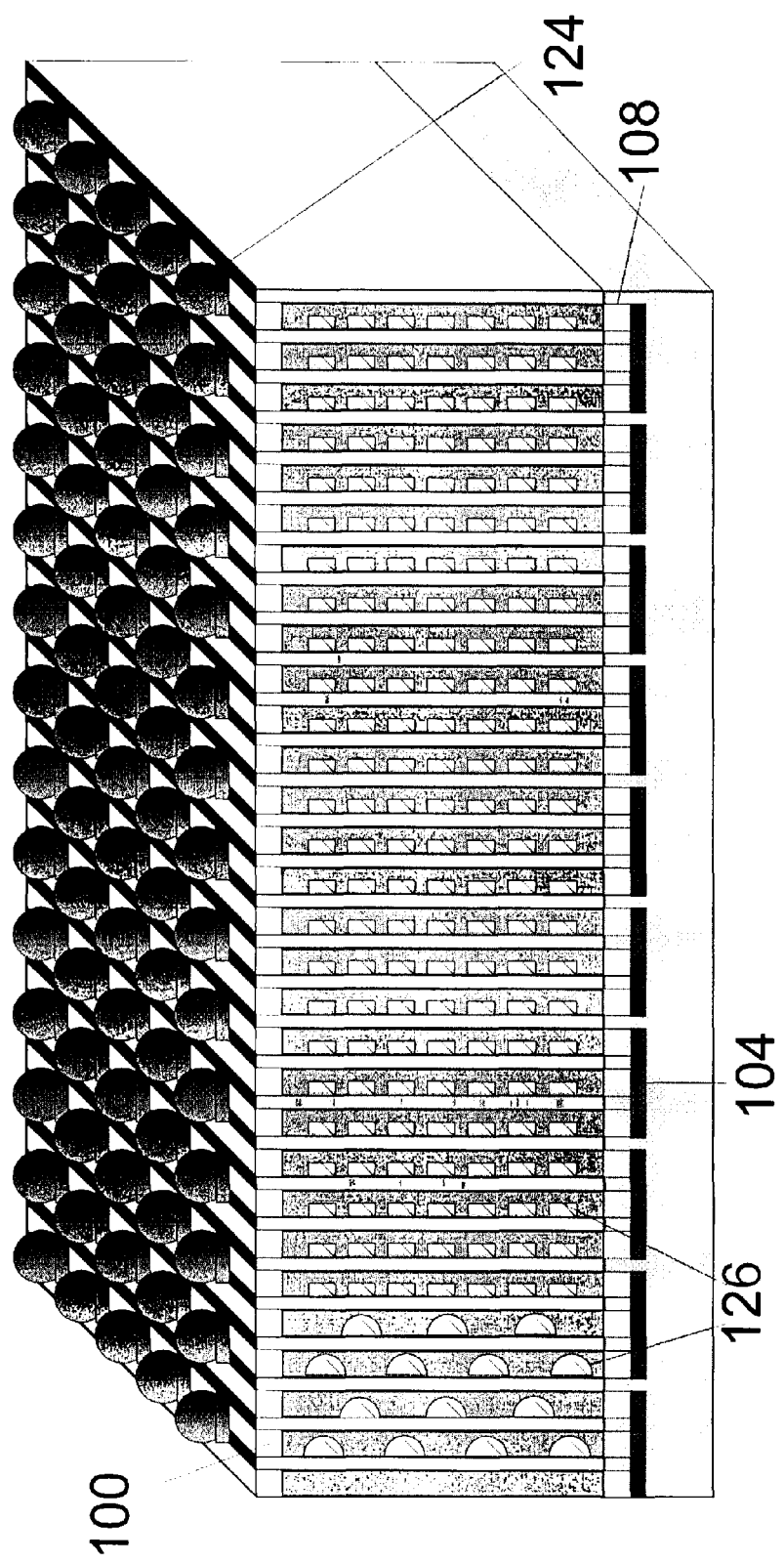

FIG. 7 comprises an embodiment similar to FIG. 6 except it shows a chip level in a multi-core, multi-memory stack per core view with cooling channels built-in. The memory chips are densely populated in vertical format with multi-core logic shown. The memory chips 100 can have a thickness from about 20 um (or about 500 vertical stacks per cm, thinned) to about 740 um (or about 14 vertical stacks per cm, not thinned). A device with cooling channels for cooling with a fluid comprising a liquid such as water or an organic liquid, or a gas, e.g., air, nitrogen, rare gasses, or refrigerant gasses including halogenated refrigerant gases provides cooling capability, and comprises a vertically stacked memory about 100 um thick with these cooling channels about 50 um, designated as structure 126 in FIGS. 7, 21, 33, and 34.

FIG. 7 Also shows the shape of the channels can be square or "tunnels." The tunnel shape has better stress resistance. The tunnels can also be stacked in lined-up or staggered checkerboard pattern for better stress distribution. The interiors of the tunnels are coated with a surface treatment material to reduce flow resistance and increase wear resistance such as a surface treatment material comprising Au, or other noble metals including mixtures thereof and alloys thereof and their art-known equivalents.

Figure 8:
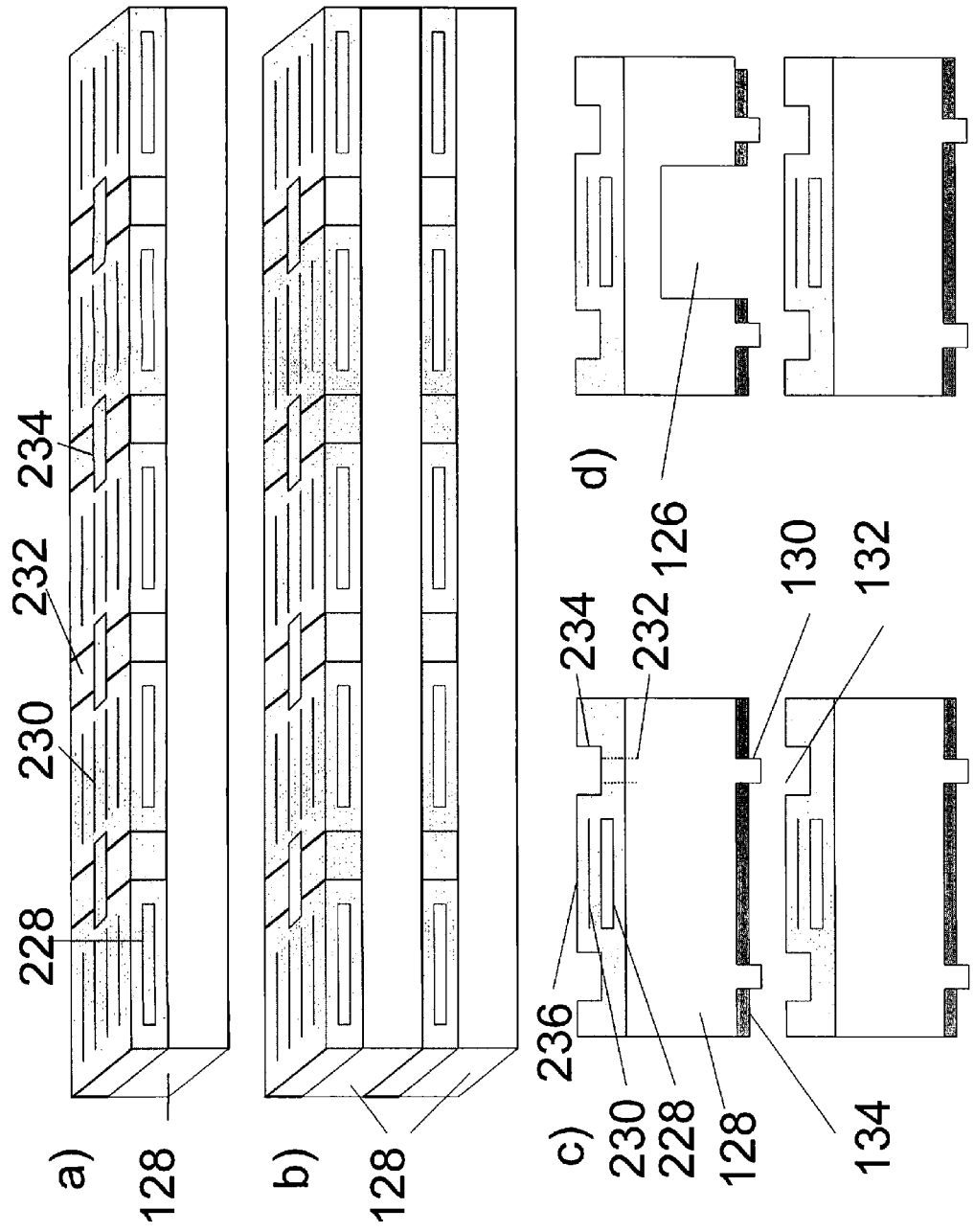

FIG. 8 to FIG. 20 show one of the ways to form the vertical memory stack starting from an individual memory wafer. In FIG. 8*a*, a traditionally built (without using through-Si-via, TSV) memory wafer 128 is shown with 5 chips. The memory banks 228 normally are wired to top surface via C4 solder or have wire bonds for external I/O connections. In 4D device the memory banks are wired to a set of the surface wiring bus 230 running the length of the chips in x-direction (left-right), just slightly (about 10 um-about 20 um) short of reaching the dicing channels 232. A set of accurately positioned trenches 234 are deep etched into the dicing channels area. These trenches are typically about 10 um-about 50 um in width (in-out plane) and about 10 um-about 100 um wider (left-right) than the dicing channels 232.

In FIG. 8*b* several of these memory wafers are accurately stacked into a block about 2 mm-about 5 mm in total thickness. The accurate alignment between the wafers can be achieved using the lock/key with adhesive device, also called transfer/joining (TJ) connection in the art, shown in FIG. 8*c*.

In FIG. 8*c* the TJ connection device is shown. The bottom of the top wafer has a set of protrusions 130 aligned with the deep trenches 234 on the top surface. The protrusions (130) are typically about 2 um-about 10 um high and about 1 um-about 2 um smaller than the deep trenches for a tighter and accurate fitting. The wafers are bonded together (called tier-1 bonding) with the adhesive 134 coated on the wafer backside. Notice that after tier-1 bonding the deep trenches of the very top wafer and the protrusions of the very bottom wafer are not used for tier-1 bonding. They will be used for tier-2 bonding alignment in FIGS. 13-16. We define tier-1 and tier-2 as a "device." The main difference between tier-1 and tier-2 is their grouping functionality. The device might be similar. Tier-1 aligns and bonds the vertical slices together front-back into a set. The set also has a front and back for alignment and bonding (tier-2), Tier-2 may look the same as tier-1. Tier-2 aligns and bonds to a carrier, and not between themselves.

In FIG. 8*d*, the micro-cooling channels 126 are formed on the back of the wafers prior to tier-1 bonding. In FIG. 8 memory wafers 128, are pre-thinned to a certain thickness (>about 150 um, e.g., about 200 um thickness for a 50 memory wafers/cm stacking density) which can self support. For wafers thinner than about 150 um a wafer handler will be needed and the wafers are stacked one at a time until the desired thickness (about 2 to about 3 mm) is reached. This pre-stacking thickness is to limit the cumulative stack errors by the variations in wafer thickness. After the memory wafers are diced into strips and flipped on their sides. This thickness stacking error will accumulate and translate into error in x-direction (left-right) and the fan-outs lithography will not be able to match (capture) this variation if no limit is set. By limiting the thickness the error can be controlled within an acceptable level for each stack thickness and the lithography can then step and repeat through the stacking in blocks.

In interfaces the stacked wafers are coated with adhesion materials, comprising either an art-known adhesive or metal for bonding. The adhesive 134 thickness is about 1 to about 5 um with lock 130/key 132 or tongue/groove device built in (See FIG. 8*c* which provides alignment and slippage control (similar to T&J joining). In one embodiment we bond all the memory wafers in the tier-1 stack together under pressure and at a vacuum comprising <about 50 mTorr. The pressure comprises <about 400 PSI. We can also purge any gas formed during this bonding to further prevent oxidation.

Figure 13:
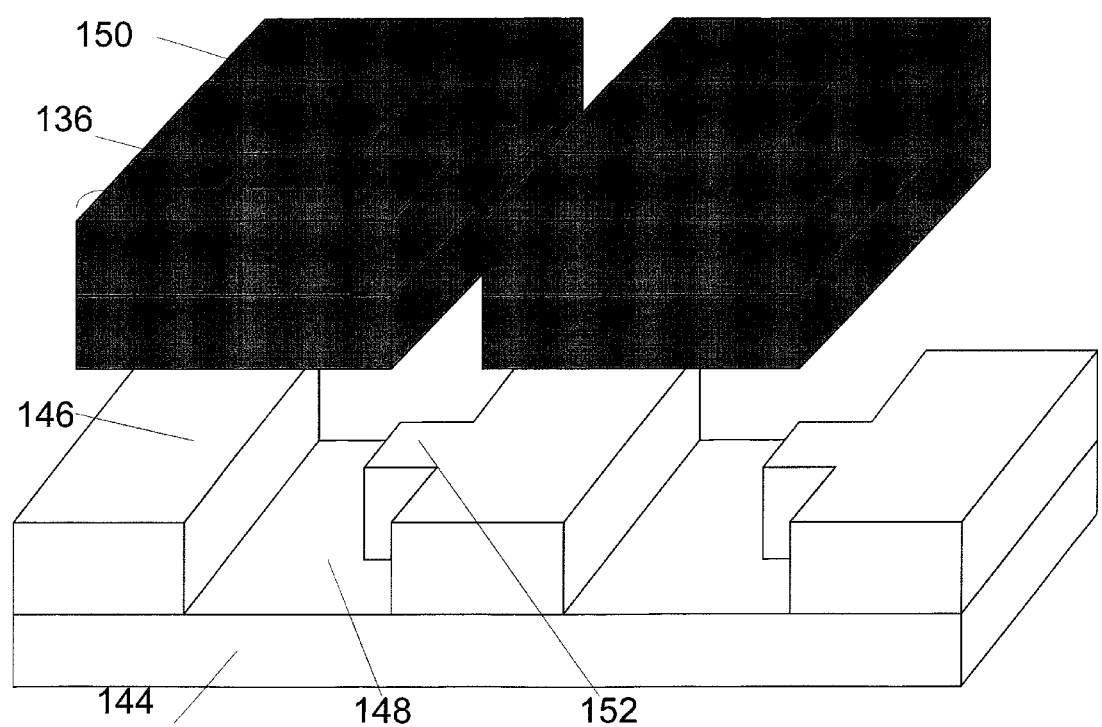

The micro-channels 126 in FIG. 7 and FIG. 21 are also etched in and formed at this stage. The lock/key or tongue/groove can be patterned either independently or with the micro-channel grooves with a design similar to that in FIG. 8 to aid the wafer stacking alignment. FIG. 8 is tier-1 bonding. Tier-1 is memory stack bonding before flip the memory block on the side. FIG. 13 is tier-2 bonding which is performed after the flip).

Figure 9:
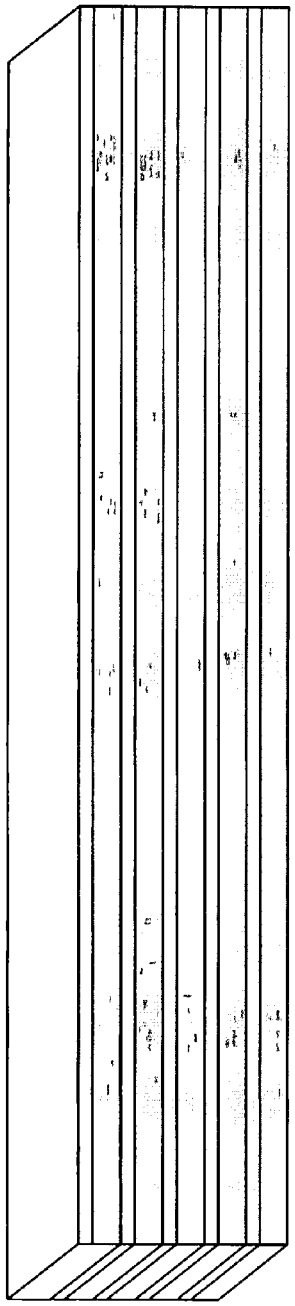
Figure 10:
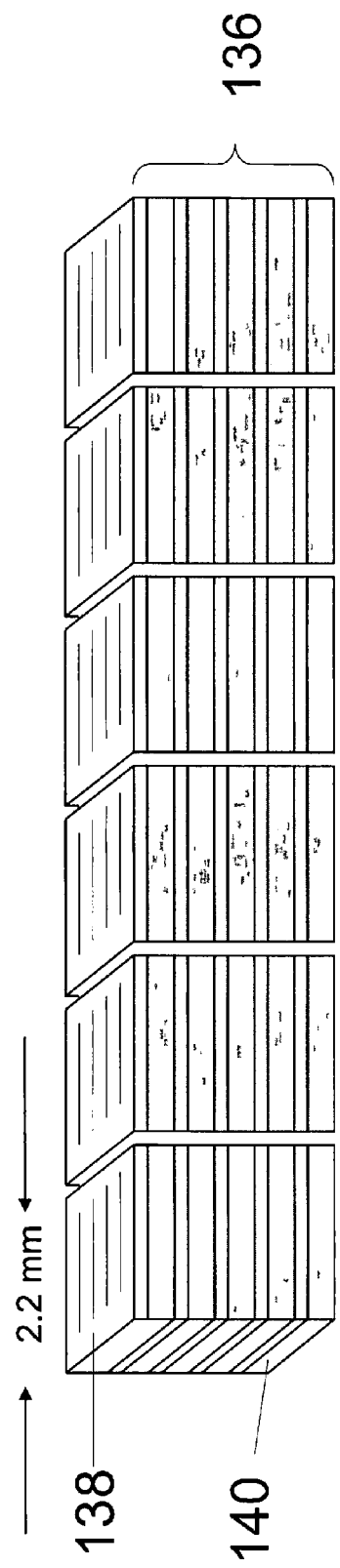

FIG. 9 shows the memory wafers 128 stacked and laminated together (this lamination is also called tier-1 lamination, performed before the memory stacks are flipped on their side). The total stack thickness of the tier-1 is determined by the stack, dicing alignment ability, typically about 2 to about 5 mm In FIG. 10 we show the tier-1 laminated wafers are diced into about 2.2 mm (1 clock-cycle) strips 136 which indicates the total stack after dicing in FIG. 10 which employs a new bracket to indicate the stack. It is the same as in FIG. 43 and FIG. 44; however, in FIGS. 43 and 44 only one slice is draw for the BEOL wiring for clarity. The surface I/O lines 138 for the memory chips 140 are running horizontal on the top surfaces of each memory layer 140 in the stack. The strips 136 run the entire wafer length in and out of the plane.

Figure 11:
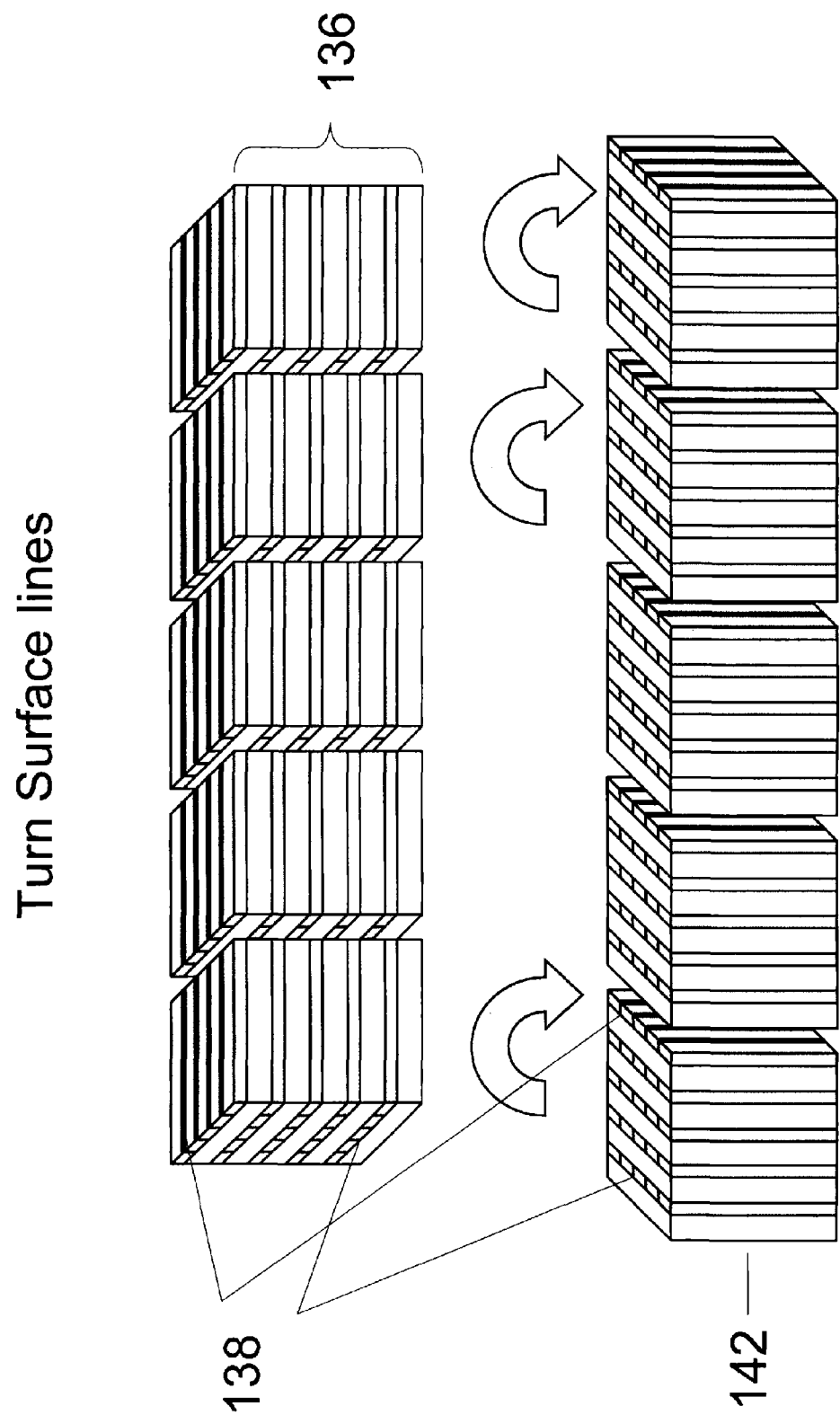

In FIG. 11 we show the memory strips that are then flipped about 90 degrees onto their sides 142. Note, the surface I/O lines 138 are now running vertical from top to bottom.

Figure 12:
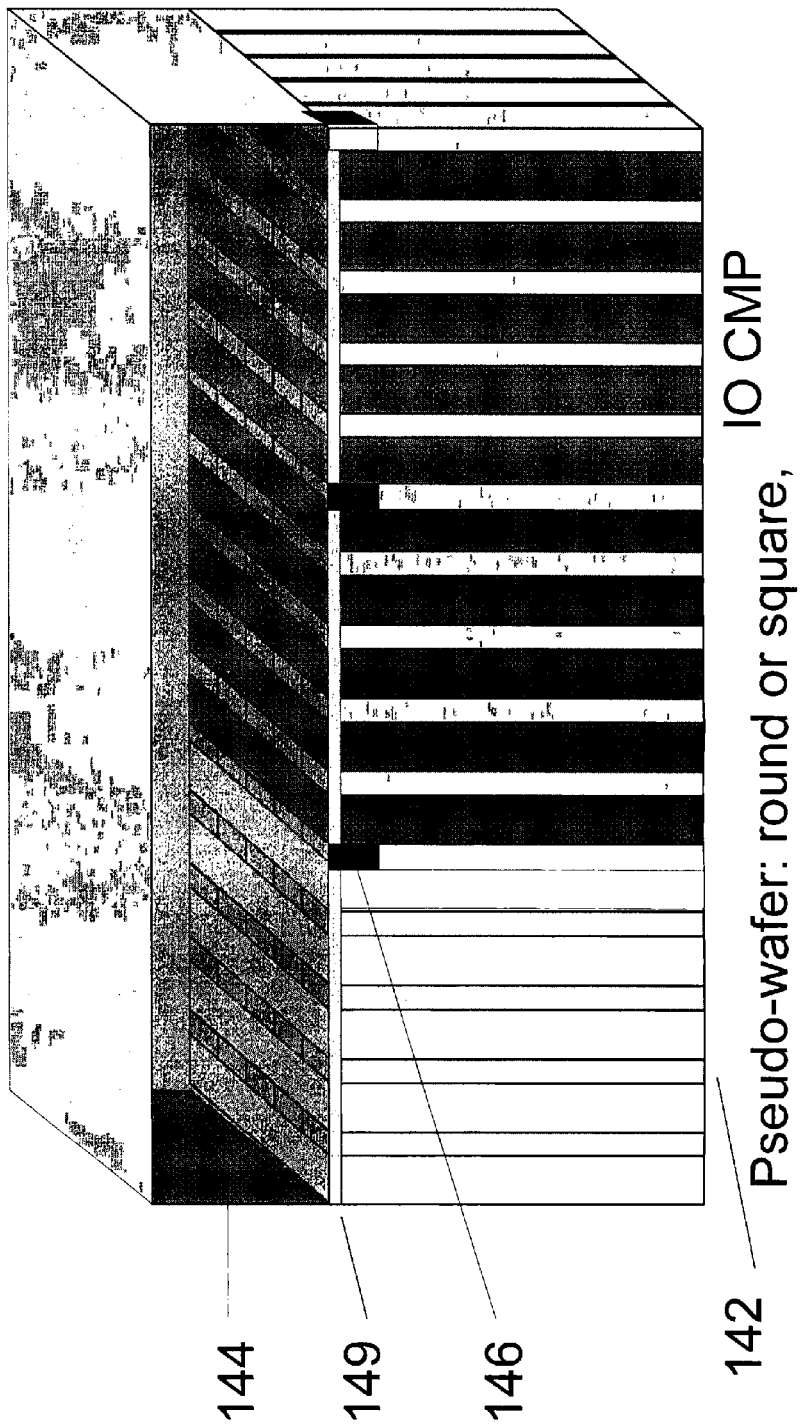

FIG. 12. we show each flipped strip 142 aligned to a template or carrier (either square or round) 144 with lock/key (tongue /groove) device 146 formed at the interface of the template 144 and turned strips 142 for accurate placement. The assembly is secured with an adhesive layer 148. The temperate can be just another wafer. The placement for this tier-2 bonding is at the C4 124 side (or bottom side) 120 first and allows the process of the T&J side 108 to attach to a logic wafer 102.

In FIG. 13 we show one of the ways to provide template lock/key formation. The template 144 is at the bottom of the drawing with it's strips receiving surface 146 facing up with strips positioning grooves 148 etched in. The grooves 148 are slightly wider than the strips' thickness (at tier-1 bonding) to indicate x (left-right) position of the strips 136 after their 90 degree flip. And there are indicating positions etched in the notches in and out of the plane to help indicate y (in-out) position. Prior to tier-1 dicing in FIG. 8 the location notches 132 are etched in and are diced into receptors opening. As the strips are flipped about 90 degrees the receptor notches formed in FIG. 8 are lined up with the tongue 152 in the template grooves for y (in-out) registration or alignment. The surface of the template 146 and the bottom of the grooves 148 are coated with adhesive (metal or polymer) prior to the flipped strips placement (tier-2 bonding)

Figure 14:
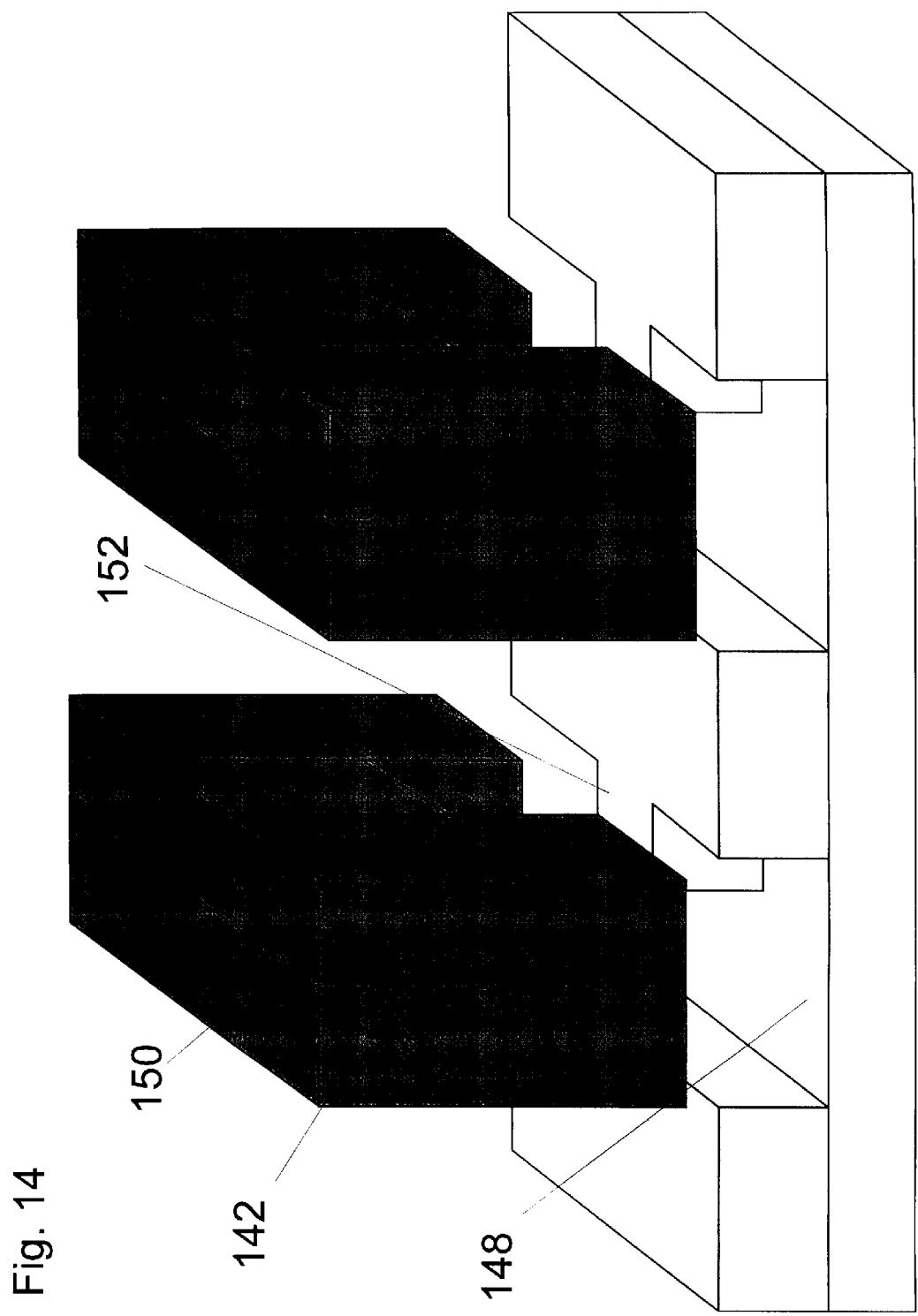

FIG. 14 show the strips 142 are flipped about 90 degrees and their indicating notches 150 are lined up with the grooves 148(x) and indicating notches 152(y).

Figure 15:
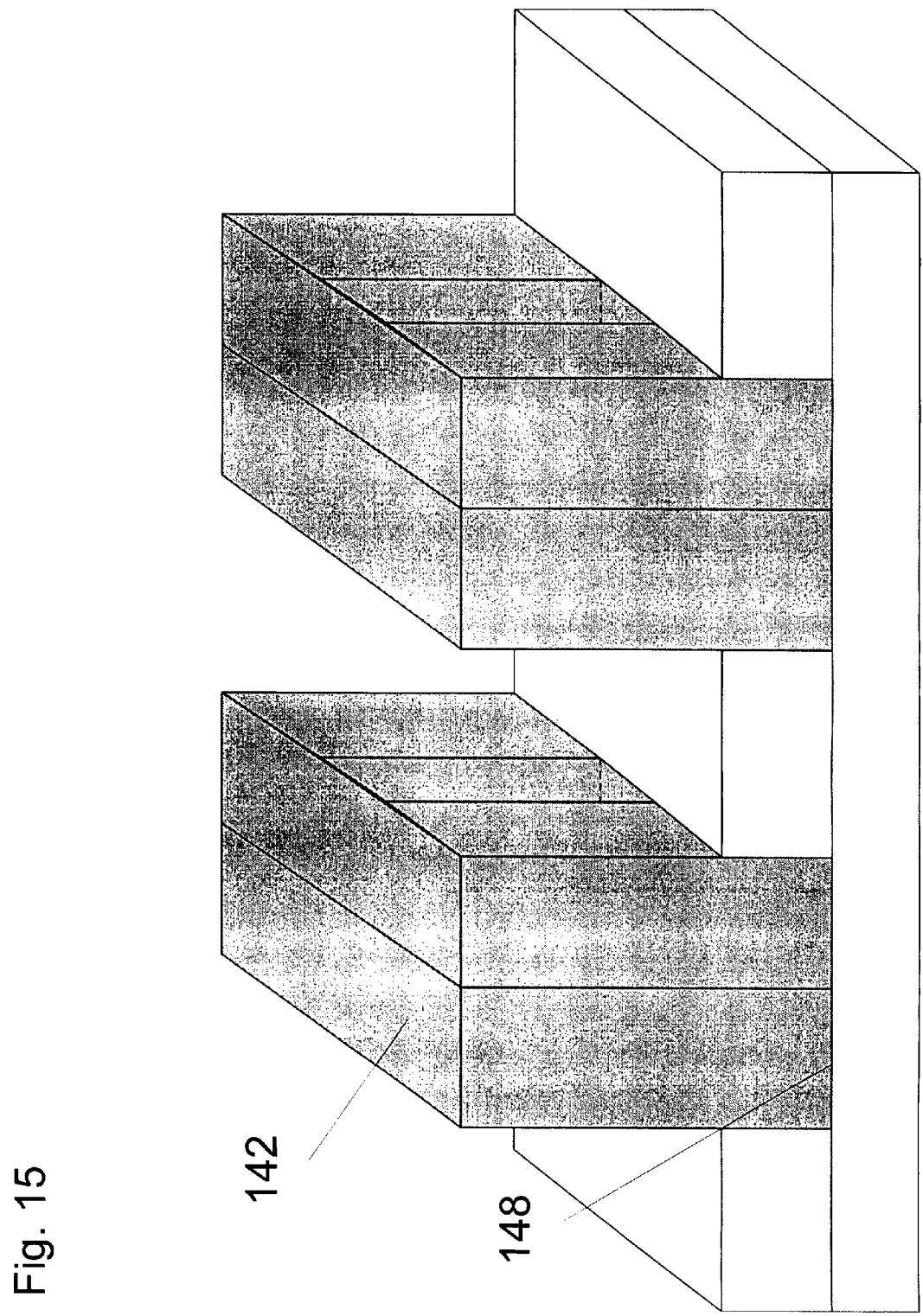

FIG. 15 shows the strips 142 fitted into the grooves 148. Tongue/groove is just one of the fitting patterns. Other patterns include dove tails, crosses, circles, and the like. This bonding is also called tier-2 bonding.

Figure 16:
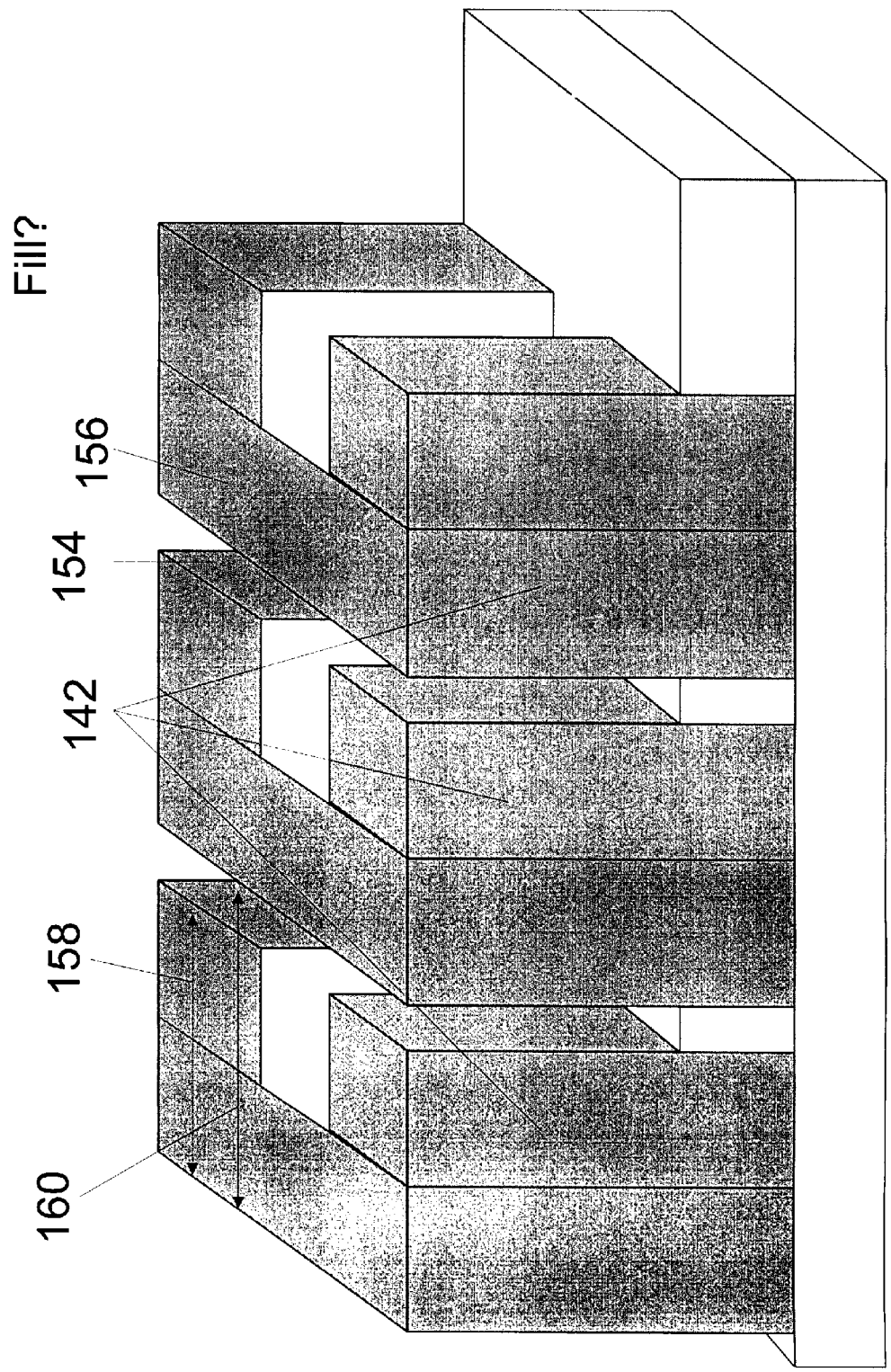

FIG. 16 shows the slight gaps 154 between the adjacent strips 142. These gaps serve several functions. One is to allow filling materials to secure the strips to the template and between the strips for subsequent polish and lithography and metallization on the side walls 156. This wiring cross-the-gap capability is important to convert the parallel memory surface line bus I/O into a grid pattern for C4 I/O external connections, for fine pitch connections with the logic wafer, and for memory to memory communications.

These fine pitch connections connect the vertically stacked 3D component and the horizontally stacked component where the vertically stacked component comprises a vertical memory stack and the horizontally stacked component comprise a horizontal logic, and one or more of the vertically stacked 3D component may comprise a high speed data transfer structure between an external I/O and said logic. The high speed data transfer structure comprises an electrical device (such as HyperTransport (HTX3 or higher) in which 64 bits, two-way data bus runs between 5 to 10 GHz rate with more than 4 data transfers per clock cycle) for chip-to-chip data transfer or an optical device such as GPON (gagi-bits passive optical network) which enable over 10 Gbit/s data transfer for node-to-node communications FIG. 53 shows a designated 4D I/O device with I/O bus 706 running between logic and system I/O. This device 706 can be either electrical (HTX3) for high speed chip-chip communication or optical (GPON) for node-node data transfer.

The other function of these gaps is to adjust (reset) the x distortion 158 in the strips. In this regard, the gaps between the strips may be filled with filler materials. For low temperature (< about 200 C) application, Hysol® FP4530™ series flip-chip underfill materials from Henkel corp. can be used. For medium temperature (< about 350 C), such as BCB (Cyclotene, An epoxy polymer of, bisbenzocyclobutene, a proprietary material from Dow Chemical Company can be used. For high temperature (> about 400 C), polyimide HD4004 (from HD microsystems) or BEOL spinnable low K dielectrics can be used or "Hysol 45xx, Or Hysol® FP4530™ series, a flip-chip underfill epoxy material from Henkel corp.). The adhesive can also comprise an art known, underfill, or polyimide, metal/solder or a partially cured adhesive also called B-staged film.

The strips due to their thickness, have a cummulative thickness variation 158 Without the adjustment space the total distortion in the x (left-right) will accumulate as the number of the strips increase. This will cause edge litho capture problem. This is also the reason why the tier-1 stacking is only limited to about 2-5 mm thickness. By spacing the grooves slightly and at a litho defined fixed pitch 160 on the template, each strip will have its leading surface defined by the grooves pitch 160, and the x distortion will not propogate. The edge litho can now capture each strip and then step and repeat based on the grooves pitch 160 for the entire tier-2 wafer.

Figure 17:
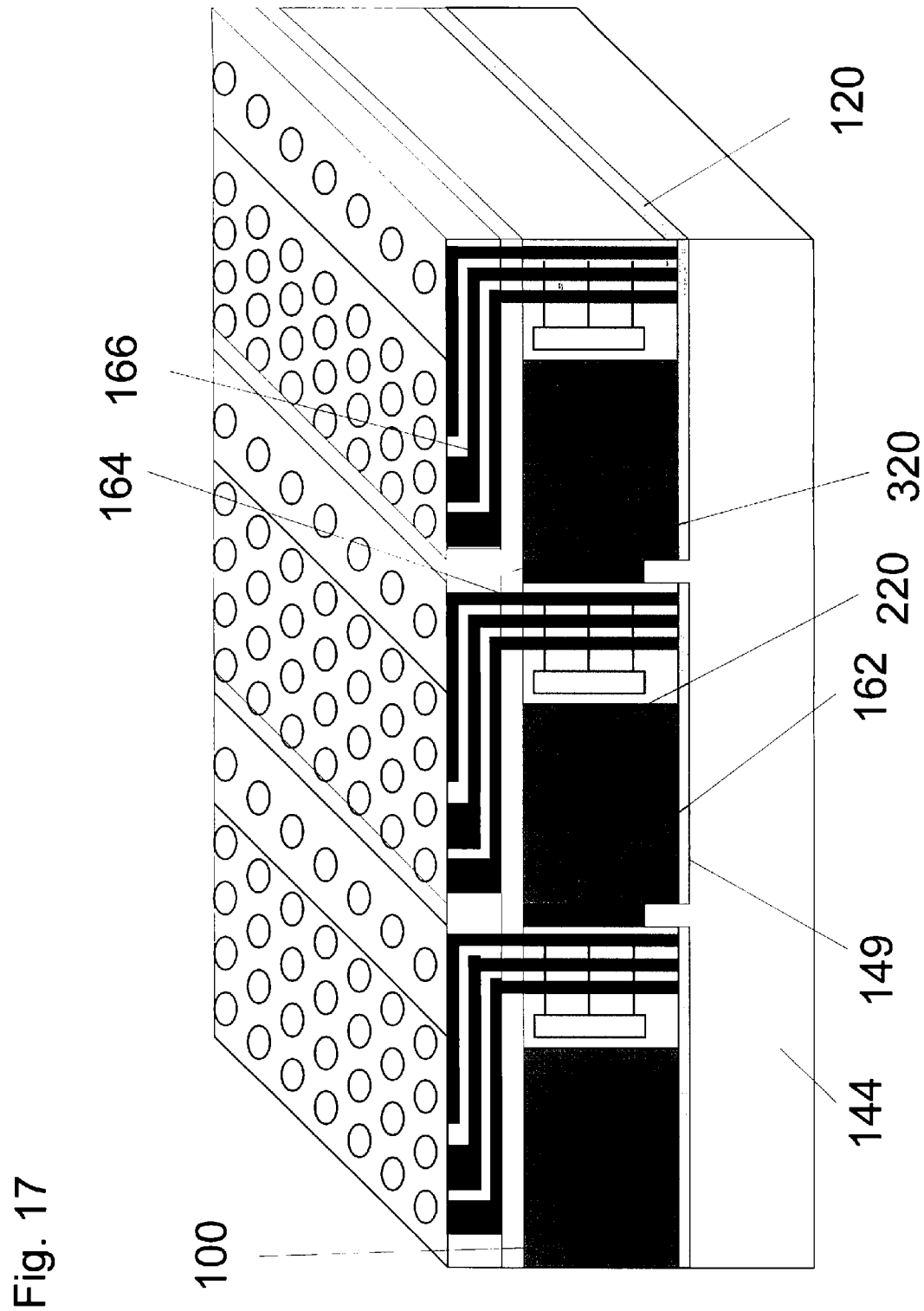

FIG. 17 shows a top edge process. The template 144 is on the bottom 120 with about 3 memory chips 100 aligned to it and on their sides. The filling material 162 and the adhesive 149 secure the memory chips to the template. Feature "148" describes a "groove" in FIG. 13 with no adhesive. When filled with adhesive, we designate this feature as element 149 in FIGS. 12, 17, 18, 43, 44, 45, and 46.

The top sides 220 of the memory chips 100 can now be polished until all the surface leads 164 are exposed and the Si surface 220 planarized. Following the top surface 220 planarization, the selective reactive ion etch (RIE) is performed to reduce the Si surface 220 about 1 um to about 5 um below the I/O metal leads 164, and a cap layer 320 of about a 1 um to about 5 um dielectric comprising a nitride of about 1000 A in thickness and an oxide of about 1 um to about 3 um in thickness is capped over the I/O metal leads 164 and the Si surface 220, followed by CMP to knock-off any dielectric from any I/O metal protrusion 164 and form an I/O opening with the Si surface 220 capped in the oxide dielectric 320 so as to allow the next step fan-outs over the Si cap 320 surface.

The normal BEOL interconnect ILD, lithography, RIE, metallization processes can be performed to fan-out the edge leads 166 into the cap surface 320 of the Si strips. This is to re-distribute the I/O position to a pitch of about 5 to about 50 um grid for transfer-joining fine pitch connection to the logic wafer. The T&J via/stud interlock interface is then formed on top of the edge BEOL 166 for bonding with the logic wafer.

Figure 18:
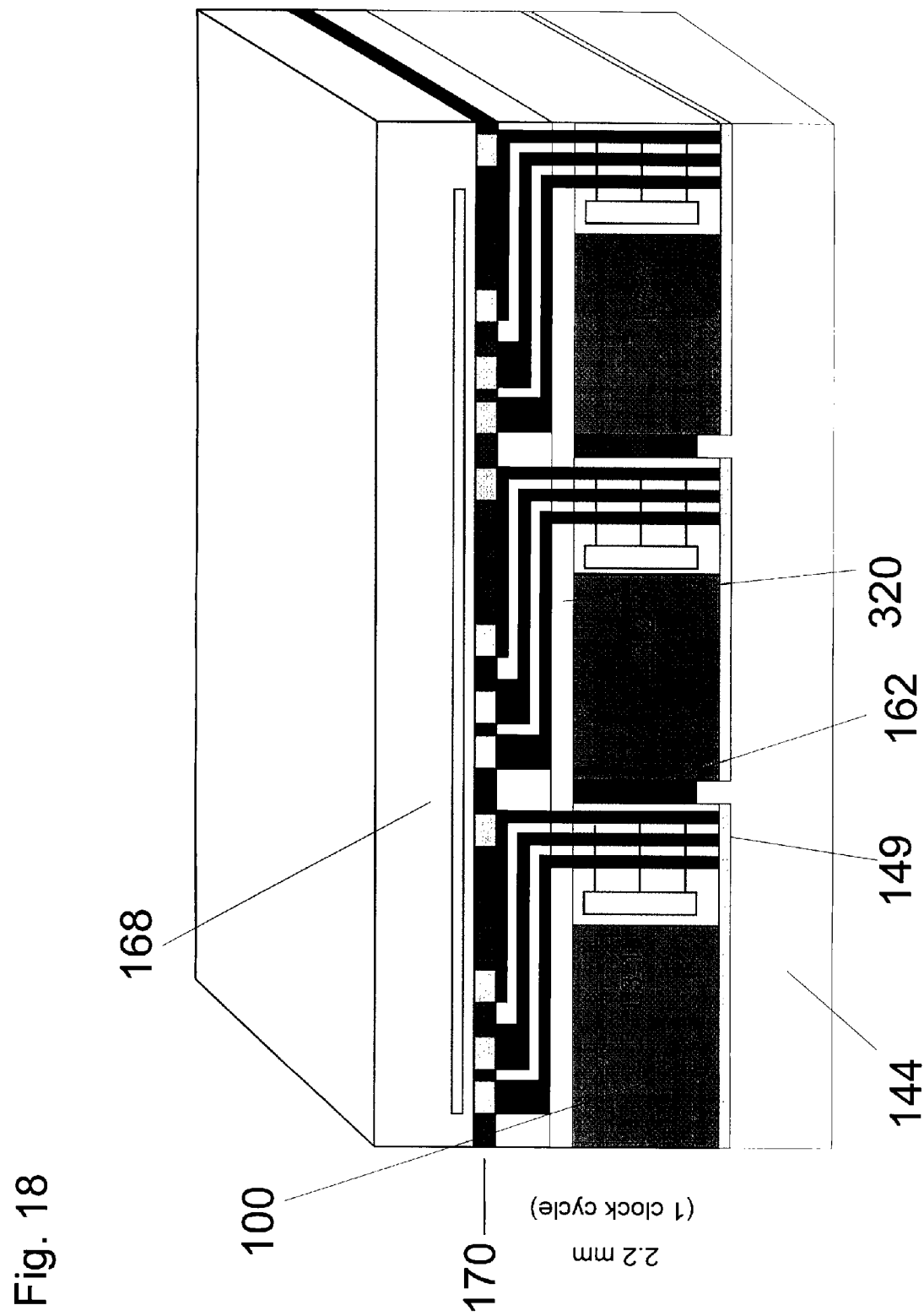

FIG. 18 shows the logic wafer 168 attached to the memory stacks 100 on the memory stack edges through the T&J fine pitch connection 170. Other connection with good surface bonding can also be used. The T&J fine pitch hybrid connection 170 provides both I/O contacts and the interface bonding to make a sealed bonding between the logic and the memory stack. This comprises tier-3 bonding.

Figure 19:
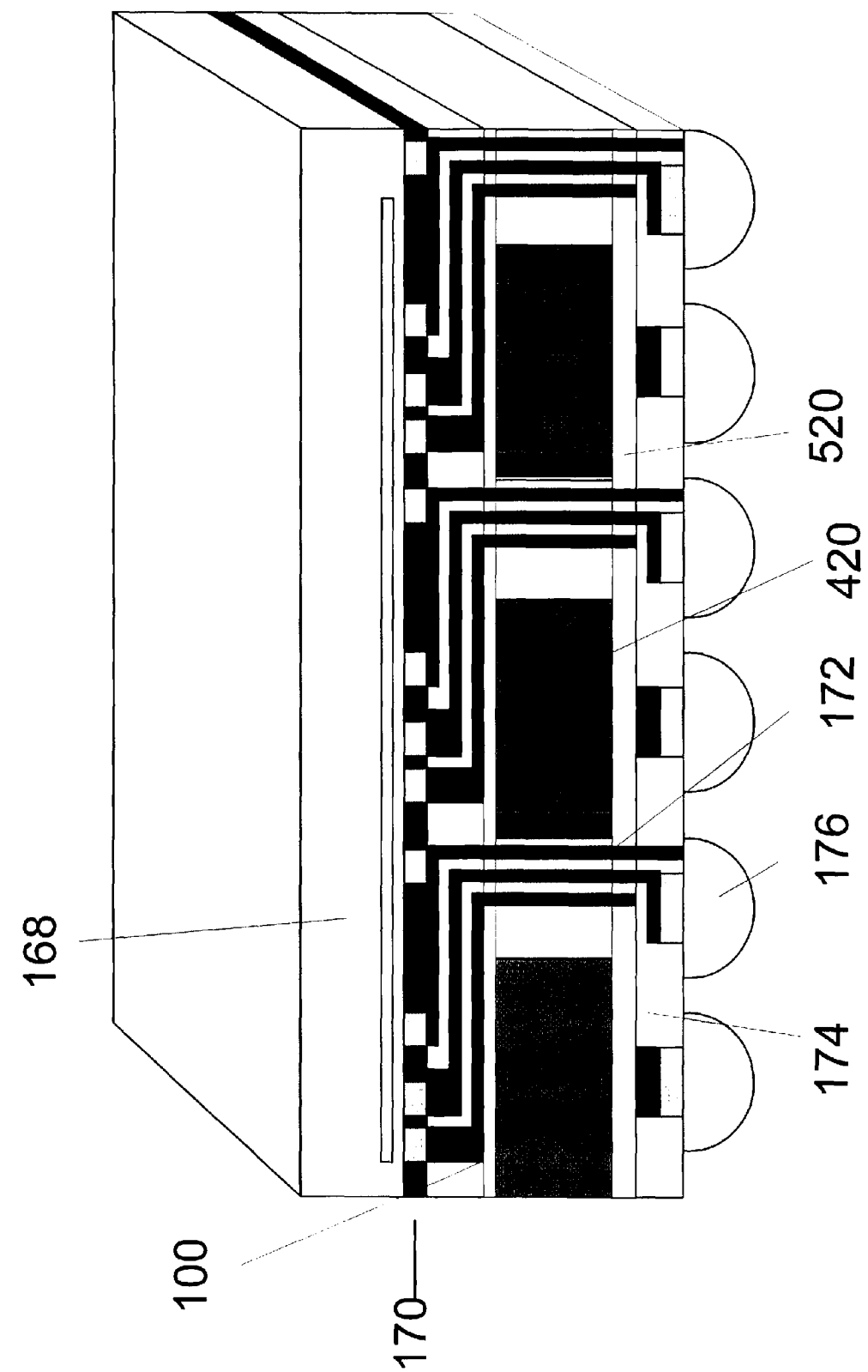

In FIG. 19 we show the logic wafer 168 tier-3 bonded to the memory stacks 100. The template wafer 144 and the adhesive 148 (in FIG. 18) is now be polished off and the bottom Si surface 420 is planarized to expose the bottom edge leads 172 comprising I/O metal or sometimes referred to as I/O metal protrusions. Once the edge leads are polished open (and the template 144 removed) the Si surface 420 is RIE recessed about 1 um to about 5 um below the edge leads 172 and a cap material 520 about 1 um to about 3 um dielectric comprising a nitride of about 1000 A in thickness and an oxide of about 1 um in thickness is capped over the I/O metal 172 and the Si surface 420, followed by CMP to knock-off any dielectric from any I/O metal protrusion 172 and form an I/O opening with the Si surface 420 capped in the oxide dielectric 520 so as to allow the next step fan-outs over the Si cap 520 surface.

The normal BEOL interconnect ILD, lithography, RIE, metallization processes can be performed to fan-out the edge leads (FIG. 49, 174) into the cap surface 520 of the Si strips. This is to re-distribute the I/O position to a pitch of about 50 um to about 150 um grid for C4 metal and solder 176 and to connect to a carrier or a motherboard.

Figure 20:
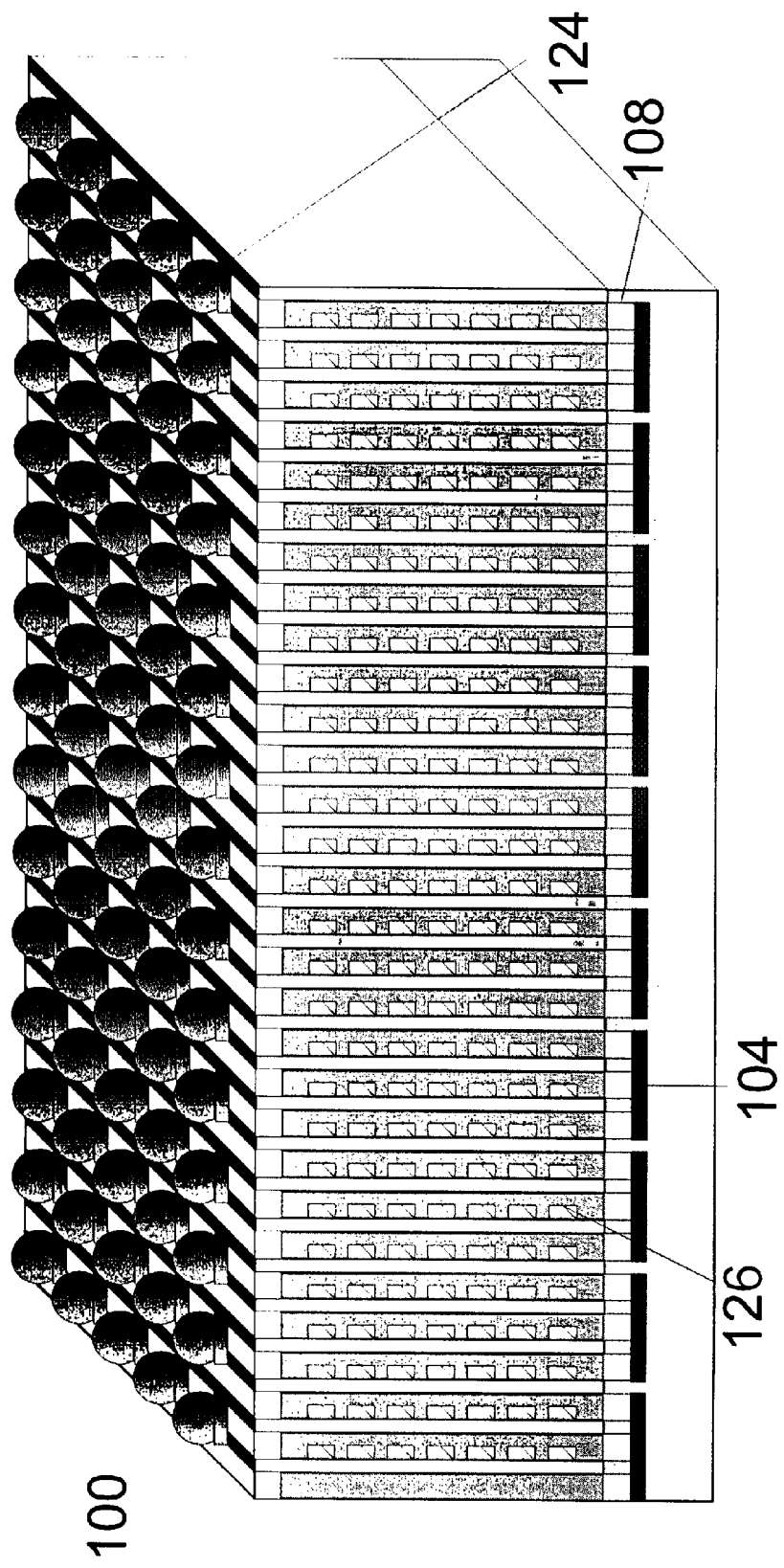

FIG. 20 comprises the same device as in FIG. 19 but as a chip/wafer view with cooling channels 126 built-in for all memory in the stacks.

FIG. 21 comprises a core view with the cooling channels 126 as patterned in FIG. 8. The channels can be lithographically defined and RIE'd into the backside of the wafers in FIG. 8 prior to tier-1 bonding. The channels can also simply be diced into the backside of the memory wafers prior to tier-1 bonding.

Figure 46:
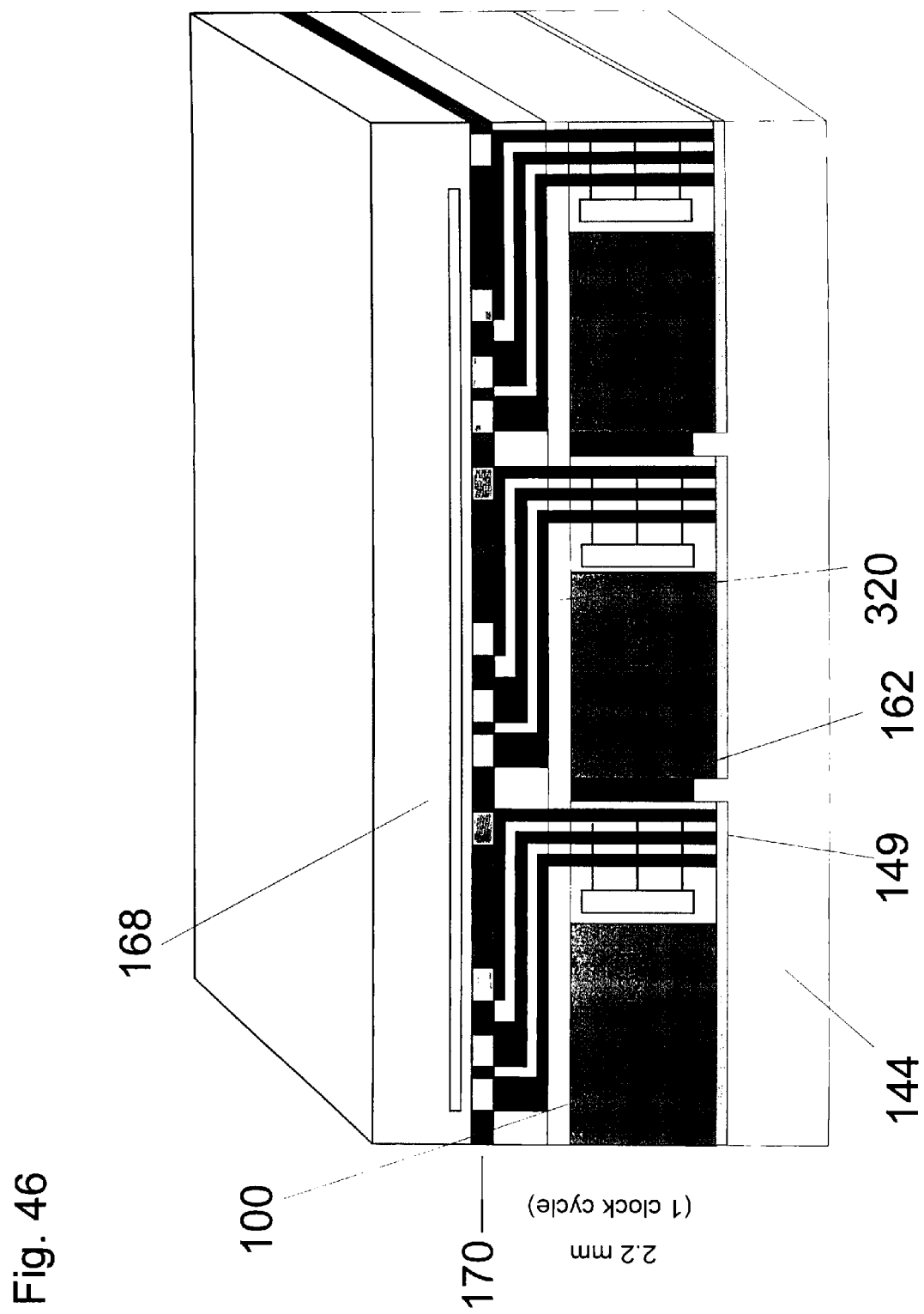

Logic wafer FIG. 22 is a prior art device showing the transfer joining connection device used for logic wafer and 4D memory wafer tier-3 connection shown in FIG. 18 and FIG. 46 as interface 170. The connection "170" in FIG. 46 comprises the same type of device as in FIG. 18. FIG. 19 and as interface 108 in FIGS. 20 and 21. In FIG. 22 the top wafer has Cu protrusions 300 and the bottom wafer has Cu recess 304. They form lock and key matching pattern for connections. The two wafers are aligned with lock insert into the key by using either SmartView or IR (infra-red) microscope. Between the lock Cu in the bottom wafer there is a double layer device with the lower layer oxide (306) and upper layer adhesive (302). The Cu key is slightly higher than the lock is deep. The Cu lock and key contact first during lamination bonding to ensure metal contact. After the metals are bonded the bonding pressure is increased and the adhesive bonds the two wafers together and protects the metal contacts from thermal and mechanical stress.

FIG. 23 shows a cut-away view of a thermal cooling hat (310) for the 4D chip (312). The cavity (314) in the cooling hat has a seal (316) and a cooling inlet window (318). As the 4D chip (312) is inserted into the hat (312) the seal (316) separates the C4 I/O solder (124) from the cooling channels (322). For a regular chip thickness (about 730 um) there is not enough spacer for a seal to be inserted for 4D chip, since it is much taller, and the seal (316) can be used (either o-ring or braze).

FIG. 24 shows the 4D chip (312) after it is inserted into the cooling hat (310) with the seal (316) separating the cooling channels (322) from the C4 I/O solder (320). Cooling fluid window (318) is aligned with the cooling channels (322) in the 4D chip. There can be a slight gap in the hat cavity above the 4D chip to allow the cooling of both the logic wafer (168) and the memory slices (100). The T&J connection provides a completely sealed connection between the logic and the memory stack and enables no additional seal between the logic and the memory stack. The cooling cap can be used as the handle to mount the 4D chips to the carrier (not shown). The mounting holes (324) provide additional mounting security of the assembly to the carrier board once the C4 I/O (320) is solder mounted to the board.

FIGS. 25-27 shows the 4D stacking in various slice configurations.

FIG. 25 shows the 4D stacking is the repeat of the conventional 2D memory slices (118) TJ (transfer and join) bonded (108) to a logic wafer (102). This configuration is also called 2D-in-4D format FIG. 26 shows the 4D slices are 3D stacked memories (218). The 3D memory slices each have 2 layers (or more) 2D devices (220) and the 2D layers have through-Si-Via (222) between them. This 4D configuration is also called 3D-in-4D format.

FIG. 27 shows that the 4D memory slices are a mix of 2D (118) and 3D (218) chips. This 4D configuration is called 2D/3D-in-4D format.

FIG. 28 shows that not all but only some selective slices with cooling channels (216) in the 4D device. Sometime this is necessary to cool a particular device while not the others. Similarly (not shown) the 4D slices can be a mix of logic, memory, Si—Ge, III-V semiconductor (such as a Ga—As device), electro-opto device, voltage regulating modules, RF device, and any other components needed by the system.

Logic wafer FIG. 29 shows the different ways to attach the logic wafer to the 4D slices. One of the important issues in wafer-wafer bonding is the yield problem. One of the wafers may have a good chip (die) align to a bad one on the other wafer. This yield issue has limited the wide use of wafer-wafer bonding. The Transfer and joining (TJ) bonding has a unique advantage to resolve this yield issue. This stems from the fact that the TJ bonding device has adhesive that surrounds the metal contacts. After the bonding the metal contacts are all sealed from the environment by the adhesive. Since the polyimide adhesive in the TJ connection can resist almost all chemicals, the TJ bonded wafers can go through the normal wet chemical process without affecting the metal contacts. Other wafer bonding methods (such as Cu—Cu compression, or micro-solder bumps) have no such dielectric seals which surround the metal contacts and therefore cannot continue with the wet chemical processes due to metal corrosion.

In FIG. 29 two ways of attaching logic to 4D memory slices are shown. The 4D slices (350) on the carrier wafer (352) can be TJ bonded to the logic in the wafer-wafer form (354) or in a die-wafer form (356). In the case of the wafer-wafer bond (354) some chips may be lost due to a bad logic wafer (memory slices can be repaired but logic cannot). In the case of the die-wafer (356) the logic wafer is diced first and only the good logic wafers are picked for TJ joining to the 4D slices. Therefore the yield is ensured. After the good logic wafers are populated in the 4D wafer, the die-wafer can be tier-3 bonded just like wafer-wafer tier-3 bonding. The gaps between the logic wafers are sealed with polyimide (such as HD4004 from HDMicrosystem) and the die-wafer bonded 4D then can be handled like a wafer-wafer bonded 4D to remove the carrier wafer (352) and form C4 I/O bumps. Due to the use of TJ connections, both wafer-wafer and die-wafer tier-3 bonding can go through wet processes (such as polishing, etching, plating) without affecting the metal contacts between the logic and 4D memory slices.

In one embodiment we make the 4D devices of the present invention by the following method.

Start with the memory wafer #1, 128 in FIG. 31*a* with memory device 228 and dicing channel area 232

1)

a. Form the top surface wiring layer from edge to edge for the signals lines, FIG. 31*b*, 230 b. Add power/ground mesh levels as needed for memory chip power (FIG. 30.), one of the ways is to form power mesh (360), signals (362), ground mesh (364) layers with dielectrics 366 between them. The power and ground meshes can be about 1 um to about 10 um in thickness with sufficient current carrying ability to power the logic wafer and the memory stack; FIG. 30 in one embodiment illustrates the power/ground/signal layout. The power and ground meshes can also be on the same side of the signals (signal-power-ground, or power-ground-signals).

c. En-capsulate the wiring with a dielectric, FIG. 31*b*, 236;

d. On the top surface form tier-2 alignment notches (FIG. 31*c*, 234) in the tier-1 dicing area (FIG. 31*a*, 232) for later tier-2 lock/key fitting into template groove notches FIGS. 31*a*, 31*b*, 31*c*, 234 The tongue/groove between the tier-1 stacking wafer interfaces are used for tier-1 alignment. The groove from the top surface of the top wafer and protrusion from the bottom surface of the bottom wafer are not used in tier-1 bonding and are used for tier-2 alignment after the dicing and flip.

e. On the top surface form lock/key tier-1 micro-channel groove fitting base FIG. 31*c* 236, this can be combined with the encapsulating layer in 31*b*;

f. Thin the memory wafer #1 (FIG. 32*a*, 128) as needed to a thickness between the unthinned wafer thickness (about 730 um) to about 150 um that can self support; FIG. FIG. 32*a*.

g. For thickness below the self support thickness a carrier wafer can be used to attach to the top surface of memory wafer #1 and then thin the memory wafers to below about 150 um, to about 20 um or less (FIG. 22) FIG. This will be the case if the memory wafer is to be stacked into 3D with TSV before bonding into the tier-1 stack);

h. After wafer thinning lithographic patterning, and RIE, the backside of the memory wafers form tier-1 alignment protrusion marks (FIG. 32*b*, 130). FIG. The backside litho will align to the front side dicing channels (FIG. 32*b*, 232.) and tier-2 marks (FIG. 32*b*, 234)

i. Coat bonding material (134) to the protrusion surface such as adhesives, FIG. 32*c*, 134.

j. Use dicing to form backside cooling channels (FIG. 33, 126) with required depth and width.

2) With memory #2 wafer, FIG. 34*b*, 328;

a. Form the top-side edge-to-edge wiring, power/ground meshes, and encapsulation as Wafer 1.

b. Form lock/key pattern for the tier-1 and the micro-channel fit with the bottom of the memory wafer #1, FIG. 34*a*, 234;

c. Coat the top of memory 2 with adhesive as needed, FIG. 34*a*.

d. If Wafer 2 is the final wafer in the tier-1 stacking then leave the backside blank e. If wafer 2 is not the final wafer in the tier-1 stack then process the wafer backside same as wafer 1 in steps 1 and 2.

Figure 35:
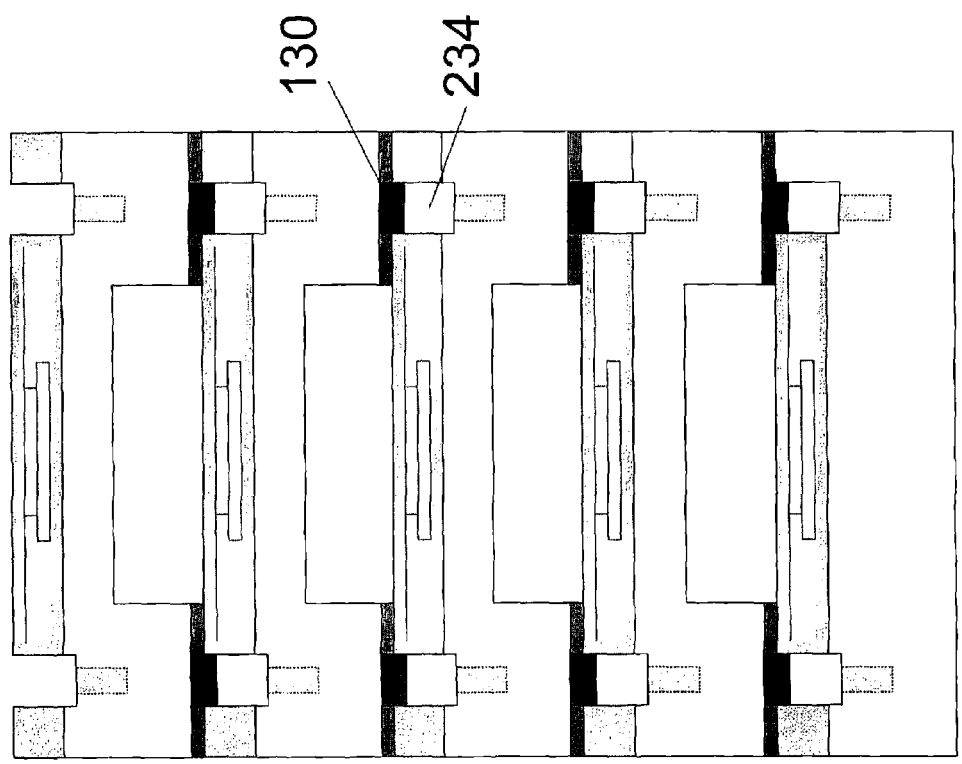
Figure 36:
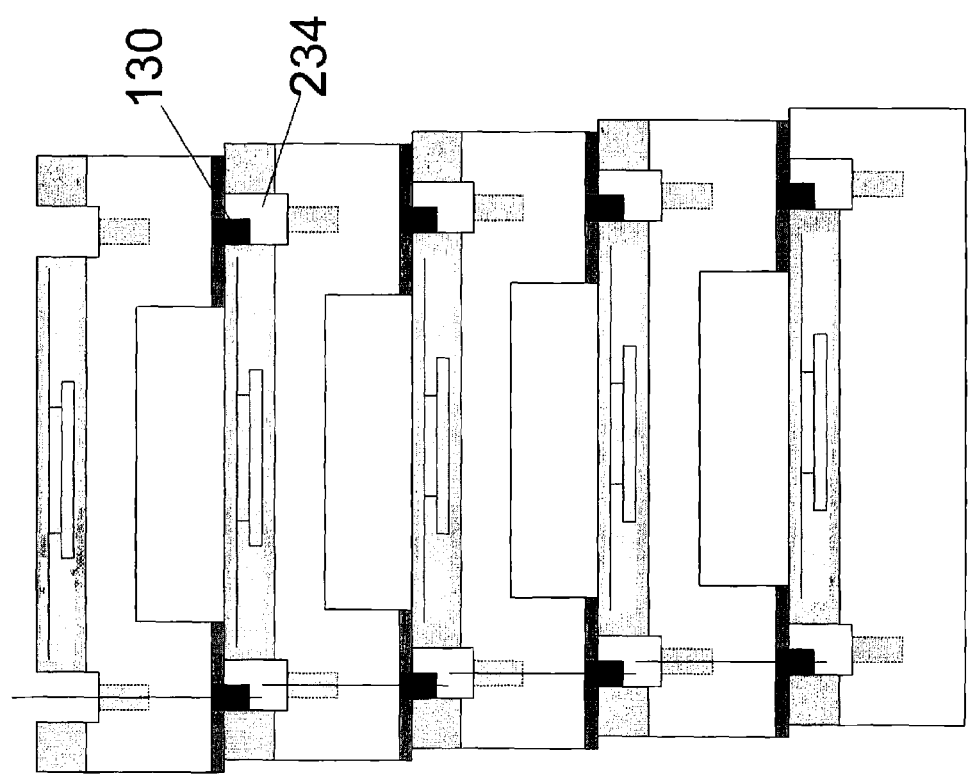
Figure 37:
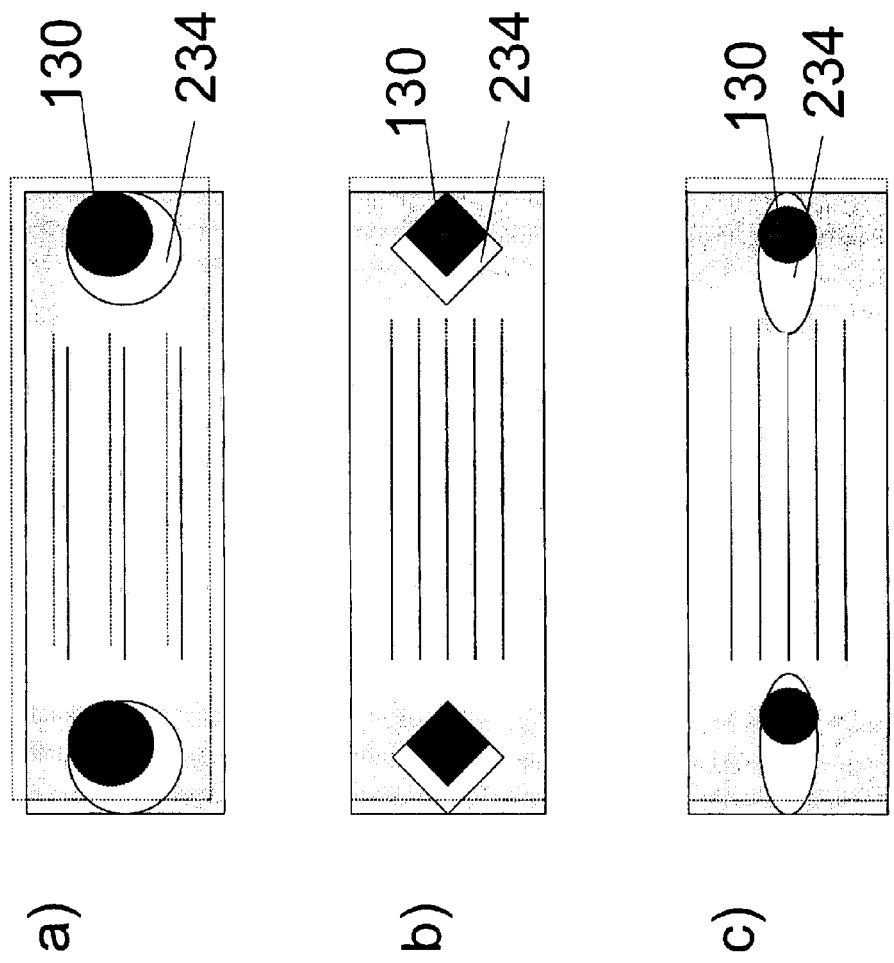

3) Align (FIG. 34*b*) and Bond the bottom of #1 with the top of memory #2 wafer FIG. 34*b*;

a. by the backside protrusion lock (130) in wafer-1 with the key on the top side of wafer-2 (234)

b. If the wafer thickness is self supporting then prep memory #3 wafer, 9 in the same way as memory #2 wafer and stack 1-*n* together in one lamination run, FIG. 9. Once the self supporting wafers form a top and bottom interlocking alignment device, the wafers can be stacked as in FIG. 9 and laminated in one step.

c. The stack thickness is about 2 to about 5 mm or the total stacking mis-alignment is within about 5 um requirement. FIG. 35 shows this as a perfectly aligned and bonded 5 wafer stacking. In reality the lock (130) and key (234) have slight clearance (about 1 um) for a good fitting as shown in FIG. 36, 130 comprises a key and 234 comprises a key receiving aperture in FIGS. 35 through 37. The stacked wafers will have a tendency to move in one direction or the other during the lamination bonding. This clearance drift can occur in both x (left-right) and y (in-out) directions. For tier-1 alignment, the accuracy in in-out of plane (same direction as the strip dicing) is more important that left-right (x-direction). This is because the memory surface I/O bus needs alignment for the tier-2 (after flip) lithography. Left-right alignment is less critical since after flip this shift becomes height variation and tier-2 CMP will have sufficient capability to remove such variation. Therefore the tier-1 tongue/groove design can be provided with a chevron matting in the x-direction (left-right) to minimize any tier-1 bonding related drift in the in-out plane direction (also tier-1 dicing direction). FIG. 37 shows this and how the tier-1 lock/key shape can affect the alignment accuracy. FIG. 37 is a top-down view (plan view) of the edge-edge wiring overlay between wafer 1 (dash lines) and wafer 2 (solid lines). In FIG. 37*a* the lock (130) and the key (234) are both round which cause equal amount of drift in both x and y directions. In FIG. 37*b* both lock and key are diamond shaped; they have better alignment in the y-direction than the x-direction. In FIG. 37*c* the key is round and the lock is oval. They also tend to align better in the y direction (or in-out plane when viewed as stacked). The chevron and diamond shapes alignment lock/key is to increase alignment accuracy in one of the alignment directions (vertical to the V-shapes).

d. If the thickness is not self-supporting then each subsequent memory wafer n will bond to the stack and then the n wafer will be thinned, channel patterned, and adhesive coated, and be ready to receive the n+1 wafer. (FIGS. 38 and 39 show such a process. Wafer-1 (602) top-side is formed unthinned as before and is then bonded to a handler wafer (600) (FIG. 38*a*) which enable wafer-1 (602) to be thinned to less than about 150 um (604) and form backside tier-1 alignment marks (130) and application of adhesive 606 (FIG. 38*b*). Wafer-2 (608), with its top side also formed unthinned, is bonded to the bottom of thinned wafer-1 (604) using backside key (130), front side lock (234) as alignment marks and bonded by adhesive (606)(FIG. 38*c*). The backside of wafer-2 (608) is then thinned (610), a key formed (130), and adhesive applied (606) for additional wafer attachment (FIG. 38*d*). In FIG. 39, Wafer-3 (612), with its top-sider formed unthinned, is then bonded to the bottom side of thinned wafer-2 (610) (FIG. 39*e*) and wafer-3 is thinned (614) (FIG. 39*f*). The process repeats until the wafer stacks are self supporting and the handler wafer removed (FIG. 39*g*). No cooling channels are shown in this flow for clarity, but this embodiment can include cooling channels as discussed herein.

e. Dice the bonded wafers FIG. 40*a* into strips with a width of about 2.2 mm, or the width of a pre-determined clock-cycle width FIG. 40*b*;

f. The dicing channels will cut into the tier-2 alignment mark and not necessary to expose the surface wiring leads 230, FIGS. 40*a,b*;

g. In the case of wafer carrier for not-self supporting thickness, remove the carrier (FIG. 39*g*) and dice; once the stack is thick enough (>about 150 um) the stack will self support; the carrier can be polished off (FIG. 39*g*) once the final thickness is reached (>about 150 um).

h. Flip the diced strips FIG. 41*a* onto their sides (FIG. 41*b*). After the flip the surface lines (230) now become through-device-vias (called 4DI-TSV, FIG. 41*c*, 230). They are different from through-Si-via TSV for 3DI-TSV. 4DI-TSV allows a much higher aspect ratio (about 10:1 to about 10000:1, or about 100:1 to about 10000:1) while 3DI-TSV is restricted to about 10:1 or less. 4DI-TSV is also normally square in cross-section while 3Di-TSV is normally round in cross-section. 4DI-TSV comprises a unique device and its manufacture comprises a unique process. The device has extremely high aspect ratios as noted above and a characteristic configuration comprising a rectangular cross-section, having a rectangular width from about 1 um to about 100 um, height from about 0.5 um to about 20 um, length or depth, i.e., through-device via from about 0.5 um to about 20 um.

i. The vertical stack height (136) in FIG. 41*a* becomes left-right in the x direction after the flip. This is why the total wafer stack is limited to about 2 mm to about 4 mm so the x variation after the flip (due to wafer thickness variation) is under about 5 to about 50 um for top-surface and bottom-surface metal lithography capture in the later stages.

Figure 32:
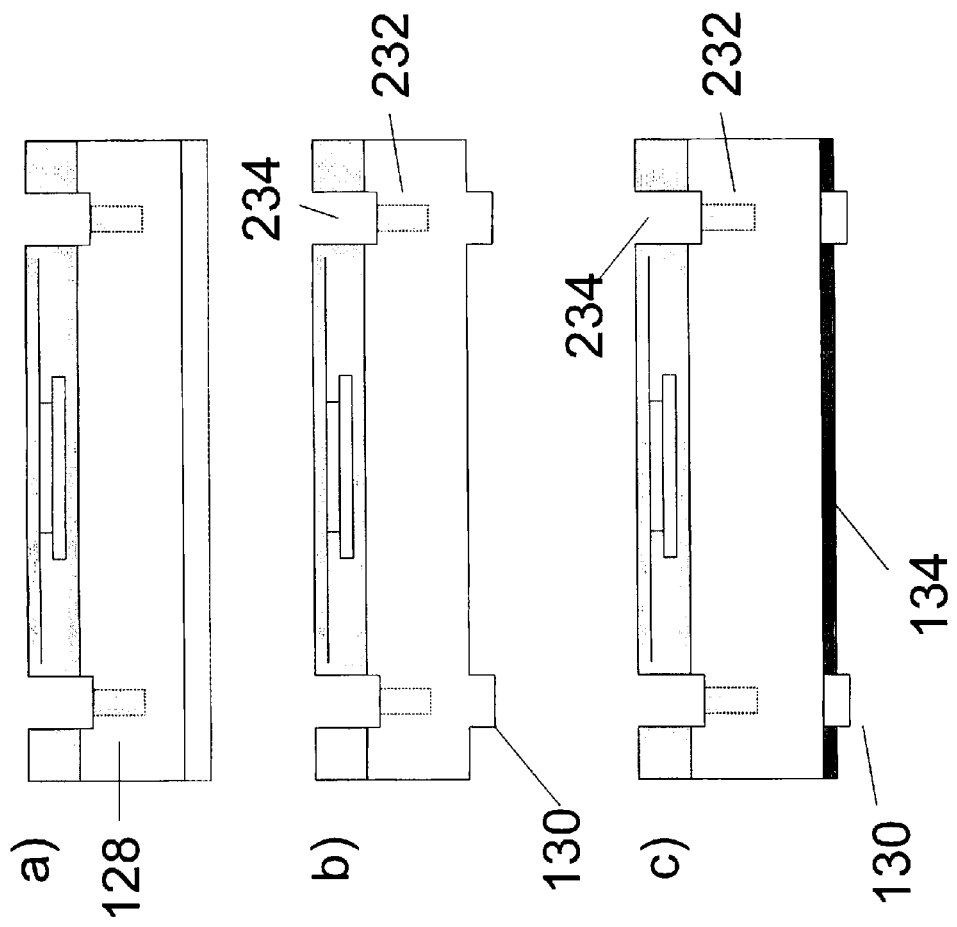
Figure 33:
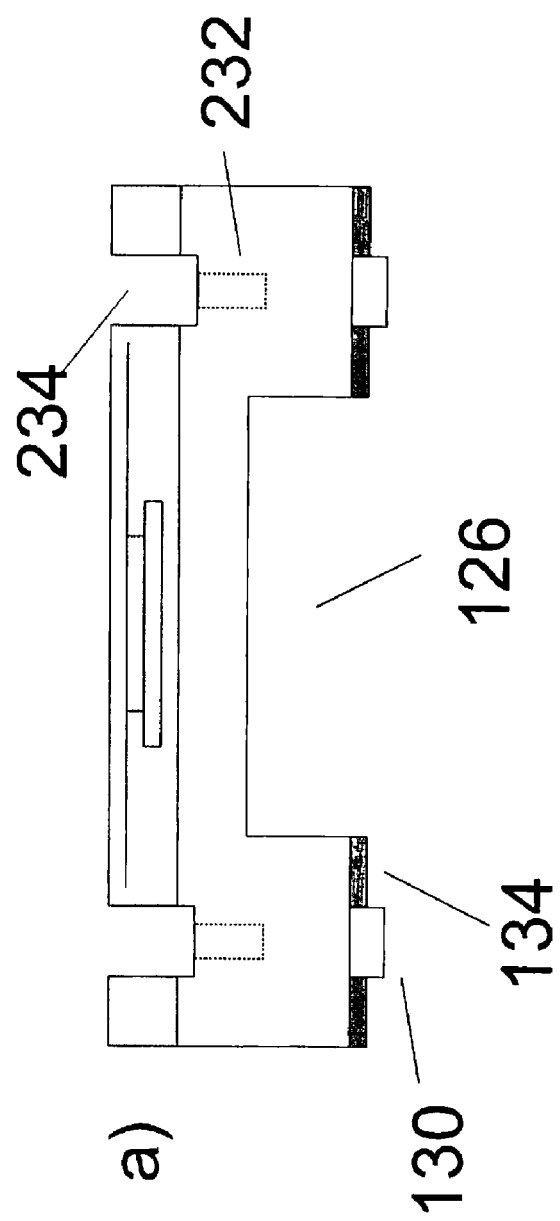
Figure 34:
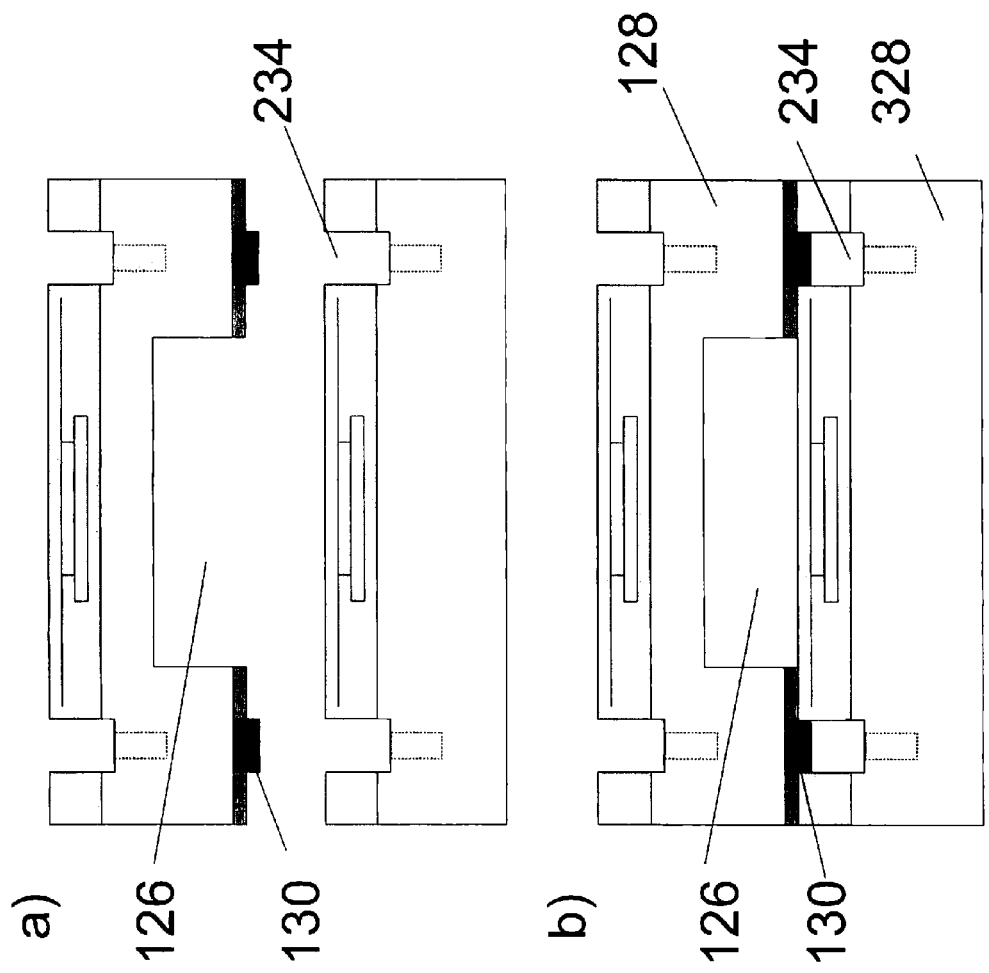
Figure 42:
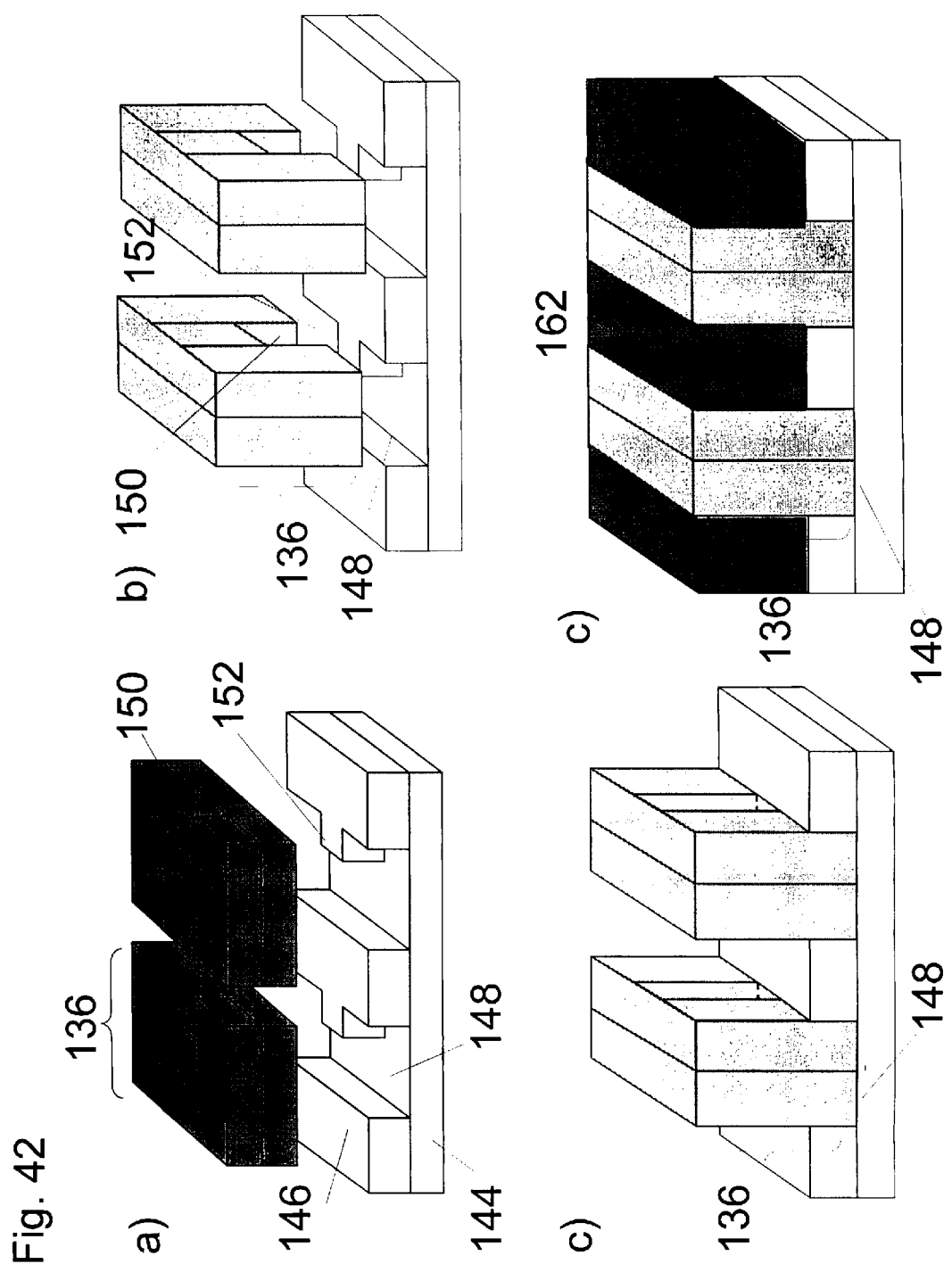
Figure 43:
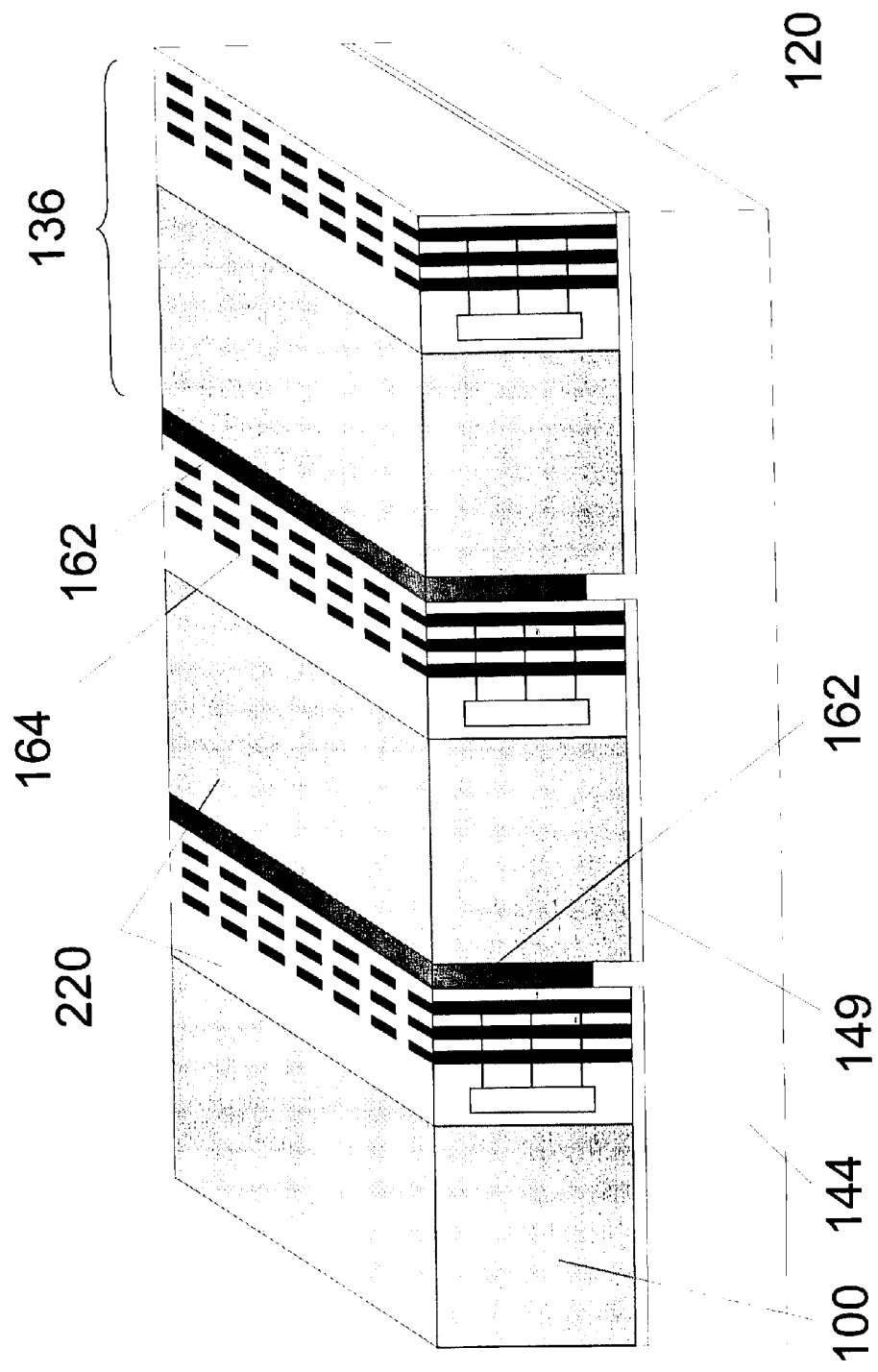

4) Tier-2 assembly to a template, FIG. 42 a. FIG. 42*a* shows strips after dicing but before flip (136) with tier-2 alignment mark recess notch (150) and the template wafer (144)

b. Form tier-2 grooves (148) on the template wafer (144) by lithography and RIE. The groove width is slightly (about 5 to about 10 um more) wider than the thickness of the strips (136) before flip to ensure an easy fitting, FIG. 42*a*. The tier-2 alignment recess notch (150) before flip is also shown in 42*a* for clarity. The tier-2 template groove (148) has key notch (152) to indicate the strip tier-2 alignment position c. Coat the tier-2 template groove with a thin (about 1 to about 2 mm) layer of adhesive; FIG. 42*a* on surface 146 and 148 (not shown) This can be done by spray coating;

d. Fit the flipped Si strips into the template grooves with the tier-2 notch as X (148) and Y (150 and 152) alignment marks in FIGS. 42*b* and 42*c* In this case the notch is drawn as square. Only the tier-1 top wafer top surface deep trench is shown for tier-2 notch recess (150). The bottom surface of the bottom wafer protrusion 130 in FIG. 32-FIG. 34, is not shown. The bottom surface of the bottom wafer can also be a deep trench like the top surface of the top wafer. This way the template tier-2 groove will have two notches to anchor the tier-2 strips from left and right. Notches work better than protrusions for handling purposes for the bottom wafer bottom surface.

e. Add filler material (162) to the space between the strips (136) and the template (148), FIG. 42*d;*

Figure 44:
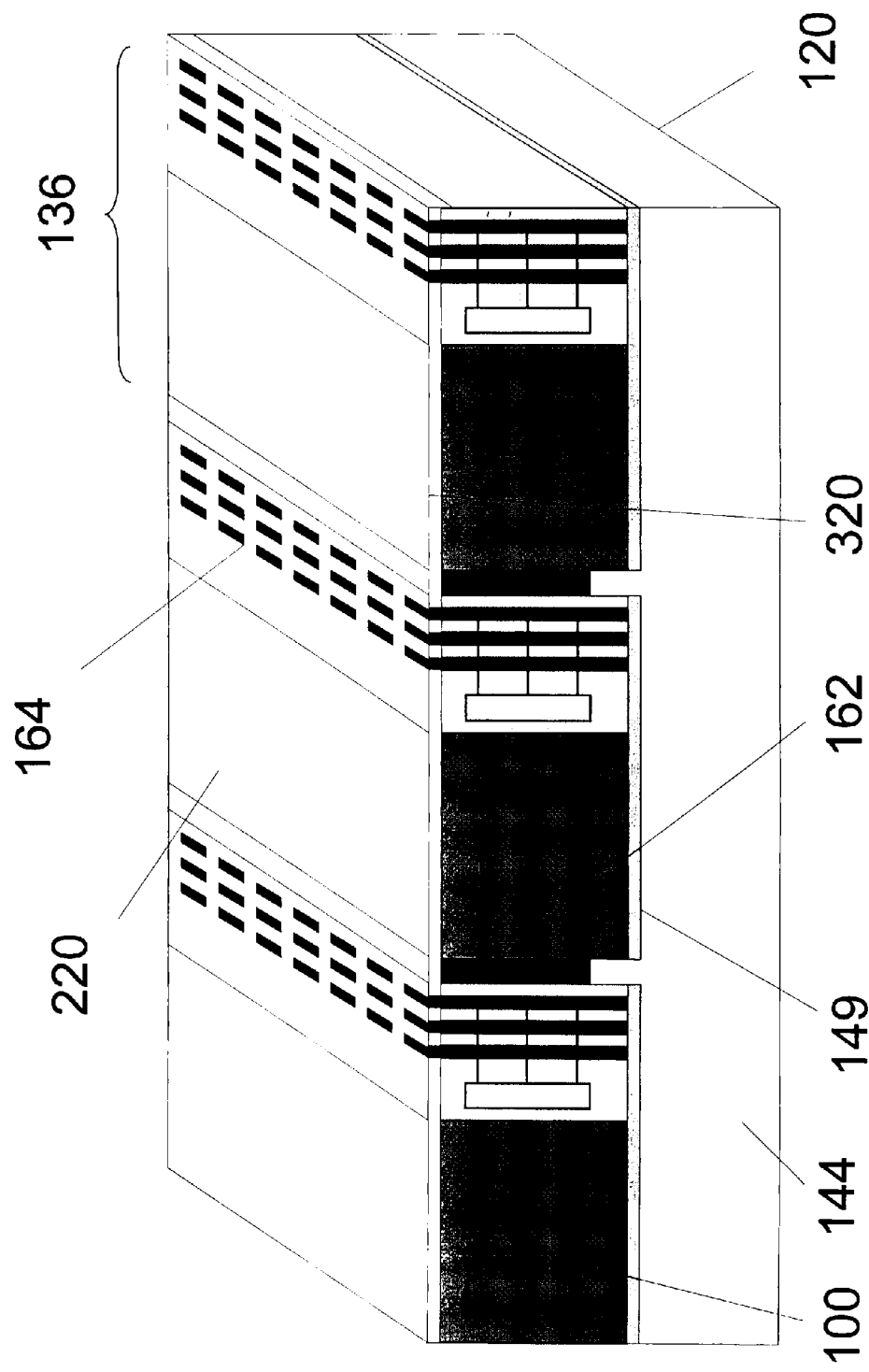
Figure 45:
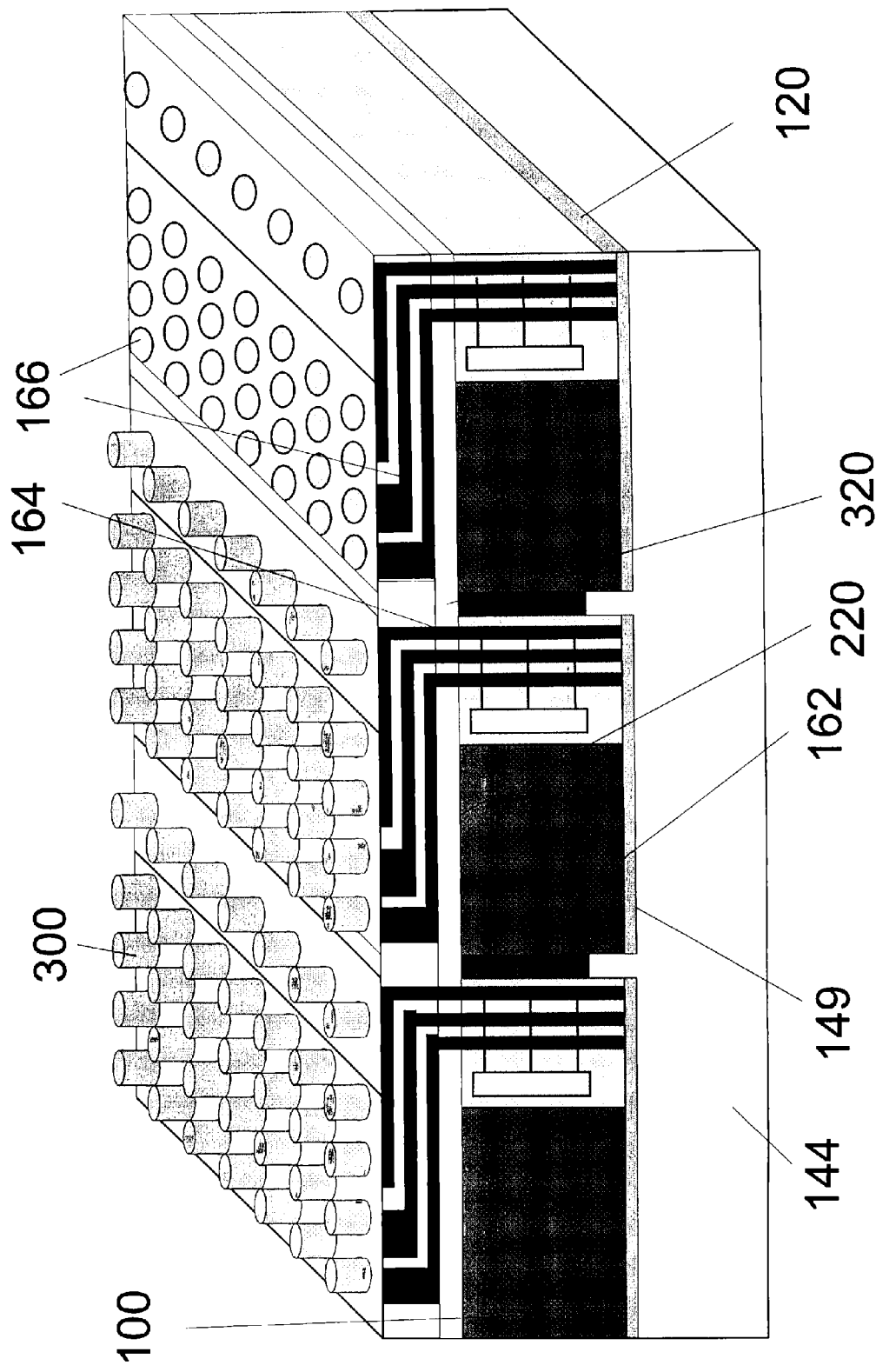

Cure and Laminate the memory strips (136) to secure them to the template (148) and between the strips (162) FIG. 42*d*.

f. Polish the top edge surface of the memory strips (136) to expose the side wall I/O leads 164 and planarize the top surface 220, seal 162 FIG. in FIG. 43.

g. In FIG. 44, RIE recess the Si surface 220 by about 1 um to about 5 um from the I/O leads 164, cap a dielectric layer 320 (about 1 to about 3 um thick) to insulate the Si surface 220, and selectively polish open the I/O leads 164 again from 320. This is to insulate the Si 220 with dielectric 320.

h. Build needed BEOL (166) on the sidewalk surface 320 (now is top surface) to fan-out the leads (164) to a new grids and to form a fine pitch T&J connection interface studs (300) on the new grids 166 as in FIG. 45. FIG. FIG.

Figure 47:
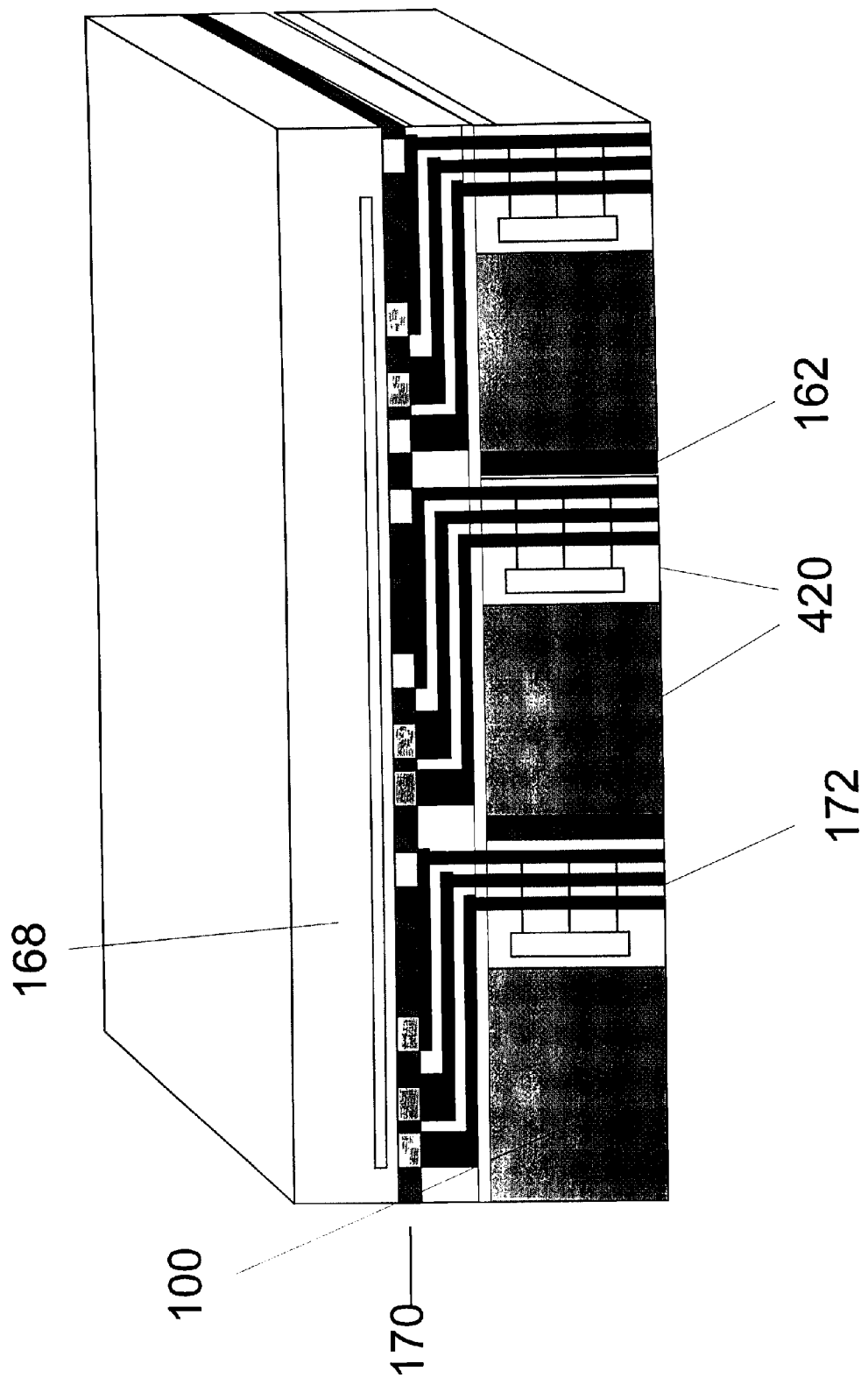
Figure 48:
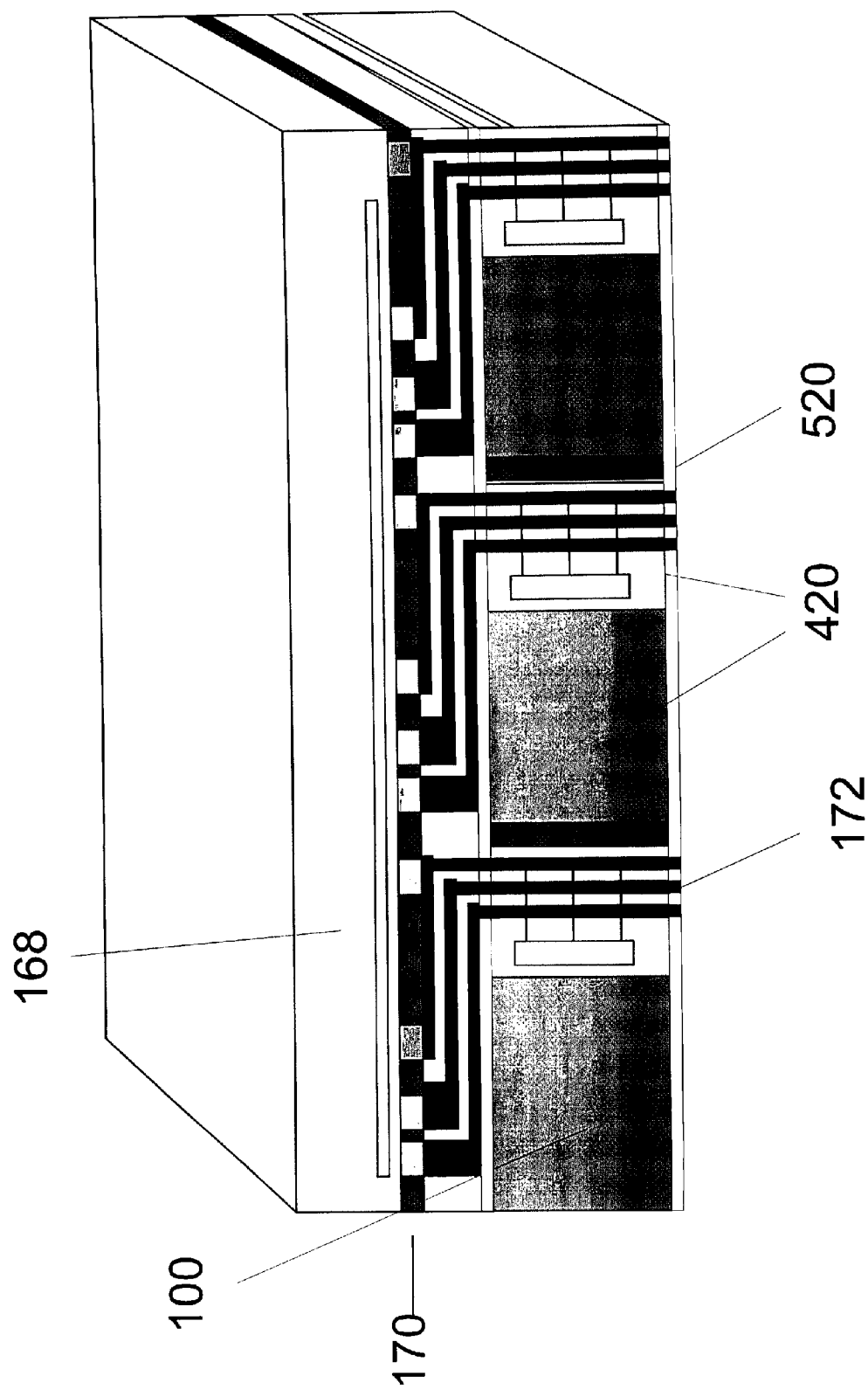
Figure 49:
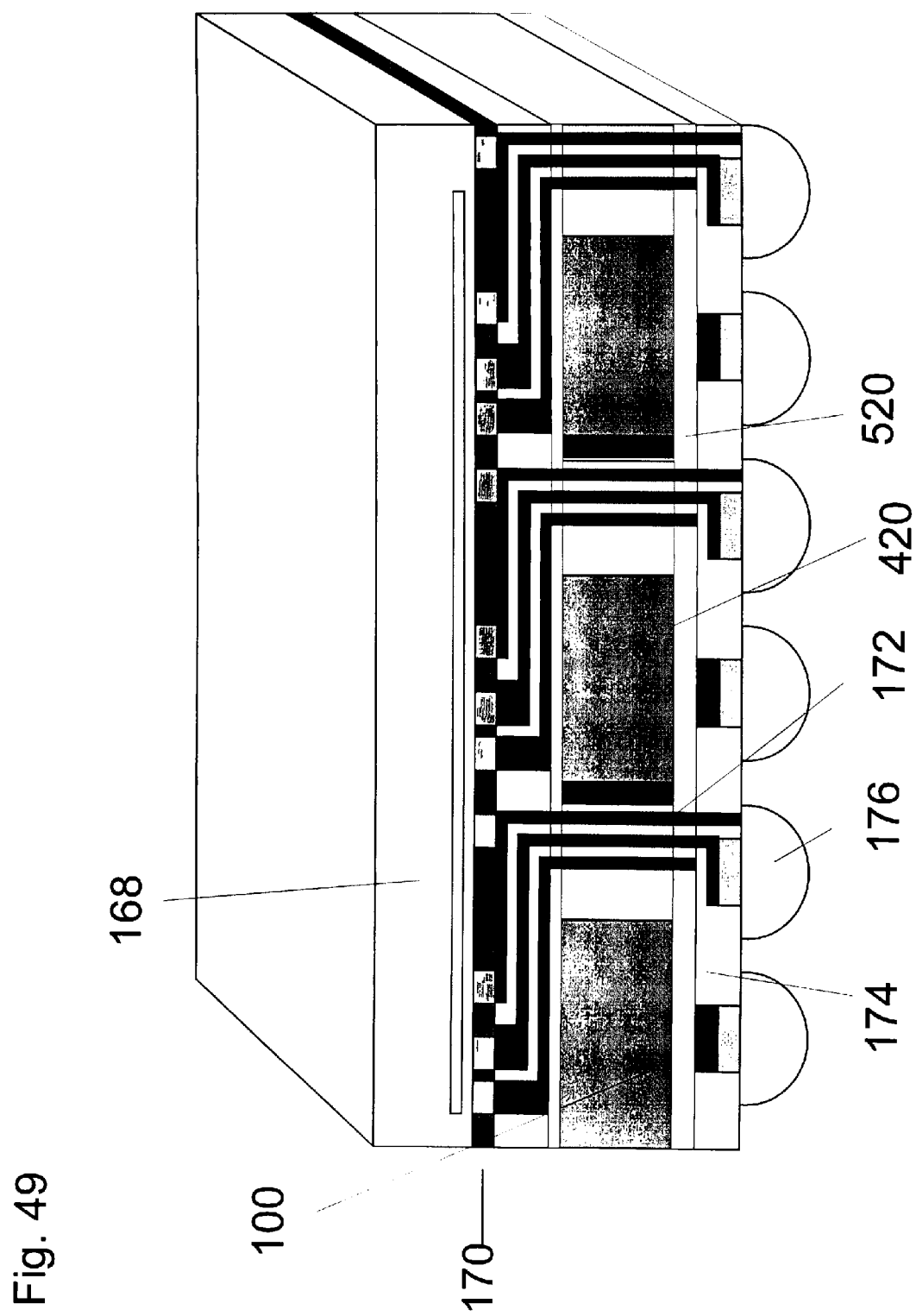
Figure 50:
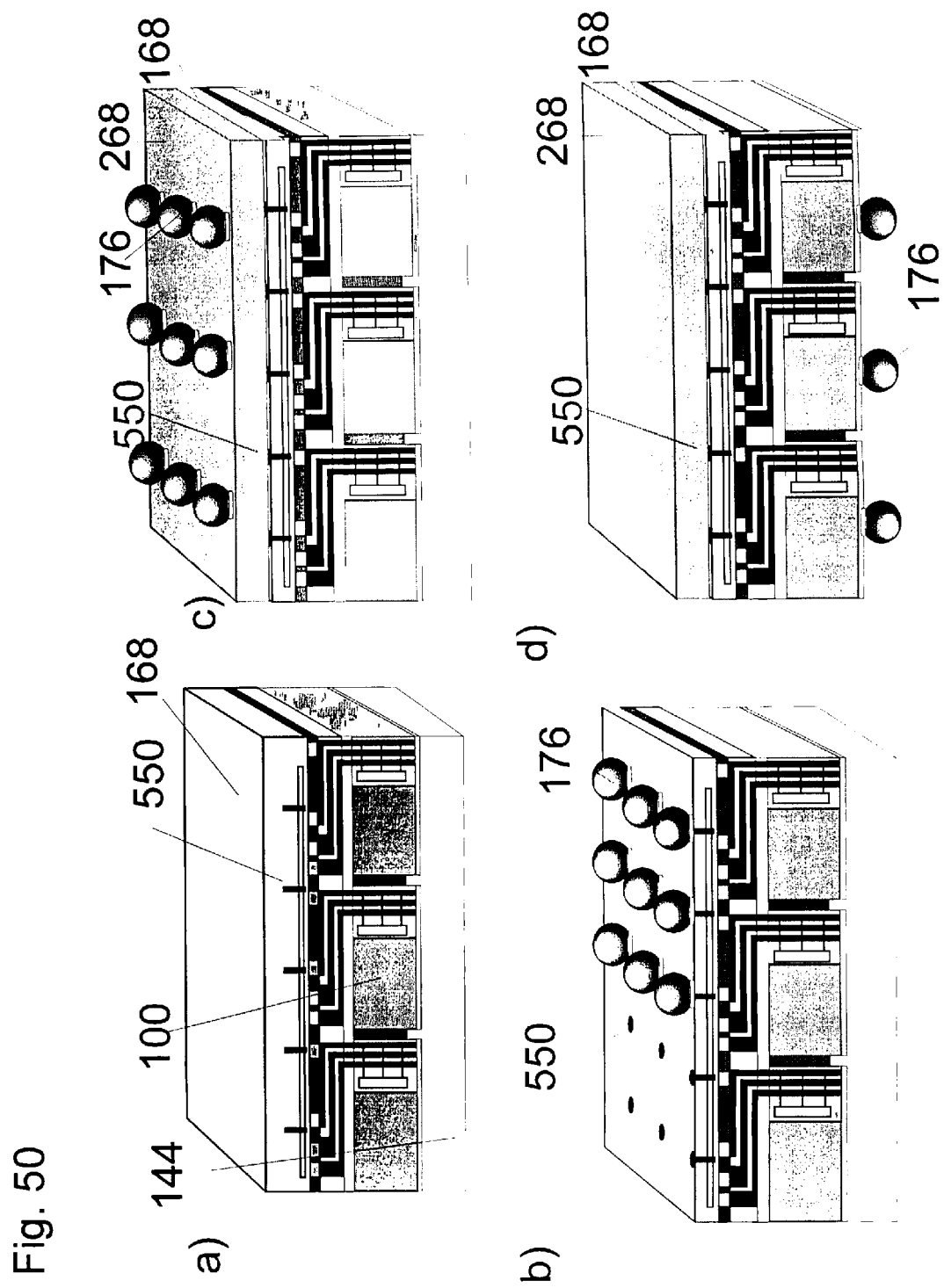

5) Attach the logic wafer, FIG. 46;

a. Form T&J connection receptor interface as 302, 304, 306 in FIG. 22 for the logic wafer 168 in FIG. 46. FIG.

b. Align and bond the logic wafer to the top surface of the sidewall memory stack through tier-2 lamination with T&J connection 170 in FIG. 46;

6) Attach C4 to the bottom side of the memory sidewall, FIGS. 47-48;

a. Grind off the entire template wafer by grinding to more than about 50 um into the bottom surface of the tier-2 wafer 420 and planarize bottom surface 420, seal 162, and bottom I/O 172 as in FIG. 47;

b. Etch away the remaining Si, but as an alternative, grind/polish directly into the bottom surface of the tier-2 wafer to expose the I/O leads 172 and remove grinding damage layer in the Si 420 (FIG. 47);

c. Polish the bottom side wall of the memory stack to expose the I/O leads, FIG. 47, 172;

d. RIE bottom surface Si 420 so that 420 is about 1 um to about 5 um recessed from the bottom I/O leads 172. Cap the surface 420 with a layer of cap dielectric 520 at about 1 um to about 3 um in thickness. Polish off the cap 520 from the protruding I/O leads 172 as to planarize and open the bottom I/O leads 172 in cap layer 520 (FIG. 48)

e. Use dielectrics, lithography, RIE and metal to build the necessary BEOL (174) on the bottom sidewalls of the memory stack to fan-out the I/O to a C4 pitch, FIG. 49, 174;

f. Form C4 metal and bumps, FIG. 49, 176;

7) The wafers can then be diced into chip form to form a 4D device, FIG. 20;

8) The logic wafer can be thinned and built with through-Si vias and add C4 on to the through-Si vias. This increases the power supply and reduces signal delay from C4 to the logic core FIG. As show in FIG. 50*a* if the logic wafer (168) has 3DI-TSV (550), after logic 168 is T&J bonded to the memory stack (100) with the template 144 still attached, the logic wafer 168 can be thinned to expose 3DI-TSV 550 (FIG. 50*b*) and attached C4 solder balls 176 after necessary cap dielectric and fan-out (not shown). In addition (FIG. 50*c*) once the logic wafer is thinned and exposed 3DI-TSV 550, another chip (268) (like a de-coupling capacitor module) can be 3DI joined to the logic wafer (168) and thinned with either C4 I/O on the logic side (FIG. 50*c*) or C4 I/O on the memory (100) side (FIG. 50*d*).

9) During the tier-1 memory stacking, one or some of the memory wafers can be a power supply regulator module or photo-electronic module. With the power regulator placed directly over the logic wafer the logic wafer will have a much improved performance. With a VECSEL (vertical-external-cavity surface-emitting laser) wafer imbeded, the 4D chip can enable optical communication between chips.

10) In FIG. 8 during the tier-1 bonding of the memory stack, in one embodiment, all memory wafers are regular 3D wafers. The 4D process can enable other options. The memory wafers can be 3D bonded wafers with 3Di-TSV connections first and then follow the disclosed 4D process. For very thin (about <50 um) memory wafers when the 3DI-TSV become possible, we can chose to form 3D/TSV device before tier-1 bonding. 3DI-TSV comprises through-Si-via used in traditional 3D-TSV that is formed by deep Si RIE followed by deep fill with metal whereas 4Di-TSV comprises through-device-via formed by lay-down of a surface line, dice, and flip.

In other embodiments, the invention comprises a process for manufacturing the 4D device structure comprising aligning by selecting a top first wafer, aligning a second wafer with said first wafer using IR (infra-red) or SmartView (EVG). SmartView EVG comprises a two camera system, one looks up at the bottom of the top wafer and one looks down at the top of the bottom wafer for wafer alignment.

We have found the number of wafers determines said tier-1 stack thickness and is based on said total tier-1 stack accuracy. By "stack accuracy." We mean that each wafer thickness has a certain error from it's nominal thickness. The error accumulates as the number of tier-1 stacking increases. Because of the flip from tier-1 to tier-2, the tier-1 thickness error will become a tier-2 x-dimension error. Since tier-2 is a litho process and the x-error, the tier-1 stacking error (deviation from the nominal thickness) therefore has to be within certain range (e.g., about <50 um). By limiting the number of wafers in the tier-1 stack, we can improve tier-2 x-accuracy for each strip. From strip to strip, the accuracy is achieved by litho step/repeat The 4D device structure in one embodiment comprises a tier-2 assembled wafer having edges wherein the edges are sealed with a high temperature sealing material such as Hysol® FP4530™ underfill material (from Henkel) for about <200 C, Cyclotene (BCB) from Dow Chemical for about <300 C, or HD4000 polyimide from HD microsystems for about 400 C.

The 4D device in another embodiment comprises wafers with thicknesses below self-supporting thicknesses where the number 1 wafer can comprise a thick temporary carrier. By "thick" we mean wafer thickness which would hold the wafer's processing flatness and handling capability while the device and wiring are built. The more layers on one side of the wafer the more stress the layer will exert on the wafer bulk and will bend the bulk. For a typical 2D device the bulk Si needs to be about >150 um to stay flat. Wafers with a bow (concave or convex) more than about 200 um normally are no longer able to process through the device and BEOL. Self supporting refers to wafer thickness below which the handling along could damage the wafer. About 150 um appears to be a thickness that a wafer can be handled without damage.

To obtain wafer thickness thinner than about 150 um, the target wafer is normally first bonded to a thick wafer (about 740 um, a normal thickness, blank wafer, also called a temporary carrier wafer). The bonded pair both in their normal thickness and the target wafer is then thinned to bellow about 150 um or less (about <20 um) with the support of the carrier wafer. The target wafer is then bonded to a real device wafer (normal thickness) through a wafer transfer bonding (such as T&J, with both electrical and mechanical connection). This transfer bonding also ensures the bulk support from the new device wafer for the targeted thinned wafer. After the transfer and joining, the temporary carrier wafer is no longer needed for the mechanical support and can just be polished away to yield a thinned wafer bonded to a thick device wafer.

Additional embodiments of the invention include ones where:
(1) the logic wafer can be thinned to allow backside TSV connection and additional 3D bonding to the logic wafer;
(2) the additional 3D chips to the logic wafer can be additional logic, power module chips;
(3) in the memory tier-1 stacking, some of the memory wafers can be a power module wafer, opto-electronics module, III-V module, MEMS (micro-electro-mechanical-systems) module, or RF module, for special purpose circuitry to be included;
(4) the tier-1 device comprise tier-1 bonded memory wafers which can comprise 3D bonding memory with TSV.

Furthermore, in one embodiment the invention comprises an article of manufacture comprising a 4D device which includes a vertically stacked 3D component comprising at least one of a 2D-in-4D format, 3D-in-4D format, and 2D/3D-in-4D format, connected to a horizontally stacked component comprising at least one of a 2D format and a 3D format. The horizontally stacked component comprises a 2D planar multicore logic device (2D and furthermore the horizontally stacked component comprises a 3D multi-stacked device with through-Si-vias (TSV) comprising at least one of TSV and 3D-TSV.

The primary 3D-TSV stacking device is formed by one of the conventional 3D processes with a TSV method known in the art such as the transfer and join (TJ) metal-adhesive hybrid connection. (The secondary 3DI refers to vertical stacking with edge connection (using through-device-via comprising 4DI-TSV, or not using through-Si-via which comprises 3DI-TSV). 4DI is to use fine pitch connection (such as T&J connection) to connect a secondary 3DI to a horizontal logic).

In other embodiments we provide FIGS. 25-27 to illustrate stacking, FIGS. 28, 29 to illustrate die/wafer, wafer-wafer tier-3 bonding, and FIGS. 23, 24 to illustrate the use of the cooling hat. These embodiments include an article of manufacture comprising a 4D device having a vertically stacked 3D component comprising at least one of a 2D-in-4D format, 3D-in-4 D format, and 2D/3D-in-4 D format, connected to a horizontally stacked component comprising at least one of a 2D format and a 3D format. This horizontally stacked component may comprises a 2D planar multicore logic device (2D) wherein 2D comprises a normal wafer, 3D comprises 2Ds stacked with TSV connecting the layers, 4D comprises vertical stacked slices through fine pitch TJ edge connections to a logic device (the present invention). In 4D the vertical slices can be either 2D or 3D. The horizontal logic can also be either 2D or 3D.

The device of the invention further comprises one wherein the horizontally stacked component comprises a 3D multi-stacked device with through-Si-vias (TSV) comprising at least one of TSV and 3D-TSV. The horizontally stacked component may comprises at least one of a voltage regulating module (VRM), memory, logic, optoelectronics (O-E), III-V device, micro-electro-mechanical (MEMS) stacks with TSV in the 3D stacks which comprises a 3D-TSV-combination. Furthermore, The vertically stacked component may comprise 2D device slices stacked without TSV between the 2D device slices in the vertical 4D stacking in the 2D-in-4D configuration.

In a further embodiment the vertically stacked component comprises 2D memory stacked without TSV between the 2D memory in the 3D vertical stacking and in the 2D-in-4D, memory configuration or the vertically stacked component comprises at least one of 2D devices comprising memory, voltage regulation module (VRM), opto-electronics (O-E), a III-V device, a micro-electrical-mechanical device(MEMS), in any combination without TSV between the 2D devices in the vertical 3D stacking and in the 2D-in-4D configuration. In yet another embodiment the vertically stacked component comprises primary 3D device slices with TSV within each of the primary 3D device slices and secondary 3D device slices without TSV between the secondary 3D device and comprises a primary 3D-in-secondary 3D device wherein the secondary 3D equals the 4D. In this device the vertically stacked component may comprise primary 3D-TSV memory slices stacking with TSV within each of the primary slices and the primary 3D-TSV memory slices form a secondary 3D stacking without TSV or 4D between the primary 3D memories may comprises a 3D-in-4D-memory device wherein the 4D used for the secondary 3D without TSV stacking comprises a different device than the 3D with the TSV, The immediately foregoing device may also comprise one wherein the vertically stacked component comprises any combination of primary 3D-TSV devices stacking comprising memory, VRM, O-E, III-V device, MEMS with TSV within the primary 3D device slices and the primary device slices form secondary 3D stacking without the TSV (4D) between the primary 3D stacking and comprises a 3D-in-4D combination device. This device may also comprise one wherein the vertically stacked components comprises a combination of 2D and primary 3D-TSV device slices in a secondary 3D without TSV (4D) stacking and comprises 2D/3D combination-in-4D.

The article of manufacture of the invention comprising a 4D device may comprise any combination of a vertical component comprising 2D-in-4D, 3D-in-4D and 2D/3D-in-4D with a horizontal component comprising 2D and 3D, in any combinations of memory, logic, O-E, III-V device, VRM, and MEMS which comprises a combination of horizontal and vertical components of the device.

In an additional embodiment the invention comprises a process for manufacturing the 4D device wherein the 4D chips are diced into chip form, to obtain a 4D diced chip and afterwards, the 4D diced chip is inserted into a cooling frame with the chip's 4 sides. Optionally the 4D diced chip's top side is sealed around the frame with only the C4 side of the 4D diced chip open In a manner so that the C4 side allows electrical signals in and out the chip. The frame comprises mechanical adapters to provide coolant circulating in the cooling channels in the 4D diced chip, the top of the cooling frame optionally being in the frame to allow direct coolant cooling. The cooling frame also provides the 4D diced chip with extended handling and mounting space to anchor the 4D diced chip and the frame to a circuit board.

Accordingly, in one embodiment the invention comprises an article of manufacture comprising a 4D device structure which includes a 2D planar multi-core logic wafer and a vertically stacked 3D memory stack which further comprises a tier-1 region and a tier-2 region wherein both of the tier-1 region and the tier-2 region are for secondary 3D stacking (4D), the tier-1 region produced by tier-1 bonding, the tier-1 region having a tier-1 dicing area and wherein the 3D memory stack comprises memory wafers or any of the device combination in the 3D memory stack comprising 2D-in-4D, 3D-in-4D, 2D/3D-in-4D, having a top surface and back surface, and at least one of tongue/groove or lock/key features in the tier-1 region at the top surface and back surface, so that the memory wafers or vertical component in the 3D memory stack are stacked in alignment with each other during the tier-1 bonding, and the tongue/groove, lock/key features define x and y locations in the tier-1 and tier-2 devices.

The 3D memory stack may comprise memory wafers or any combination comprising a 2D, 3D-TSV device , or the combination of 2D/3D-TSVin the 3D memory stack having a top surface and a back surface, with at least one of the tongue/groove or lock/key feature at it's top surface and back surface so that the memory wafers in the 3D memory stack are stacked in alignment with each other during the tier-1 bonding, and the tongue/groove, lock/key features define x and y locations in the tier-1 bonding. The 4D structure having the tongue/groove, lock/key features may comprise crosses, circles, channels, brackets, diamonds, chevrons, or any combination thereof and define the tier-1 shape. The 4D structure may also comprise a structure wherein each memory wafer in the 3D memory stack has notch recesses in the tier-1 dicing area for y alignment of the tier-2 device. Furthermore the 4D structure may also comprise a structure wherein each of the memory wafers has one of the surface coated with about 1 to about 3 um adhesive and partially cured, and may also comprise tier-1 marks, and all of the memory wafers are stacked and aligned using the tier-1 marks.

Another embodiment of the invention comprises a process for manufacturing the 4D structure comprising aligning by selecting a top first wafer, aligning a second wafer with the first wafer using IR or Smartview EVG, temporarily tacking the first wafer to the second wafer by a laser or adhesive applied to the edges of the wafers, and repeating the process with successive wafers until all memory wafers are aligned and tacked. The number of wafers may be used to determine the tier-1 stacking thickness and is based on the total tier-1 stack accuracy, the aligned and tacked wafers comprising a 3D memory stack, the aligned and stacked wafers having a thickness ranging from about 2 mm to greater than about 20 mm. This process may also comprise a 3D memory stack of from about 14 wafers/cm to about 500 wafers/cm depending on the wafer thickness, and the 3D memory stack may have a combination of the wafers of varying thickness within the stack. The process may also comprise bonding all the memory wafers in the tier-1 stack together under pressure and vacuum. Additionally, the process may comprise employing a device that comprises a system clock cycle distance and memory zones, and the tier-1 memory stacks are subjected to a process comprising dicing the memory stacks into about 2.2 mm strips, or any width based on the system clock cycle distance and the memory zones.

Additionally, the foregoing article of manufacture of the invention may comprise a 4D structure including a template wafer comprising the tier-2 tongue/groove region wherein the tier-2 tongue/groove region is etched with tier-2 notches for x and y alignment. Additionally, the foregoing article of manufacture of the invention may comprise 3D memory tier-1 strips operatively associated with the tier-1 region and wherein the tier-2 tongue/groove, lock/key features comprise channels for the 3D memory tier-1 strips and the 3D memory tier-1 strips are fit in to the tier-2 notch recesses. Furthermore, the template wafer of the 4D structure may have an adhesive coating. Additionally, the 3D memory tier-1 strips may be flipped about 90 degrees onto their side in the same direction, opposite direction, or both the same direction and the opposite direction. In this aspect of the invention, the 4D device may comprise a number 1 wafer and wafers with thicknesses below self-supporting thicknesses wherein the number 1 wafer can comprise a thick temporary carrier. Furthermore, in this embodiment the flipped 3D memory tier-1 strips may be fitted into the tier-2 grooves using the tier-1 groove (x) and the tier-2 notches recess (y) as alignment markers. In a further embodiment, the 3D memory tier-1 strips are temporarily tacked to the template carrier tier-2 on the edge of the tier-1 strips. This structure may comprise gaps between the 3D memory tier-1 strips wherein the gaps are filled with filler materials.

The article of manufacture of the invention comprising a 4D device structure with a tier-2 assembled wafer may have edges sealed with a high temperature sealing material comprising Hysol® FP4530TM underfill material for about <200C, Cyclotene (BCB) for about <300C, or HD4000 polyimide for about 400C. Also, the 3D memory tier-1 strips may be tier-2 bonded to the tier-2 template using iso-static lamination followed by curing, and the memory stack top side walls may include I/O leads and are polished to expose the I/O leads on the sides of the memory wafers.

In the foregoing structure that may comprise gaps between the 3D memory tier-1 strips wherein the gaps are filled with filler materials we may employ a process to manufacture this structure that comprises applying a gap fill spinning coating comprising at least one of a polyimide, spin-on glass, or CVD dielectric onto the gaps followed by a fine chemical mechanical polishing (CMP) in those regions of the device where the gaps between the strips show voids. The 4D structure of may further comprising BEOL on a single level or on multi-levels on said memory stack side wall to form fan-outs from said I/O leads.

The 4D structures of the invention may further comprise BEOL on a single level or on multi-levels on the memory stack side wall to form fan-outs from the I/O leads, or T&J fine pitch connection interface where the connection interface comprises at least one of a connection interface recess or protrusion connection interface.

The 4D structure of the invention may also comprise a logic wafer with a T&J interface matching the T&J fine pitch connection interface wherein:
 a. the logic wafer is aligned to the top of the memory stack T&J interface;
 b. the logic wafer and the aligned memory stack have been tacked together by laser or an adhesive;
 c. the device includes tier-3 device lamination comprising a bond of the tier-3 device to the T&J connection comprising a metal/adhesive hybrid layer for both electrical connection and mechanical isolation and strength, the connection formed under pressure and vacuum;
 d. the template on the bottom sidewalls of the memory stack on the far side of the logic, has been removed by polishing;
 e. the bottom I/O leads of the memory stack have been exposed by polishing;. the bottom I/O Si surface is RIE recessed from the I/O leads by about1 to about 5 um; the I/O leads protrusion and the Si surface is covered with about 1 to about 3 um dielectric; the I/O leads are CMP "knock-off" opened with the Si surface capped in oxide dielectric; the bottom surface of the memory stack comprises ILD, fan-outs, and C4 logic wafer.

A method for manufacturing the immediately foregoing device comprises:
 a. testing the logic wafer to identify good dies;
 b. forming the TJ connection interface for the logic wafer;
 c. dicing the logic wafer and isolating the good dies;
 d. aligning and placing the good dies onto the 4D memory top surface wherein the top surface comprises the logic wafer connecting surface and tacking the dies down to the connecting surface with high temperature adhesive; populating substantially the entire 4D memory with the good dies by step c) whereby the die/wafer is tier-3 bonded together the same way as in wafer-wafer bonding;
 e. filling any gaps between the with high temperature fill material to produce filled gaps and planarizing the filled gaps;
 f. polishing the carrier wafer to expose the I/O comprising an I/O metal;
 g. recessing the Si and capping the I/O with dielectric material;
 h. polishing the dielectric on top of the I/O metal to "knock-off" the dielectric;
 i. providing BEOL fan-out as necessary; and
 j. forming C4 solder bumps.

The invention also comprises a process for manufacturing the immediately foregoing device wherein selective reactive ion etch (RIE) etch is performed to reduce the Si surface about 1um to about 5 um below the I/O metal leads, and a cap of about a 1 um to about 3 um dielectric comprising a nitride of about 1000 A in thickness and an oxide of about 1 um in thickness is capped over the I/O metal and the Si, followed by CMP to knock-off any dielectric from any I/O metal protrusion and form an I/O opening with the Si surface capped in the oxide dielectric so as to allow the next step fan outs over the Si surface.

Throughout this specification, abstract of the disclosure, claims, and in the drawings the inventors have set out equivalents, including without limitation, equivalent elements, materials, compounds, compositions, conditions, processes, devices, and even though set out individually, also include combinations of these equivalents such as the two component, three component, or four component combinations, or more as well as combinations of such equivalent elements, materials, compounds, compositions conditions, processes, devices in any ratios or in any manner.

Additionally, the various numerical ranges describing the invention as set forth throughout the specification also includes any combination of the lower ends of the ranges with the higher ends of the ranges, and any single numerical value, or any single numerical value that will reduce the scope of the lower limits of the range or the scope of the higher limits of the range, and also includes ranges falling within any of these ranges.

The terms "about," "substantial," or "substantially" as applied to any claim or any parameters herein, such as a numerical value, including values used to describe numerical ranges, means slight variations in the parameter. In another embodiment, the terms "about,""substantial," or "substantially," when employed to define numerical parameter include, e.g., a variation up to five per-cent, ten per-cent, or 15 per-cent, or somewhat higher or lower than the upper limit of five per-cent, ten per-cent, or 15 per-cent. The term "up to" that defines numerical parameters means a lower limit comprising zero or a minuscule number, e.g., 0.001. The terms "about," "substantial" and "substantially" also mean that which is largely or for the most part or entirely specified. The inventors also employ the terms "substantial," "substantially," and "about" in the same way as a person with ordinary skill in the art would understand them or employ them. The phrase "at least" means one or a combination of the elements, materials, compounds, or conditions, and the like specified herein, where "combination" is defined above. The terms "written description," "specification," "claims," "drawings," and "abstract" as used herein refer to the written description, specification, claims, drawings, and abstract of the disclosure as originally filed, and if not specifically stated herein, the written description, specification, claims, drawings, and abstract of the disclosure as subsequently amended.

All scientific journal articles and other articles, including internet sites, as well as issued and pending patents that this written description mentions including the references cited in such scientific journal articles and other articles, including internet sites, and such patents, are incorporated herein by reference in their entirety and for the purpose cited in this written description and for all other disclosures contained in such scientific journal articles and other articles, including internet sites as well as patents and the aforesaid references cited therein, as all or any one may bear on or apply in whole or in part, not only to the foregoing written description, but also the following claims, abstract of the disclosure, and appended drawings.

Although the inventors have described their invention by reference to some embodiments, other embodiments defined by the doctrine of equivalents are intended to be included as falling within the broad scope and spirit of the foregoing written description, and the following abstract of the disclosure, claims, and appended drawings.

We claim:

1. An article of manufacture comprising a 4D device structure which includes a 2D planar multi-core logic wafer and a vertically stacked 3D memory stack which further comprises a tier-1 region and a tier-2 region wherein both of said tier-1 region and said tier-2 region are for secondary 3D stacking (4D), said tier-1 region produced by tier-1 bonding, said tier-1 region having a tier-1 dicing area and wherein said 3D memory stack comprises memory wafers or any of the device combination in said 3D memory stack comprising 2D-in-4D, 3D-in-4D, 2D/3D-in-4D, having a top surface and back surface, and at least one of tongue/groove or lock/key features in said tier-1 region at said top surface and back surface, so that said memory wafers or vertical component in said 3D memory stack are stacked in alignment with each other during said tier-1 bonding, and said tongue/groove, lock/key features define x and y locations in said tier-1 and tier-2 devices.

2. The 4D structure of claim 1 wherein said 3D memory stack comprises memory wafers or any combination comprising a 2D, 3D-TSV device, or the combination of 2D/3D-TSV in said 3D memory stack having a top surface and a back surface, with at least one of said tongue/groove or lock/key feature at it's top surface and back surface so that said memory wafers in said 3D memory stack are stacked in alignment with each other during said tier-1 bonding, and said tongue/groove, lock/key features define x and y locations in said tier-1 bonding.

3. The 4D structure of claim 2 wherein said tongue/groove, lock/key features comprise crosses, circles, channels, brackets, diamonds, chevrons, or any combination thereof and define the tier-1 shape.

4. The 4D structure of claim 2 wherein each said memory wafer in said 3D memory stack has notch recesses in said tier-1 dicing area for y alignment of said tier-2device.

5. The 4D structure of claim 2 wherein each of said memory wafers has one of said surface coated with about 1 to about 3 um adhesive and partially cured.

6. The 4D structure of claim 2 further comprising tier-1 marks, and all of said memory wafers are stacked and aligned using said tier-1 marks.

7. A process for manufacturing the 4D structure of claim 2 comprising aligning by selecting a top first wafer, aligning a second wafer with said first wafer using IR or Smartview EVG, temporarily tacking said first wafer to said second wafer by a laser or adhesive applied to the edges of said wafers, and repeating the process with successive wafers until all memory wafers are aligned and tacked.

8. The process of claim 7 wherein the number of wafers determines said tier-1 stacking thickness and is based on said total tier-1 stack accuracy, said aligned and tacked wafers comprising a 3D memory stack, said aligned and stacked wafers having a thickness ranging from about 2 mm to greater than about 20 mm.

9. The process of claim 8 comprising a 3D memory stack of from about 14 wafers/cm to about 500 wafers/cm depending on said wafer thickness.

10. The process of claim 8 comprising said 3D memory stack having a combination of said wafers of varying thickness within said stack.

11. The process of claim 10 comprising bonding all said memory wafers in said tier-1 stack together under pressure and vacuum.

12. The process of claim 11 wherein said device comprises a system clock cycle distance and memory zones, and said tier-1 memory stacks are subjected to a process comprising dicing said memory stacks into about 2.2 mm strips, or any width based on said system clock cycle distance and said memory zones.

13. The 4D structure of claim 11 further comprising T&J fine pitch connection interface where said connection interface comprises at least one of a connection interface recess or protrusion connection interface.

14. The 4D structure of claim 2 comprising a template wafer comprising said tier-2 tongue/groove region wherein said tier-2 tongue/groove region is etched with tier-2notches for x and y alignment.

15. The 4D structure of claim 14 comprising 3D memory tier-1 strips operatively associated with said tier-1 region and wherein said tier-2 tongue/groove, lock/key features comprise channels for said 3D memory tier-1 strips and said 3D memory tier-1 strips are fit in to said tier-2 notch recesses.

16. The 4D structure of claim 15 wherein said template wafer has an adhesive coating.

17. The 4D structure of claim 15 wherein said 3D memory tier-1 strips are flipped about 90 degrees onto their side in the same direction, opposite direction, or both the same direction and the opposite direction.

18. The 4D structure of claim 17 wherein the flipped 3D memory tier-1 strips are fitted into said tier-2 grooves using said tier-1 groove (x) and said tier-2 notches recess (y) as alignment markers.

19. The 4D structure of claim 18 wherein said 3D memory tier-1 strips are temporarily tacked to said template carrier tier-2 on said edge of said tier-1 strips.

20. The 4D structure of claim 19 further comprising gaps between said 3D memory tier-1 strips wherein said gaps are filled with filler materials.

21. A process for the manufacture of the device of claim 20 comprising applying a gap fill spinning coating comprising at least one of a polyimide, spin-on glass, or CVD dielectric onto said gaps followed by a fine chemical mechanical polishing (CMP) in those regions of the device where the gaps between the strips show voids.

22. The 4D device of claim 17 comprising a number 1 wafer and wafers with thicknesses below self-supporting thicknesses wherein said number 1 wafer can comprise a thick temporary carrier.

23. The 4D structure of claim 15 further comprising a logic wafer with a T&J interface matching said T&J fine pitch connection interface wherein:
   a. said logic wafer is aligned to said top of said memory stack T&J interface;
   b. said logic wafer and said aligned memory stack have been tacked together by laser or an adhesive;
   c. said device includes tier-3 device lamination comprising a bond of the tier-3 device to said T&J connection comprising a metal/adheisve hybrid layer for both electrical connection and mechanical isolation and strength, said connection formed under pressure and vacuum;
   d. said template on said bottom sidewalls of said memory stack on the far side of said logic, has been removed by polishing;
   e. said bottom I/O leads of said memory stack have been exposed by polishing; said bottom I/O Si surface is RIE recessed from said I/O leads by about 1 to about 5 um;
   said I/O leads protrusion and the Si surface is covered with about 1 to about 3 um dielectric;
   said I/O leads are CMP "knock-off" opened with said Si surface capped in oxide dielectric;
   said bottom surface of said memory stack comprises ILD, fan-outs, and C4 logic wafer.

24. A method for manufacturing the device of claim 23 comprising:
   a) testing said logic wafer to identify good dies;
   b) forming said TJ connection interface for said logic wafer;
   c) dicing said logic wafer and isolating said good dies;
   d) aligning and placing said good dies onto said 4D memory top surface wherein said top surface comprises said logic wafer connecting surface and tacking said dies down to said connecting surface with high temperature adhesive; populating substantially said entire 4D memory with said good dies by step c) whereby said die/wafer is tier-3 bonded together the same way as in wafer-wafer bonding;
e) filling any gaps between said with high temperature fill material to produce filled gaps and planarizing said filled gaps;
f) polishing said carrier wafer to expose said I/O comprising an I/O metal;
g) recessing said Si and capping said I/O with dielectric material;
h) polishing said dielectric on top of said I/O metal to "knock-off" said dielectric;
i) providing BEOL fan-out as necessary; and
j) forming C4 solder bumps.

25. A process for manufacturing the device of claim 23 wherein selective reactive ion etch (RIE) etch is performed to reduce the Si surface about 1 um to about 5 um below said I/O metal leads, and a cap of about a 1 um to about 3 um dielectric comprising a nitride of about 1000 A in thickness and an oxide of about 1 um in thickness is capped over said I/O metal and said Si, followed by CMP to knock-off any dielectric from any I/O metal protrusion and form an I/O opening with said Si surface capped in said oxide dielectric so as to allow said next step fan outs over said the Si surface.

26. The 4D structure of claim 1 comprising a tier-2 assembled wafer having edges wherein said edges are sealed with a high temperature sealing material comprising Hysol® FP4530TM underfill material for about <200C, Cyclotene (BCB) for about <300C, or HD4000 polyimide for about 400C.

27. The 4D structure of claim 26 wherein said 3D memory tier-1 strips are tier-2 bonded to said tier-2 template using iso-static lamination followed by curing.

28. The 4D structure of claim 27 wherein said memory stack top side walls include I/O leads and are polished to expose said I/O leads on said sides of said memory wafers.

29. The 4D structure of claim 1 further comprising BEOL on a single level or on multi-levels on said memory stack side wall to form fan-outs from said I/O leads.

30. The device of claim 1 wherein said tier-1 stacking comprises memory tier-1 stacking including memory wafers, wherein some of said memory wafers can comprise a power module wafer, an opto-electronics module, a III-V module, a MEMS module, or an RF module, for special purpose circuitry to be included.

31. The device of claim 1 wherein said tier-1 bonding produces tier-1 bonded memory wafers comprising 3D bonding memory with TSV.

32. The device of claim 1 comprising a 4DI-TSV having an extremely high aspect ratio of from about 10:1 to about 100000:1 or from about 100:1 to about 100000:1 with a rectangular cross-section, and a rectangular width from about 1 um to about 100 um, height from about 0.5 um to about 20 um, and a length comprising the depth of a through-device-via from about 0.5 mm to about 20 mm.

* * * * *